(12) United States Patent
Kendale et al.

(10) Patent No.: US 7,665,983 B2
(45) Date of Patent: Feb. 23, 2010

(54) MICROCONTACT PRINTING

(75) Inventors: Amar Maruti Kendale, Somerville, MA (US); David L. Trumper, Plaistow, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 547 days.

(21) Appl. No.: 11/506,009

(22) Filed: Aug. 17, 2006

(65) Prior Publication Data
US 2007/0261574 A1 Nov. 15, 2007

Related U.S. Application Data

(62) Division of application No. 10/340,537, filed on Jan. 10, 2003, now Pat. No. 7,117,790.

(60) Provisional application No. 60/347,225, filed on Jan. 11, 2002.

(51) Int. Cl.
*B29C 45/00* (2006.01)
*A23G 3/12* (2006.01)
*A23G 1/20* (2006.01)
*A01J 25/13* (2006.01)
*B29C 33/46* (2006.01)
*B29C 45/14* (2006.01)

(52) U.S. Cl. ........................ 425/546; 425/542; 425/127; 425/129.1; 425/405.1; 425/808; 425/DIG. 60; 249/117; 249/141; 264/259

(58) Field of Classification Search ................. 425/546, 425/542, 427, 429.1, 405.1, 808, DIG. 60; 249/117, 141
See application file for complete search history.

(56) References Cited

U.S. PATENT DOCUMENTS 4,795,127 A * 1/1989 Asai ........................... 249/103

(Continued)

FOREIGN PATENT DOCUMENTS

EP  1 193 056 A1  4/2002

OTHER PUBLICATIONS

Kendale, A.M., "Automation of Soft Lithographic Microcontact Printing" Unpublished master's thesis, Massachusetts Institute of Technology, Cambridge, Ma. (2002).
Michel, B et al., "Printing meets lithography: Soft approaches to high-resolution patterning", *IBM J. Res. & Dev.* vol. 45, No. 5, 697-719 (Sep. 2001).

(Continued)

*Primary Examiner*—Christina Johnson
*Assistant Examiner*—Atul Khare
(74) *Attorney, Agent, or Firm*—Sheehan Phinney Bass & Green P.A.; Peter A. Nieves

(57) ABSTRACT

A microcontact printing tool having a print unit including a stamp head with a stamp and a wafer chuck for retaining a substrate. The stamp contained by the stamped head movable relative to the substrate by an actuator and a stage. A plurality of sensors detect the position of the stamp relative to substrate. A method of using the printing tool that includes a real-time feedback for consistent and accurate application of force during the printing of the substrate. The stamp head includes a pressure chamber carrying the stamp. The stamp backing is deflected prior to contact of the stamp with the substrate to form a minimum point and the stamp backing and the stamp is returned to a plane to create a printing propagation contact. An apparatus has a master backing and a stamping backing in close proximity and the stamp material drawn in through a vacuum. The stamp is separated from the master by use of a parting fluid.

4 Claims, 53 Drawing Sheets

U.S. PATENT DOCUMENTS

| | | | | |
|---|---|---|---|---|
| 5,512,131 | A | | 4/1996 | Kumar et al. ............ 156/655.1 |
| 5,669,303 | A | | 9/1997 | Maracas et al. ............. 101/327 |
| 5,817,242 | A | | 10/1998 | Biebuyck et al. .............. 216/41 |
| 5,900,160 | A | | 5/1999 | Whitesides et al. ........... 216/41 |
| 5,937,758 | A | * | 8/1999 | Maracas et al. ............. 101/327 |
| 5,947,027 | A | | 9/1999 | Burgin et al. ............... 101/474 |
| 6,048,623 | A | | 4/2000 | Everhart et al. ............. 428/464 |
| 6,060,121 | A | | 5/2000 | Hidber et al. ................ 427/261 |
| 6,142,761 | A | * | 11/2000 | Arakawa et al. ........ 425/192 R |
| 6,180,239 | B1 | | 1/2001 | Whitesides et al. ....... 428/411.1 |
| 2002/0072074 | A1 | | 6/2002 | Zhang et al. |

OTHER PUBLICATIONS

Burgin, T., et al., "Large Area Submicrometer Contact Printing Using a Contact Aligner", *Langmur C*, 16(12): 5371-5375 (Jun. 2000).

Xia, Y., et al., "Soft Lithography", *Angew. Chem. Int. Ed*. 1998, 37, 550-575.

Bietsch, A., et al., "Conformal contact and pattern stability of stamps used for soft lithography", J. of Appl. Phys., vol. 88, No. 7, pp. 4310-4318, Oct. 2000.

Xia, Y., et al., "Microcontact Printing of Alkanethiols on Silver and Its Application in Microfabrication", JES, vol. 143, No. 3, pp. 1070-1079, Mar. 1996.

* cited by examiner

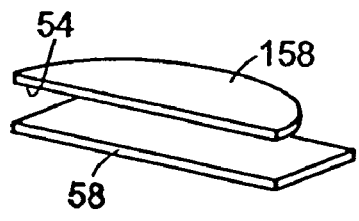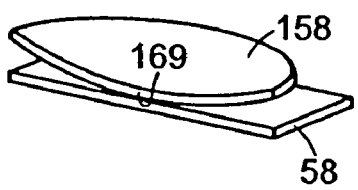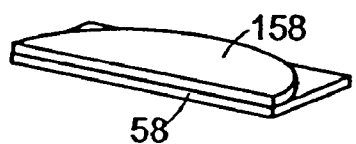
FIG. 15A  FIG. 15B  FIG. 15C
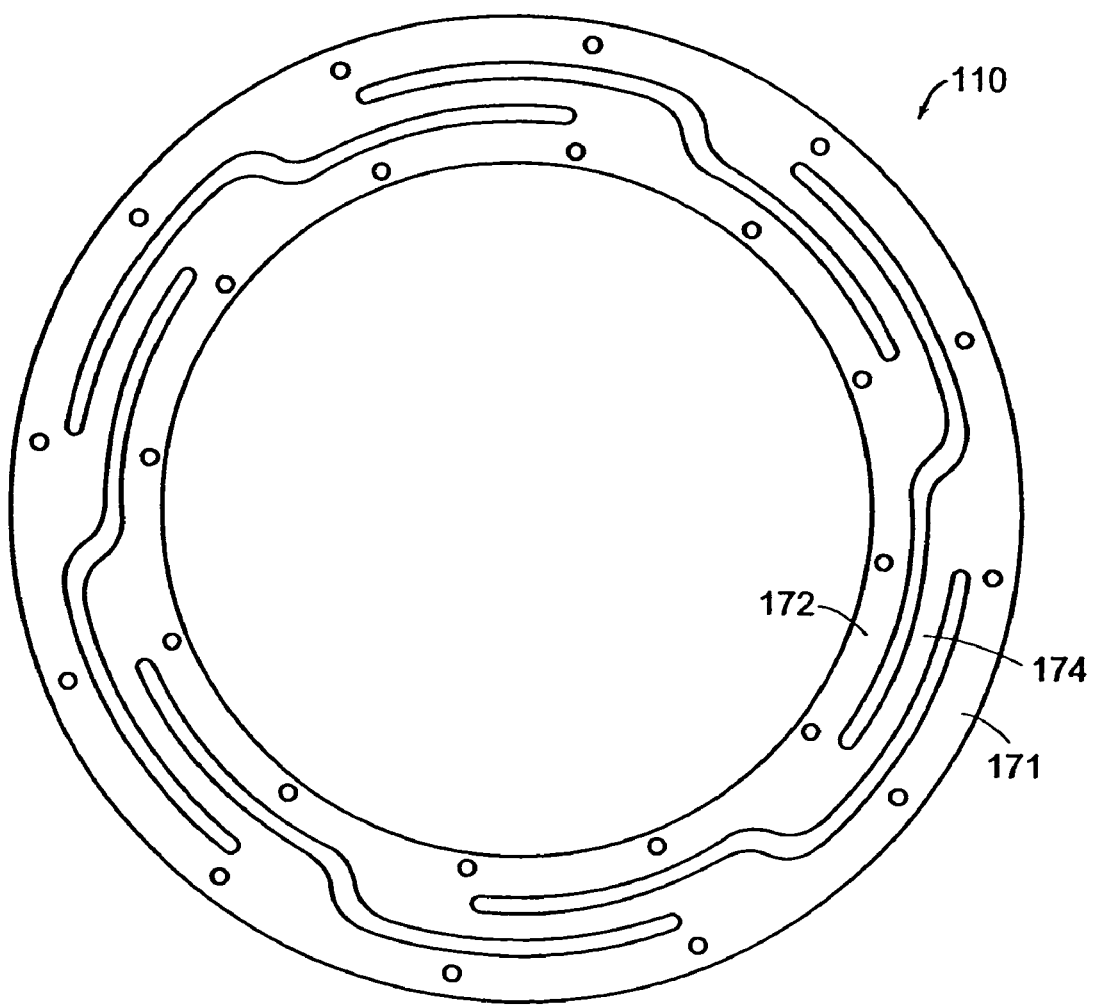
FIG. 16A

Piston mode transfer functions, $\frac{y_{piston}}{u_{piston}}$

Piston mode transfer functions, $\frac{y_{piston}}{u_{piston}}$

Pitch mode transfer functions, $\frac{y_{piston}}{u_{piston}}$

Pitch mode transfer functions, $\frac{y_{piston}}{u_{piston}}$

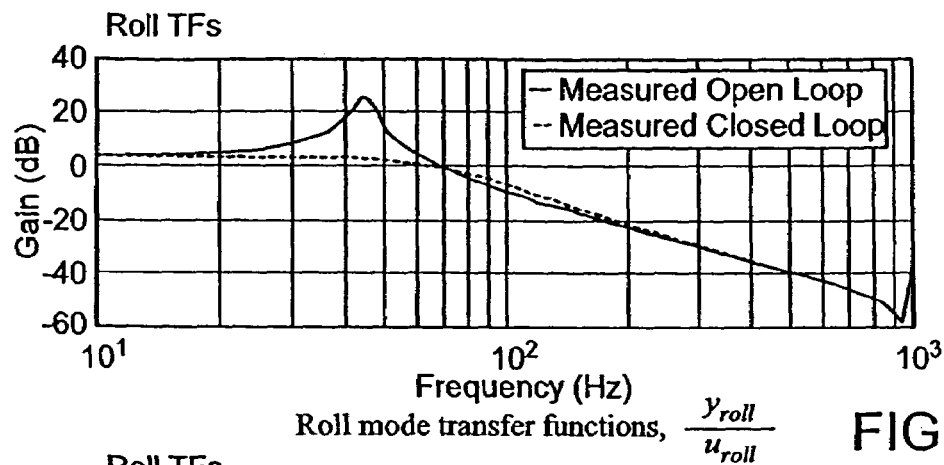
Roll mode transfer functions, $\dfrac{y_{roll}}{u_{roll}}$    FIG. 25A
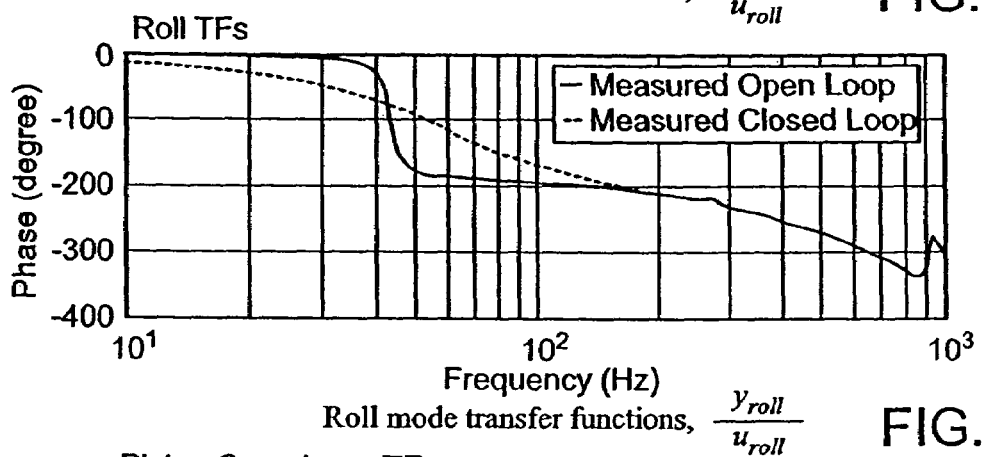
Roll mode transfer functions, $\dfrac{y_{roll}}{u_{roll}}$    FIG. 25B
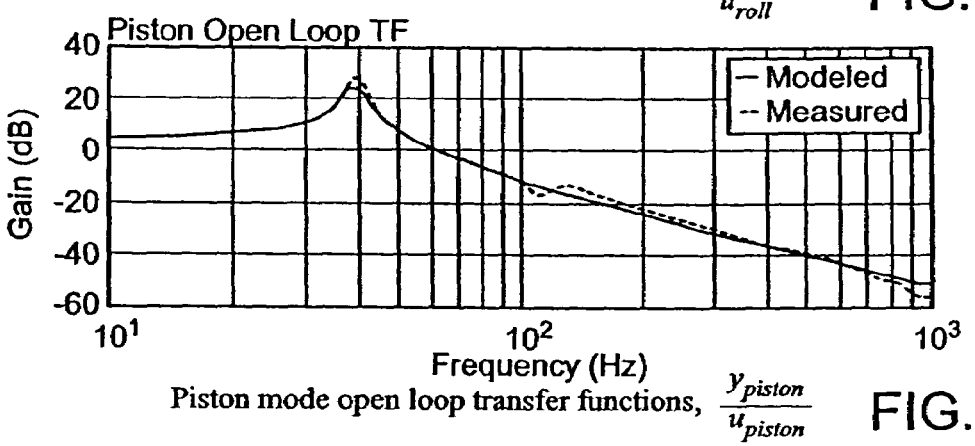
Piston mode open loop transfer functions, $\dfrac{y_{piston}}{u_{piston}}$    FIG. 26A
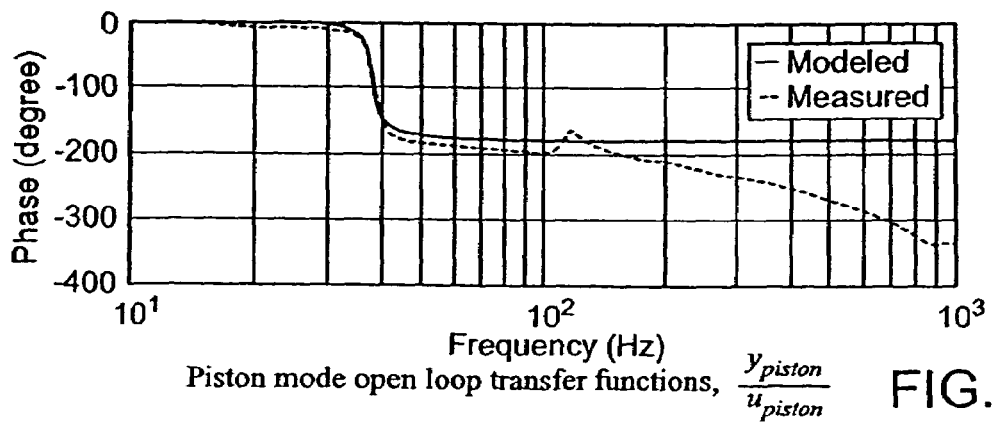
Piston mode open loop transfer functions, $\dfrac{y_{piston}}{u_{piston}}$    FIG. 26B Piston mode loop transmission transfer function, $\frac{y_{piston}}{u_{piston}}$ Piston mode loop transmission transfer function, $\frac{y_{piston}}{u_{piston}}$

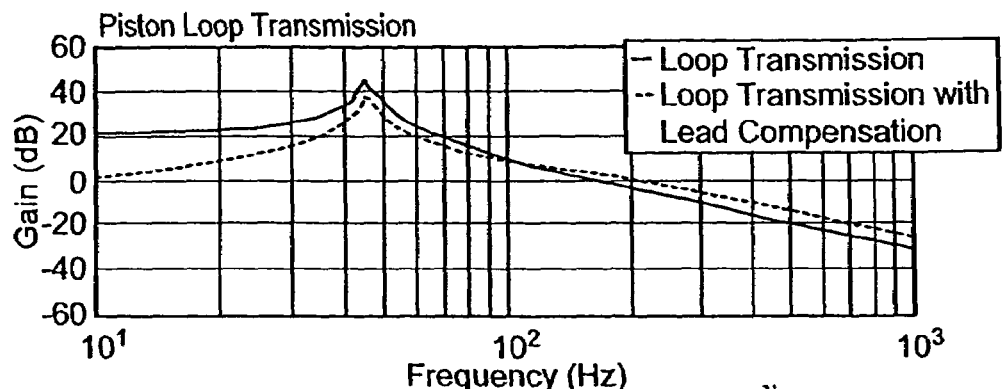
Pitch mode loop transmission transfer function, $\frac{y_{pitch}}{u_{pitch}}$ FIG. 29A
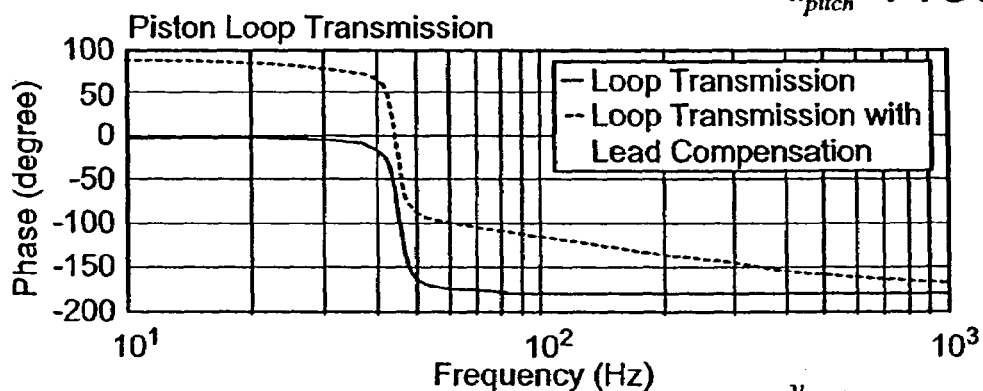
Pitch mode loop transmission transfer function, $\frac{y_{pitch}}{u_{pitch}}$ FIG. 29B
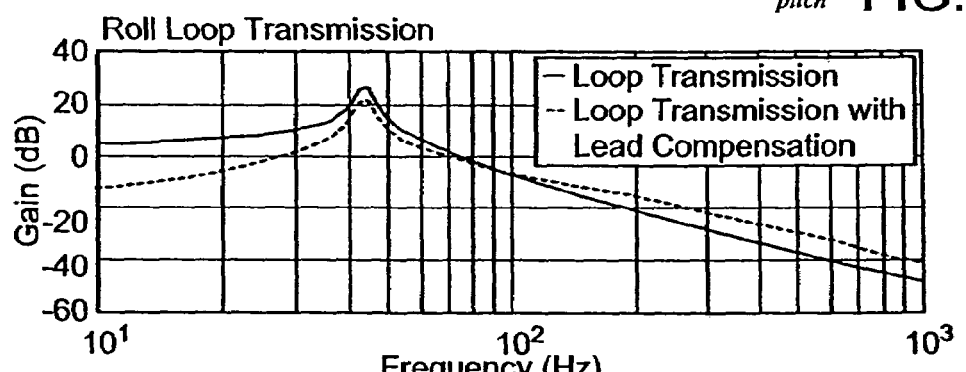
Roll mode loop transmission transfer function, $\frac{y_{roll}}{u_{roll}}$ FIG. 30A
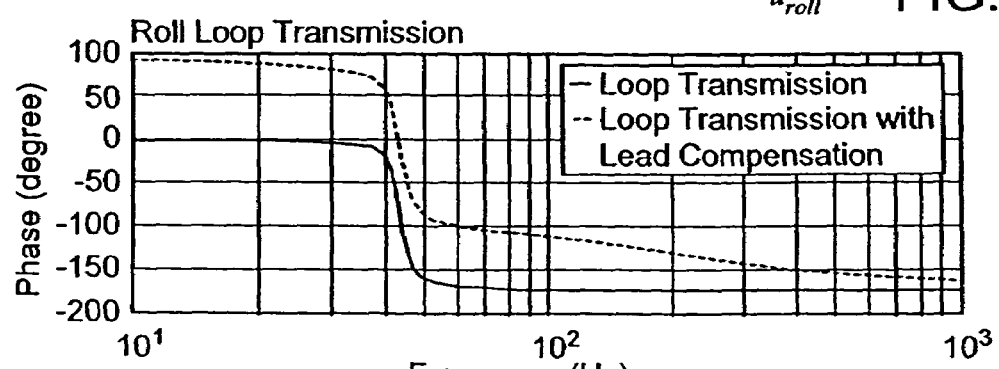
Roll mode loop transmission transfer function, $\frac{y_{roll}}{u_{roll}}$ FIG. 30B Stage control interface Sensor trace displays

FIG. 38

| Automated Stamping | Stepnumber | ChuckCont Pos +78.490 | | Stamp | | |
|---|---|---|---|---|---|---|
| Mode | ○ 0 | Substrate Thickness +0.500 | | Callibration Overtravel +2.000 | Position | 62.5093 |
| ○ Callibration | ○ 1 | standoff +0.100 | | Contact Hold Time +5.000 | Piston | 0.100 |
| ○ Linking | ○ 2 | Final Pos 78.103 | | Deflection +1.000 | Pitch | 0.090 |
| ○ Stamping | ○ 3 | SineVel +5.000 | | Contact Area +0.001 | Roll | 0.057 |
| ○ Pose detected | ContactPos 78.210 | SineVelSlow +0.050 | | Reload Position +0.000 | | |
| ○ Pitch posed | Pitch Pose 0.213 | RampVal +0.050 | | Force (N) 28.000 | | |
| ○ Roll posed | Roll Pose 0.082 | | | Pressure (kPa) 28.000 | | |
| ○ Head posed | | | | Hold Time 5.0000 | | |
| ○ Contact detected | | | | ☐ End Hold | | |

- 48 Master
- 54 Stamp
- 158 Stamp Backing ically. Additionally, as the microcontact printing stamp contacts the substrate surface, the microcontact printing stamp continues to expand until fully
MICROCONTACT PRINTING

CROSS REFERENCES TO RELATED APPLICATIONS

This application is a divisional of U.S. application Ser. No. 10/340,537, filed Jan. 10, 2003 now U.S. Pat. No. 7,117,790, entitled "Microcontract Printing" which claims the benefit of U.S. Provisional Application No. 60/347,225, filed Jan. 11, 2002 and entitled "Microcontact Printing Apparatus and Method." The entire contents of the above application are incorporated herein by reference.

BACKGROUND OF INVENTION

In general, microcontact printing is a "soft lithography" process which involves the application of coating in the form of small structures (e.g., submicron patterns) to substrates. Such structures are useful in a variety of fields including chemistry, biology, and semiconductor and integrated circuit processing. For example, in the fields of chemistry and biology, microcontact printing is useful in forming micropatterns for drug and cellular measurement.

There are a variety of approaches to microcontact printing. In one conventional approach, a conventional microcontact printing apparatus includes a support structure for holding a microcontact printing stamp, a platform (e.g., a vacuum chuck) for holding a substrate, and an air-actuated piston for moving the platform and the substrate toward the microcontact printing stamp. A variable-pressure chamber contains the support structure, the platform, and the piston. Additionally, a vacuum pump connects to both the variable-pressure chamber and the platform. The microcontact printing stamp typically includes rigidly supported elastomeric material such as polydimethylsiloxane (PDMS) which defines a stamping surface having a pattern (e.g., a combination of contact surfaces and recesses) which is transferable to the surface of the substrate.

During operation, a user inks (i.e., wets) the microcontact printing stamp with a stamping material which can be suitable for forming a self-assembled monolayer (SAM) on the surface of the substrate. An example of such a liquid is a hexadecanethiol-based solution. Next, the user manually maneuvers the microcontact printing stamp so that the stamping surface of the microcontact printing stamp is visually parallel to the substrate surface. The user manually actuates the air-actuated piston in order to move the substrate, which is held to the platform by the vacuum, into contact with the microcontact printing stamp.

SUMMARY OF THE INVENTION

Unfortunately, there are deficiencies to the above-described conventional microcontact printing practices. In particular, much of the above-described conventional microcontact printing practices are carried out by hand with little mechanization resulting in a lack of accuracy and consistency in microcontact printing results. For example, in connection with the above-described conventional microcontact printing apparatus which requires a user to (i) manually operate a vacuum source that connects to a variable-pressure chamber and to a platform, and (ii) manually operate an air-actuated piston to move the substrate into contact with the microcontact printing stamp, there are abundant opportunities for operating inconsistencies which would result in different microcontact printing effects from one microcontact printing operation to another. In particular, since the air-pressure within the variable-pressure chamber is under manual control (e.g., the user manually opens and/or adjusts valves to a vacuum pump), it is difficult or impossible for the user to consistently adjust the rate at which the air pressure drops within the variable-pressure chamber. Thus, there is little or no control over how much ink solution (i.e., solvent) evaporates from the microcontact printing stamp before the stamp contacts each substrate from one microcontact printing operation to another. Accordingly, the microcontact printing pattern on each substrate can vary dramatically (e.g., too much ink deposited on one substrate leading to smearing, too little ink deposited on another substrate leading to an incomplete pattern, etc.).

Additionally, since the substrates reside within the variable-pressure chamber during the microcontact printing operation, it is difficult and laborious to change substrates after completing the microcontact printing operation. Furthermore, since the user visually aligns the microcontact printing stamp with the surfaces of the substrates, there is no guarantee that the stamp is actually substantially parallel with the surfaces of the substrates thus permitting inconsistent microcontact printing stamp operations to occur. Moreover, after the platform assembly of upper and lower members having predefined spring tension and shock absorption characteristics, plungers, and compression stops have been configured, there is little or no control over the amount of force between the microcontact printing stamp and the substrate. As a result, the amount of force between the stamp and each substrate could drift (e.g., decrease or increase) over a period of time and use, thus producing patterns with too much ink, too little ink, smudged patterns, incomplete patterns, etc.

Similarly, in connection with the above-described conventional microcontact printing approach which involves a user manually operating a set of pressure valves to provide air pressure differences between top and bottom surfaces of a flexible microcontact printing stamp in order to bend the stamp, there is a strong likelihood of inconsistencies between microcontact printing operations between substrates. In particular, since the user manually controls the air pressure valves, it is difficult or impossible for the user to consistently control the amount of time of each microcontact printing operation and thus difficult or impossible for the user to control the amount of ink solution that evaporates from the microcontact printing stamp before the stamp contacts each substrate from one microcontact printing operation to another. As a result, the deposited amount of ink on each substrate can vary significantly. Additionally, as the microcontact printing stamp contacts the substrate surface, the microcontact printing stamp continues to expand until fully contacting the substrate surface (i.e., the microcontact printing stamp remains deformed and continues to further deform as contact with the substrate surface increases) thus providing a deformed pattern on the substrate. Also, it is difficult to indirectly control the exact position and shape of the flexible microcontact printing stamp by manually adjusting the air pressure on each side of the stamp thus allowing for contact position and stamp shape inconsistencies.

Furthermore, in connection with the above-described conventional microcontact printing approach which involves a user manually rolling a cylindrical-tool over a substrate as in a rotary press, it is difficult for the user to provide consistent force control, i.e., it is difficult for the user to consistently control the amount of force between the stamp and the substrate since rolling at a fast rate or with more pressure will provide different results than rolling at a slow rate or with less pressure. Moreover, the stamps remain in distorted states once attached to the rollers, and it is difficult to control distortions of the elastomeric material of the microcontact stamps when bowing or bending the stamps in an extreme manner to form the cylindrical-tool, thus providing further opportunity to generate undesired patterning results.

A preferred embodiment of the invention provides a system for printing a pattern on a print surface using an actuator and a control system to precisely control the force or pressure exerted between the stamp and the print surface. The control of the force exerted by the stamp on the print surface such as a wafer provides for the transfer of a print medium such as a thin layer of material onto the wafer in a reproducible manner. The actuators can comprise two or more voice coils that are spaced around the periphery of the stamp to control orientation and displacement of the entire stamp.

In a preferred embodiment of the invention the stamp (or the wafer) can undergo both coarse and fine movement by separate actuator system. Additionally the stamp (or the wafer) can have a third actuator such as a pressure chamber or an array of actuators that can selectively displace regions of the stamp (or wafer) to provide a contact region between the stamp and the wafer (print surface) and to selectively control expansion or propagation of the contact region.

The system can also include sensors to measure position and or applied force. Thus both open and closed loop control can be used.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 15A-15C illustrate the initiation and propagation of a contact front;

FIG. 16A is a top view of a flexure of the stamp head assembly;

FIG. 25A is a graph of the gain of the roll mode transfer functions;

FIG. 25B is a graph of the phase of the roll mode transfer functions;

FIG. 26A is a graph of the gain of the piston mode open loop transfer functions;

FIG. 26B is a graph of the phase of the piston mode open loop transfer functions;

FIG. 29A is a graph of the gain of the pitch mode loop transmission function;

FIG. 29B is a graph of the phase of the pitch mode loop transmission function;

FIG. 30A is a graph of the gain of the roll mode loop transmission transfer function;

FIG. 30B is a graph of the phase of the roll mode loop transmission transfer function;

FIG. 38 shows an automated stamping control interface;

DETAILED DESCRIPTION OF THE INVENTION

Figures 1A, 1B:
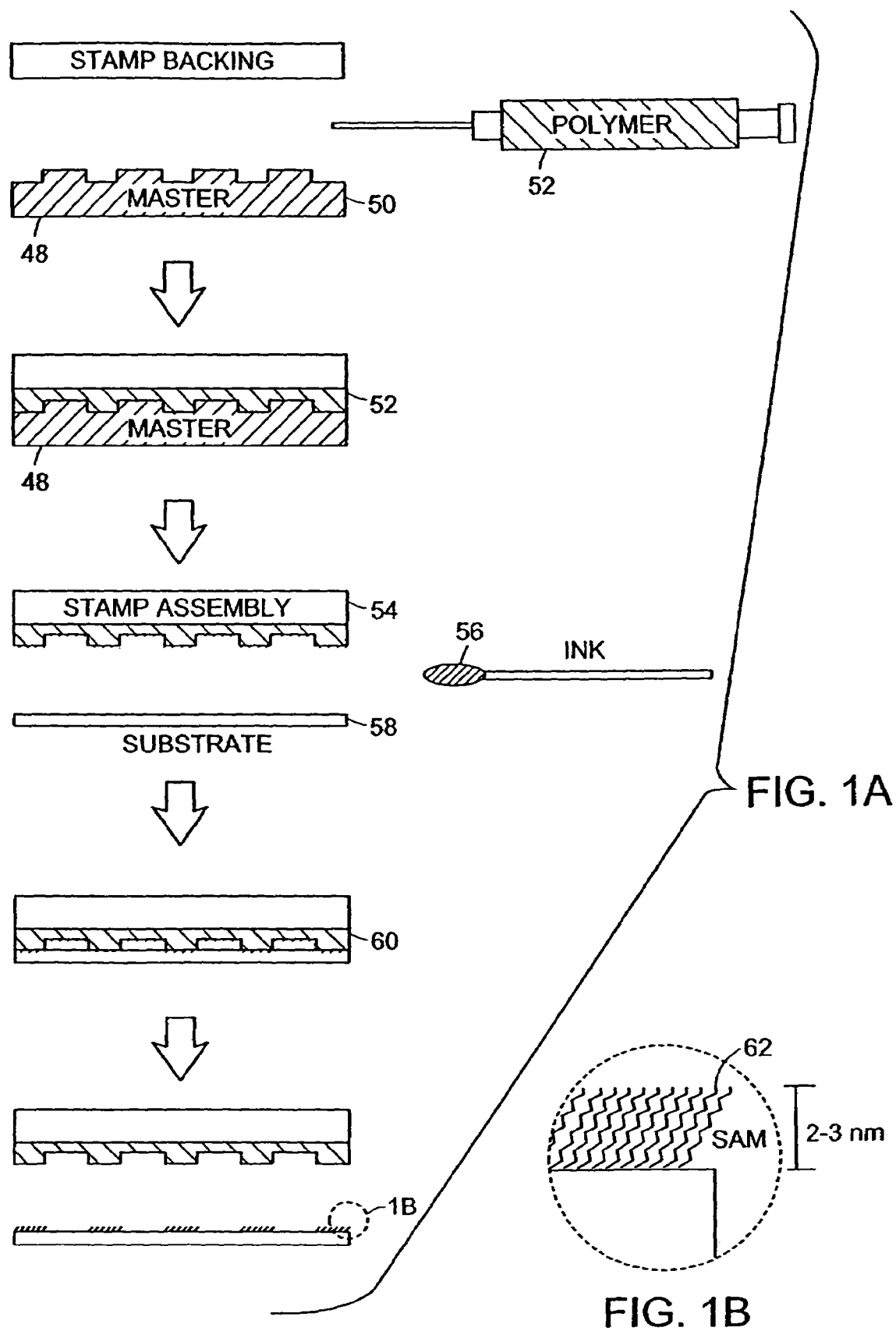
FIG. 1A is a schematic of the microcontact printing process.
FIG. 1B is an enlarged view taken from FIG. 1A.

Referring to the drawings in detail, where like numerals indicate like elements, there is illustrated a microcontact printing tool in accordance with the present invention designated generally as 40.

Microfabrication has long been used for semiconductor applications. Recent developments in biology and chemistry are now employing microfabrication as well. While some of the procedures and techniques from the semiconductor industry can be carried over for use in these new applications, biologists and chemists often have specific requirements that cannot be met by conventional means.

Microcontact printing is a method of microfabrication that can satisfy many of these demands. As one of the suite of soft lithographic fabrication techniques, microcontact printing permits the patterning of microfeatures that can be tailored to have additional functionality for chemical or biological activity. This technology has the capability of overcoming several of the drawbacks of photolithography, such as high tooling costs and the use of harsh chemicals in the processing, and has the potential to be a valuable complementary technology.

This invention relates to mechanisms and processes for the automation of soft lithographic microcontact printing. Through these devices and methods soft lithography can be used in mass production, and in a broader range of applications.

An important aspect in the development of soft lithography is self-assembly. Through this mechanism, molecules organize themselves in formations that are stable and orderly. Of specific interest are systems in which molecules form monolayers (layers that are a single molecule thick). These systems, known as self-assembled monolayers or SAMs are formed spontaneously by chemisorption and self-organization of functionalized, long-chain organic molecules onto the surfaces of appropriate substrates. Examples of print materials and methods of preparing and using them are described in greater detail in U.S. Pat. Nos. 5,512,131; 5,817,242; 5,900,160; 6,048,623; 6,060,121; 6,180,239; U.S. Publication No. 20020072074 (Zhang et al.) and European Patent document EP 1193056A1, the entire contents of the above patents and applications being incorporated herein by reference.

The microcontact printing as described below makes it possible to selectively pattern areas with a range of chemical properties, based on the type of printing medium, such as SAMs, inks, and other thin films. By controlling the patterning, contiguous regions can be created with a sub-micron resolution. Subsequent to patterning, the SAM can be used for a wide range of purposes. For example, it can act as an ultra-thin resist, to permit etching of the unprotected area. Alternatively, the SAM can be tailored to have a specific chemical or biological functionality.

Microcontact printing is a technique used to transfer micropatterns of SAMs to surfaces. Referring to FIG. 1A, the steps in the transfer of the micropatterns of the SAM to the surface are shown. First, a master 48 is created by a conventional microfabrication method such as photolithography as represented by 50. Following this a replica molding step uses a polymeric precursor to create the inverse topology, which bears microfeatures with a high degree of fidelity to the master as represented by 52. After a curing period, an elastomeric replica (the stamp) 54 is separated from the master 48. The stamp 54 is then coated or inked with the SAM 56 or print medium, and this medium is transferred to another surface, a substrate 58, through contact phenomena as represented by 60. A single molecular-layer pattern is thus printed on the substrate, as defined by the contacted areas as represented by 62, as seen in FIG. 1B.

The elasticity of the stamp according to the invention makes it possible to accommodate surface roughness while still ensuring continuity of structures and patterns. How well this contact is achieved plays a major role in the utility of the structures: uneven pressure, for example, can lead to distorted features which may be unusable. The distorted features are further addressed in the example and testing below. The mechanism apparatus, according to the invention reduces or minimizes these distorted features.

Figure 2:
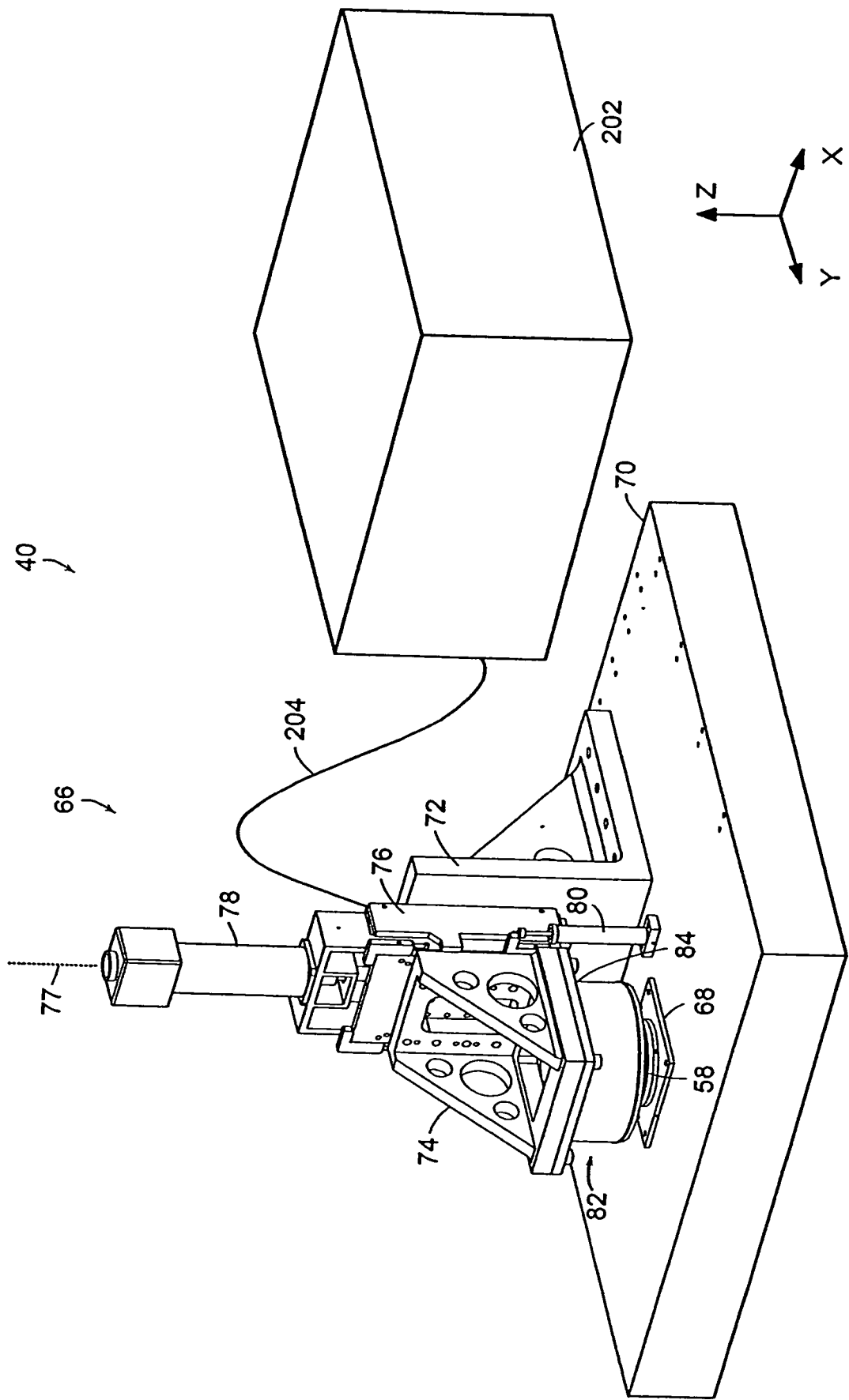
FIG. 2 is a side perspective view of the printing apparatus according to the invention.

Referring to FIG. 2, the microcontact printing tool 40 is shown. The tool 40 in a preferred embodiment provides the capability of transferring a molecular monolayer in a high-resolution micropattern across a large substrate, for example a 100 mm diameter wafer.

The microcontact printing tool 40 has a print unit 66 and a wafer chuck 68. Both the print unit 66 and the wafer chuck 68 are mounted to a base, a surface plate 70.

In the embodiment shown, the surface plate 70 is a cast-iron surface plate, which serves as the machine frame. The top of the surface plate 70 has been hand-scraped by the manufacturer to a flatness on the order of micrometers. This surface plate 70 is a reference plane that facilitates alignment of the machine components. In a preferred embodiment, the base 70 is carried by a vibration isolation fixture.

Figure 3:
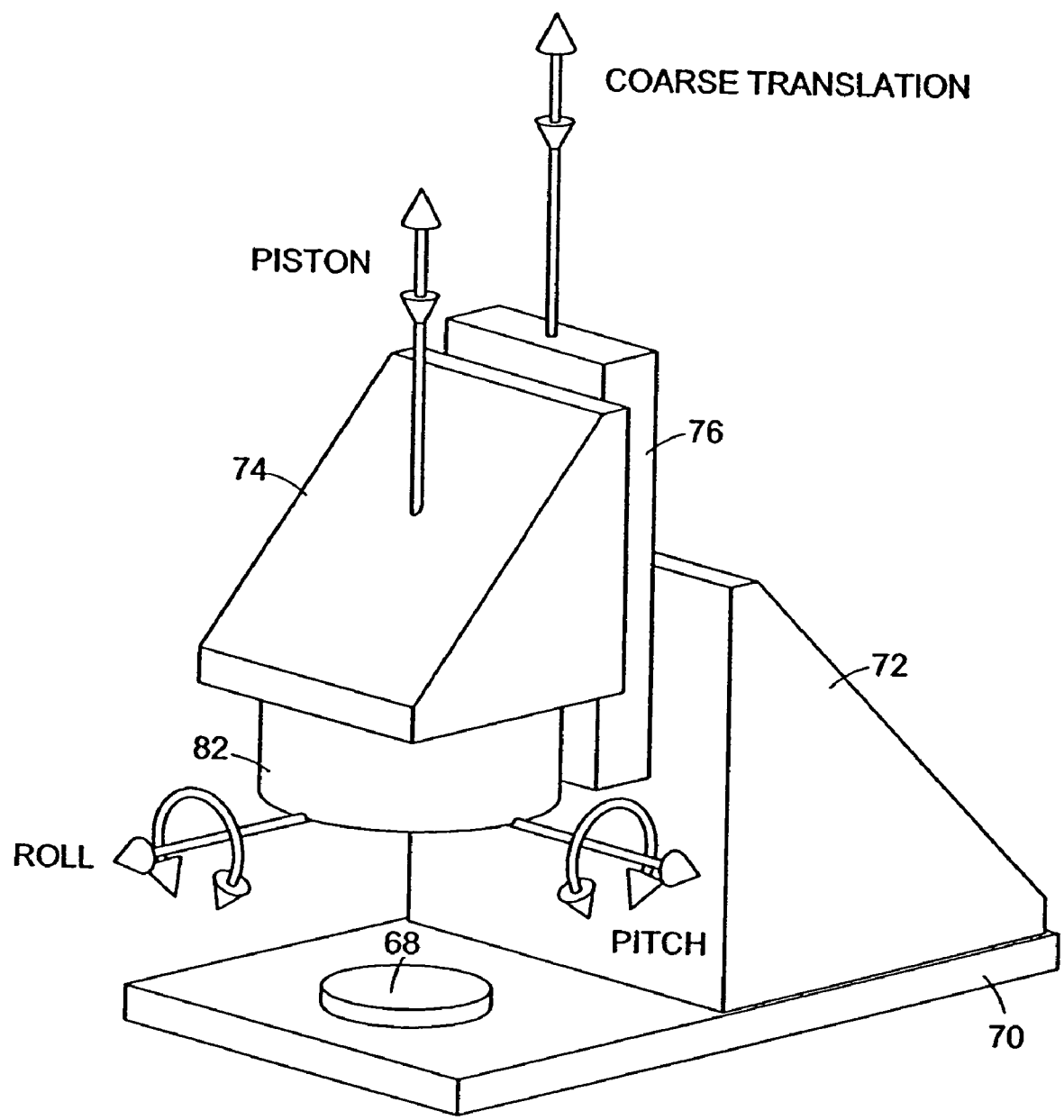
FIG. 3 is a perspective view of the printing unit showing the degrees of freedom.

The print unit 66 has a support angle bracket 72 mounted to the surface plate 70. A second, smaller angle bracket 74 is carried by the first support angle bracket 72. The bracket 74 is movable in a vertical "coarse" translation direction, as seen in FIG. 3, relative to the first support 72 by way of a stage 76 that rides on crossed-roller bearings, and is driven in the vertical axis 77 by a coarse actuator 78 including a servomotor and ball screw. The print unit 66 has a pair of load counterbalances 80 extending between the stage 76 and the surface plate 70. In a preferred embodiment, the stage 76 is a long-travel stage that can travel in excess of 100 mm, for example, to facilitate changing stamps and substrates.

The print unit 66 has a stamp head assembly 82 carried by the second angle bracket 74. The stamp head assembly 82 has a base, a shell ring, 84 that is secured rigidly to the bracket 74. As discussed below, the stamp 54 of the stamp head assembly 82 is mounted so that it can move in a vertical direction, and in roll and pitch directions, as seen in FIG. 3, relative to the second angle bracket 74.

The microcontact printing tool 40 has a controller 202 as part of a control system 200. The controller 202 is connected to the print unit 66 and the wafer chuck 68 by a connection medium 204. (e.g., a electrical cable, wireless infrastructure, fiber optic media, pneumatic, combinations thereof, etc.).

FIG. 3 shows the topology, and a perspective view of the printing unit showing the degrees of freedom. In this arrangement, the linear motion axes are vertically oriented. The arrangement allows the fixturing of the stamp and substrate horizontally (i.e., so that their surface planes are horizontal). Additionally, the substrate 58 which is retained by the wafer chuck 68 is held stationary, and the stamp 54 moves relative to the stationary reference provided by the surface plate 70. The vertical orientation of the system ensures that gravitational effects impact the linear axes alone, and do not add any undesirable moments which could cause rotational control complexity. While the above topology is discussed in this embodiment, other topologies can be used as discussed below.

Figure 4:
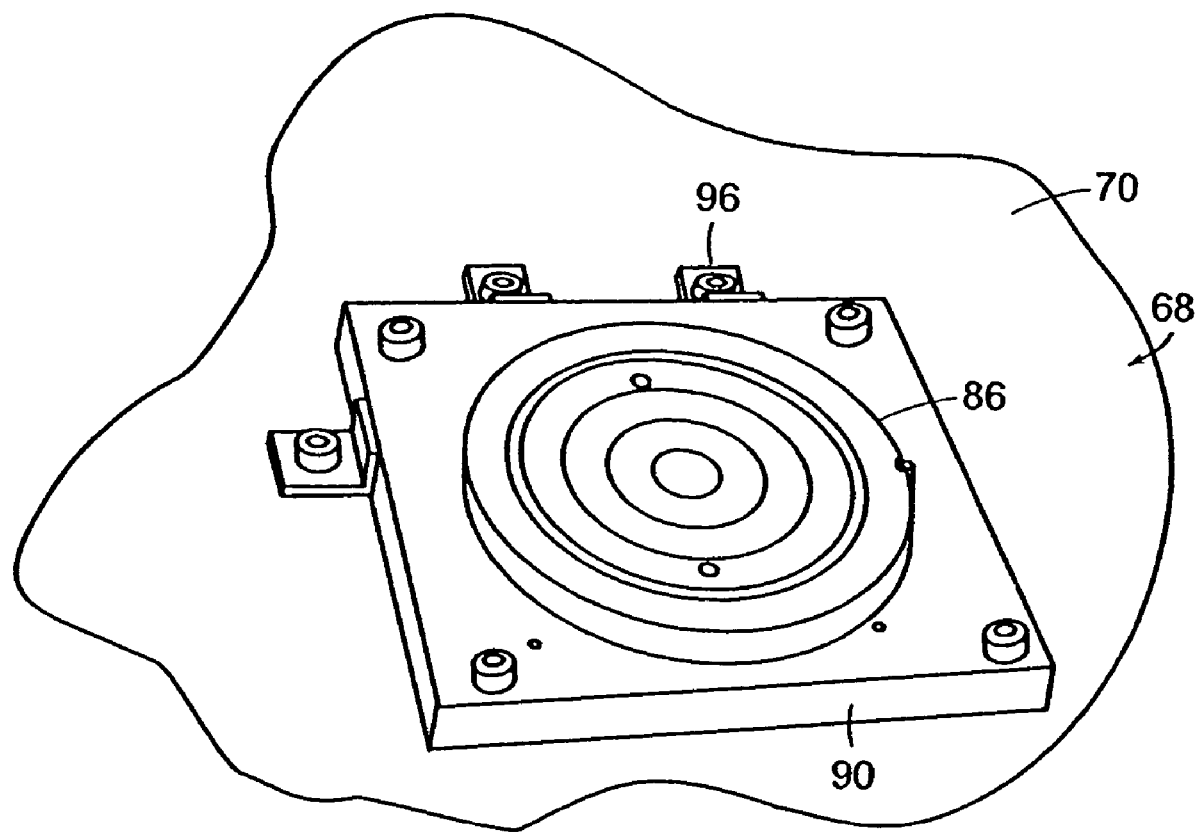
FIG. 4 is a perspective view of a wafer chuck on the surface plate.

Referring to FIG. 4, the wafer chuck 68 is shown secured to surface plate 70. The wafer chuck 68 retains the substrate 58 that is to be printed. The wafer chuck 68 is the component that defines the flatness of the substrate 58, as well as the orientation of the substrate 58 relative to the stamp 54. The top and bottom faces of the chuck 68 are as near to parallel as possible.

Figure 5A:
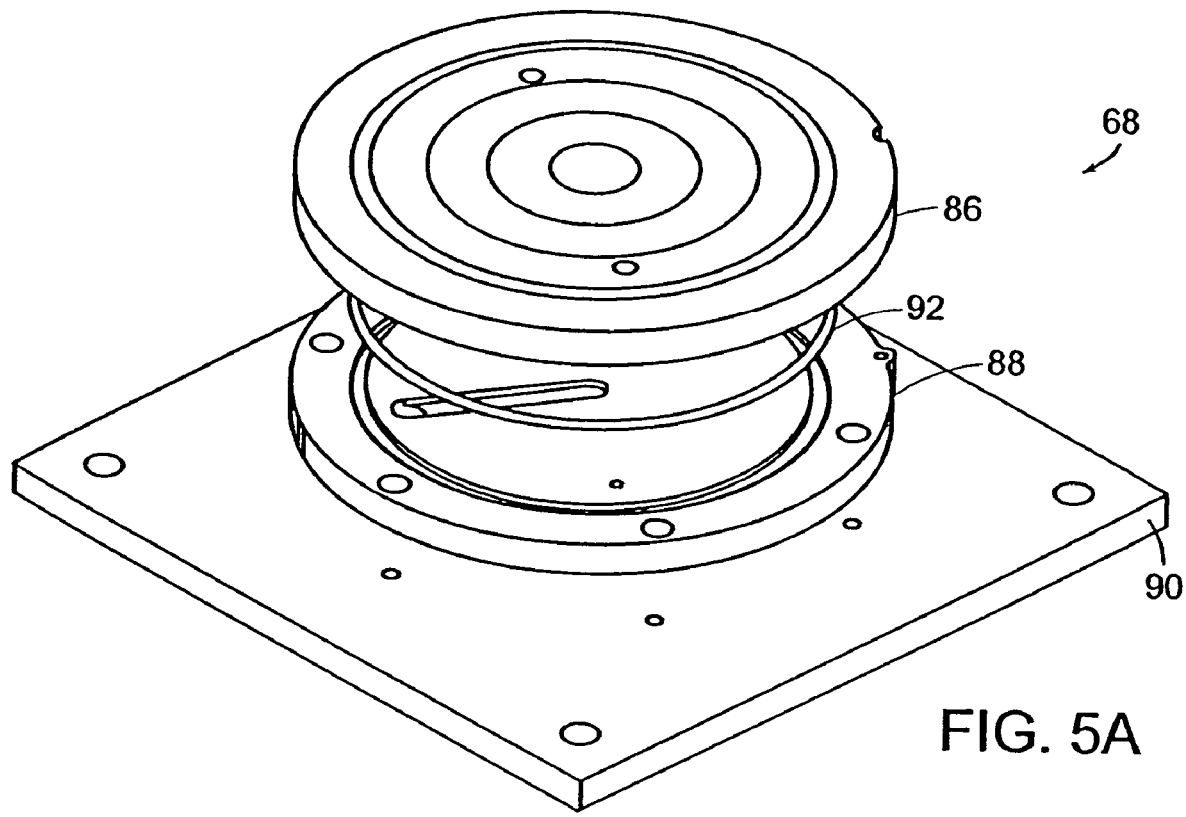
FIG. 5A is a perspective view of the wafer chuck assembly.
Figure 5B:
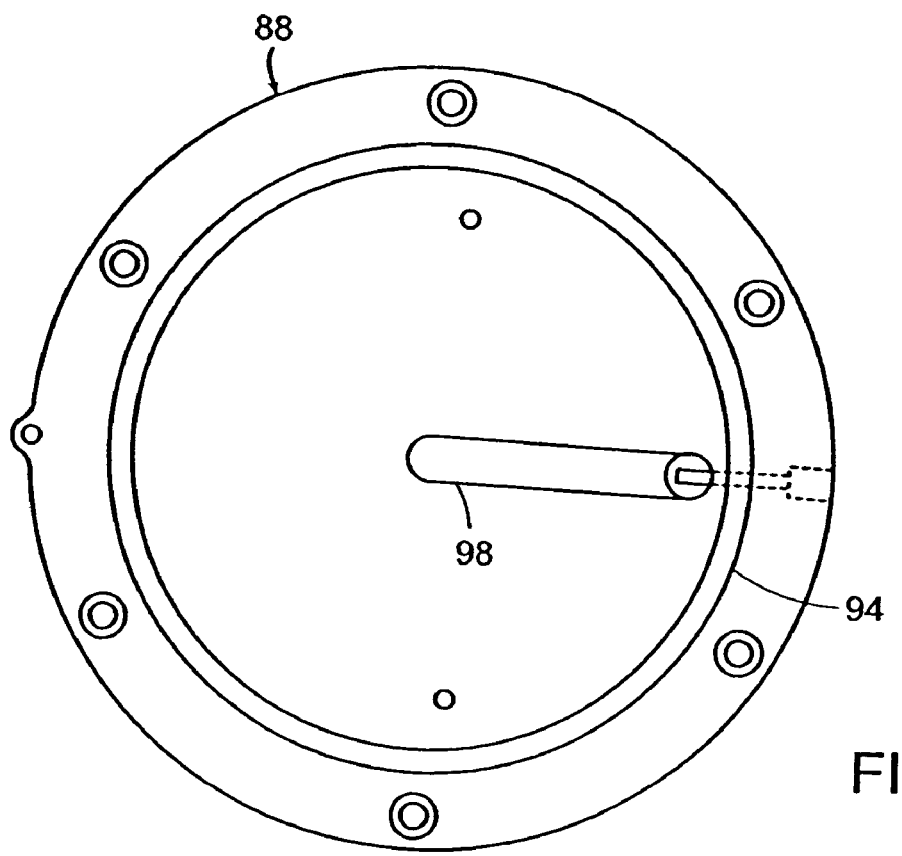
FIG. 5B is a top view of the adapter plate.
Figure 5C:
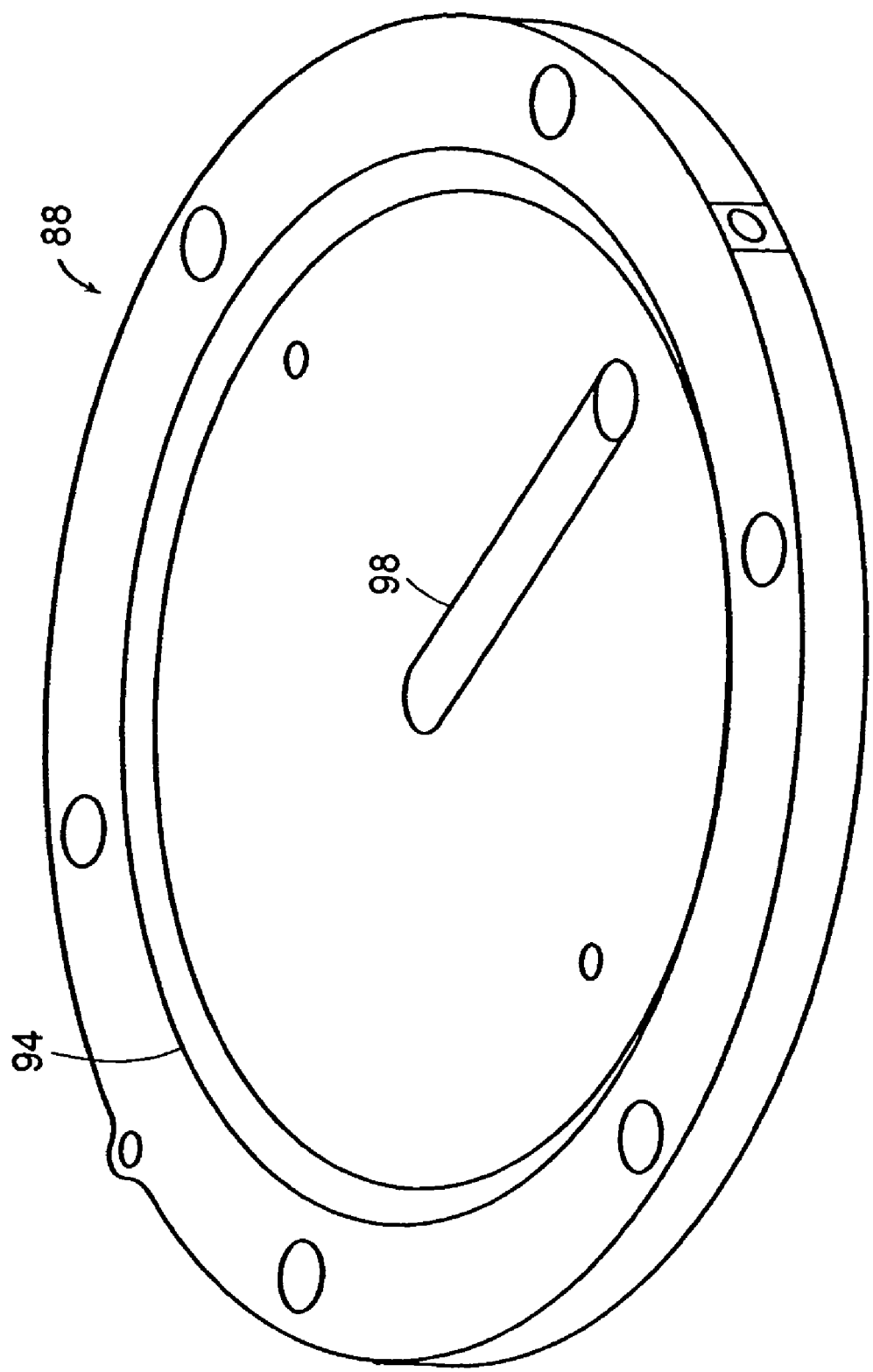
FIG. 5C is a perspective view of the adapter plate.

The wafer chuck 68 has a plate 86, an adapter plate 88, a mounting plate 90, an O-ring 92, and a plurality of fasteners, as seen in FIG. 5A. The steel plate 86 of the chuck 68 is held in place to the adapter plate 88 with the O-ring 92 interposed. The O-ring 92 is received in a groove 94 as seen in FIGS. 5A-5C in the adapter plate 88 for sealing the steel plate 86 allowing a vacuum to be drawn. The adapter plate 88 is secured to the mounting plate 90. The mounting plate 90 is secured to the surface plate 70.

In addition, a plurality of positioning clamps 96 are mounted to the surface plate 70. These three positioning clamps 96 allow the wafer chuck 68 to be removed and replaced without significant change in position on the scale of micrometers.

The wafer chuck can be built of a number of materials. The materials for the components, the plate 86, the adapter plate 88, the mounting plate 90, and the positioning clamps 96 were selected to be compatible materials so as to match the coefficient of thermal expansion. In one embodiment, the chuck is composed of a precision ground tool steel material. Other possible materials include steel, ceramic, or silicon. In some cases, using a low-expansion material such as Invar® as marketed by Imphy S.A. Corporation, Paris, France, or Zerodur® as marketed by Schott Glaswerke Corporation of Germany, may be desirable.

The wafer chuck 68 has a blind hole 98 in the adapter plate 88 to create a vacuum channel. The hole 98 was threaded at one end to receive a fitting 100, such as a 10-32 fitting.

The vacuum retains the substrate 58 to the steel plate 86 of the wafer chuck 68 for printing as discussed below.

Figure 6:
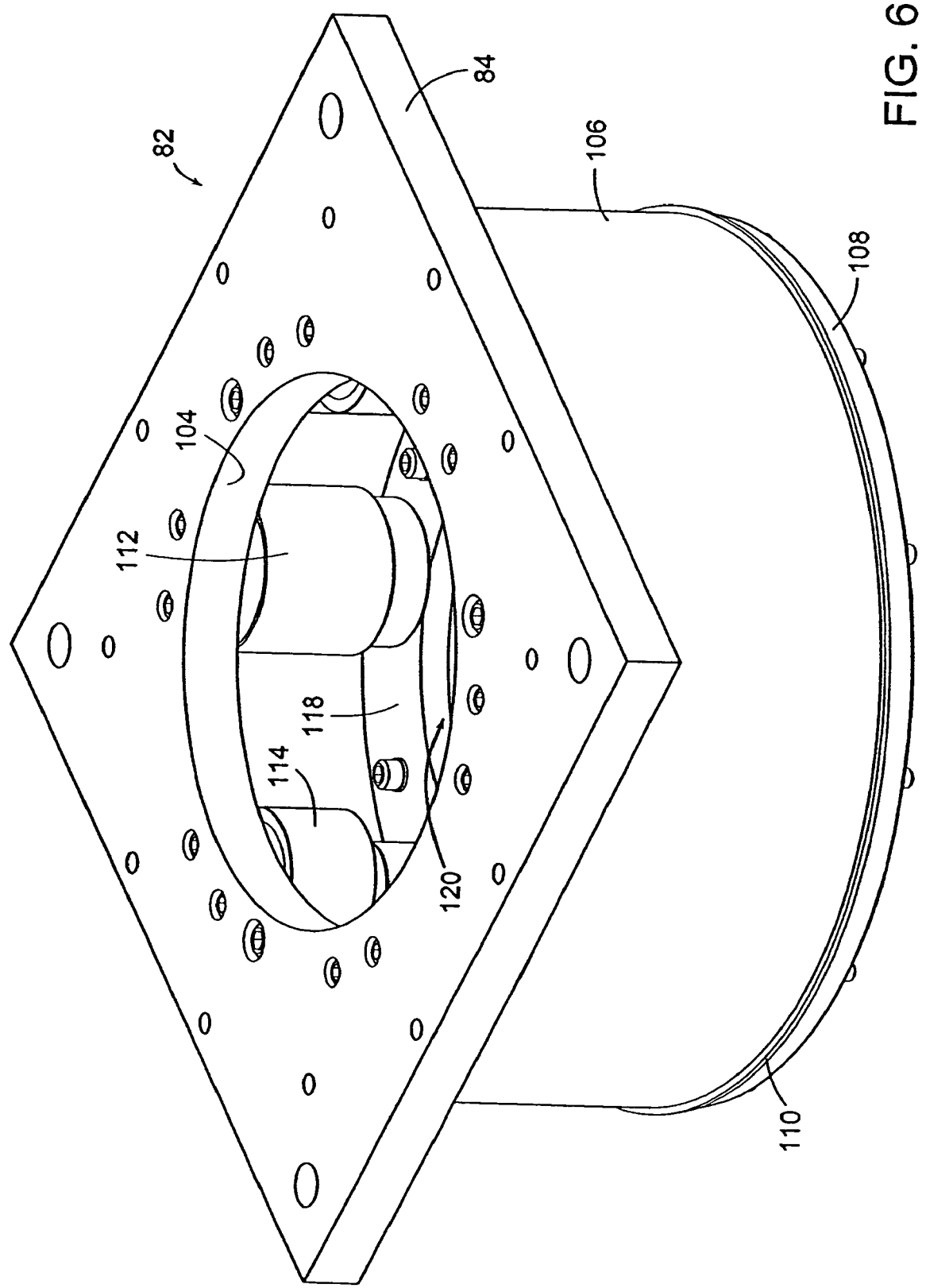
FIG. 6 is a top perspective view of a stamp head assembly.
Figure 7:
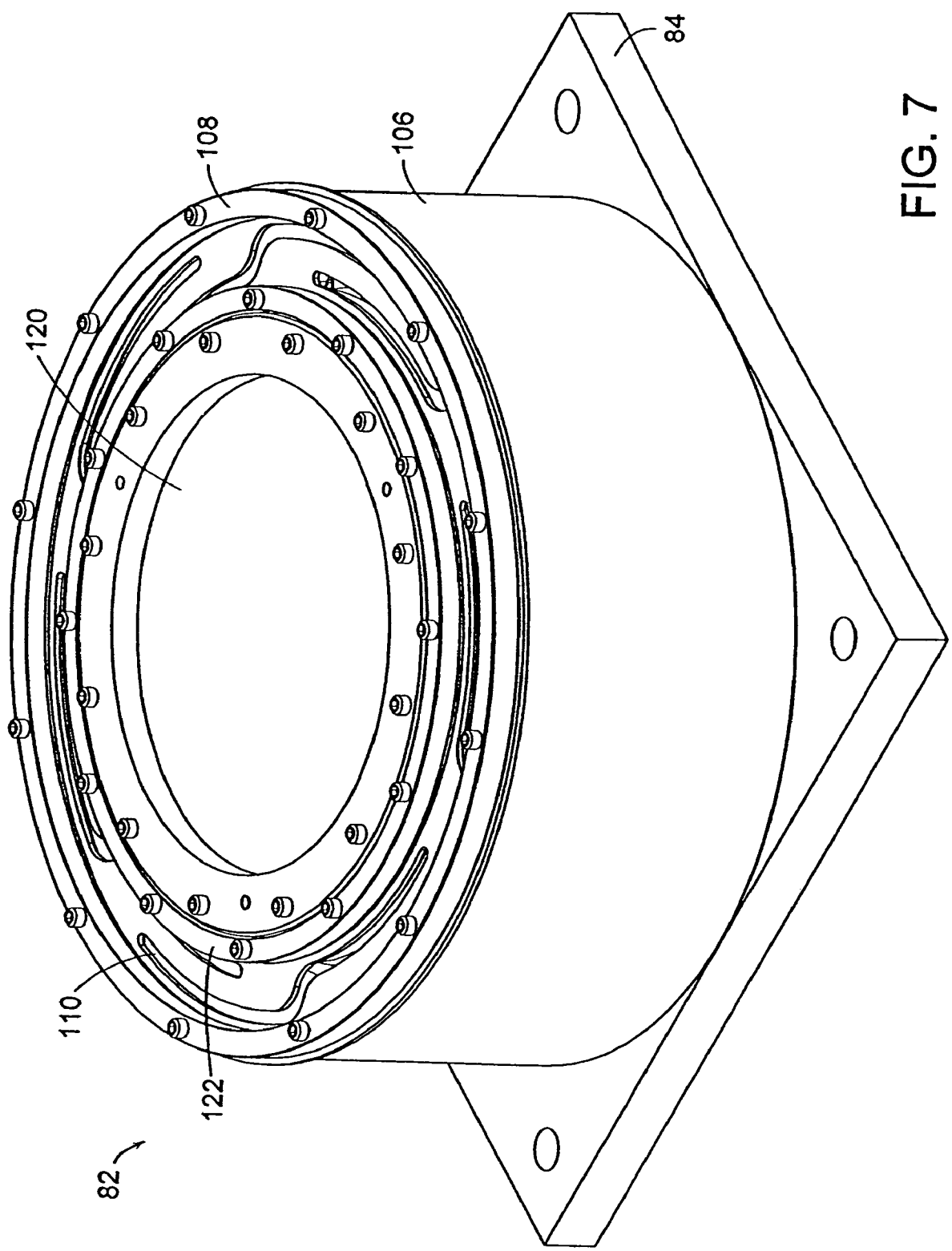
FIG. 7 is a bottom perspective view of the stamp head assembly.

Referring to FIGS. 6 and 7 which show a top perspective view and a bottom perspective view of the stamp head assembly 82. The stamp head assembly 82 has a base 84, also referred to as shell ring, that is a flat plate with a circular opening 104. The shell ring 84 is secured to the second support angle bracket 74 as seen in FIG. 2. The stamp head assembly 82 has a fixed shell 106 that is an annular ring that projects downward from the shell ring 84. A clamp ring 108 and a flexure 110 of the stamp head assembly 82 is carried by the fixed shell 106 as described in further detail below. The stamp head assembly 82 has a plurality of linear actuators 112 and a plurality of sensors 114.

The linear actuators 112 and the sensors 114 are interposed between the support plate or shell ring 84 and a top ring 118 of as described below.

The flexure 110 extends between the fixed shell 106 and a pressure chamber assembly 120 as best seen in FIG. 7. The clamping 108 seen in FIG. 6, clamps the flexure to the fixed shell 106. In addition, as seen in FIG. 7, there is an inner clamp ring 122.

Referring to FIGS. 8A-8D, while the assembly of the microcontact printing unit 40 including the printing unit 66 and the wafer chuck 68 provides that the stamp 54 is parallel to the substrate 58 to ensure accurate printing, misalignment will inevitably occur.

Figure 8A:
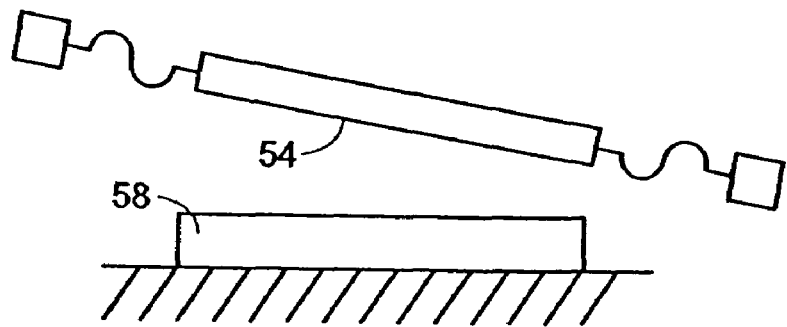
FIG. 8A-8D are schematic views of misalignment and calibration.
Figure 8B:
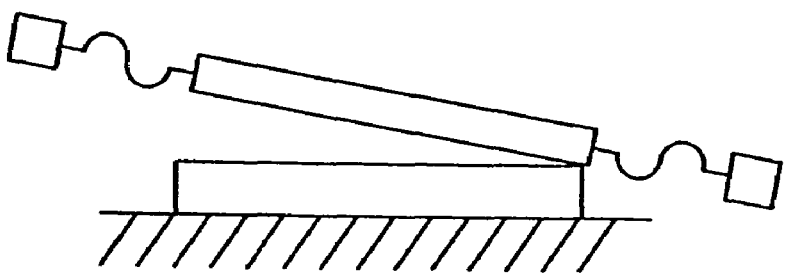
Figure 8C:
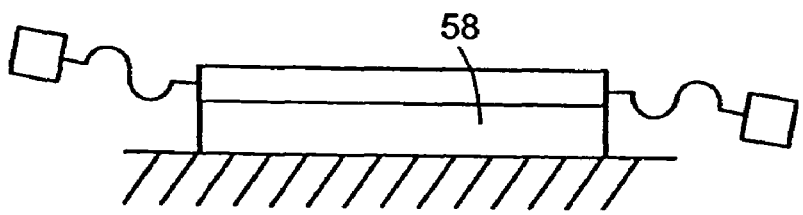

FIG. 8A is a schematic view of a potential misalignment between the stamp 54 held by the stamp head assembly 82 and the substrate 58. Referring to FIGS. 8B and 8C, the stamp 54 is advanced using the coarse actuator 78 in FIG. 2 and associated ball screw and slide, or alternatively, in conjunction with the linear actuators 112 as described below with respect to FIGS. 9-11, and the position recorded using the sensors 114, as described below with respect to FIGS. 9 and 10. FIG. 8A-8D shows the stamp 54 in positions of retracted, approaching, contacted and posed/retracted respectively.

Variation over time between stamps 54 is nulled through the use of a calibration procedure. A representative substrate 58 is used for this calibration, and permits the determination of the relative orientations of the stamp face and the substrate. The substrate's top faces are assumed to be of sufficiently uniform flatness, since the wafers are produced to flatness tolerance thin and are held on a flat vacuum chuck.

Figure 8D:
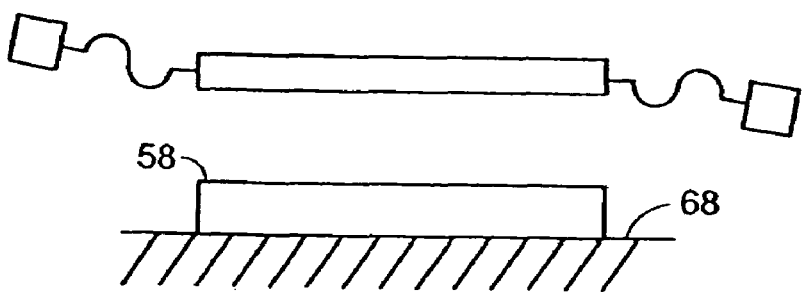

The calibration routine first detects the pitch and roll relative orientations by advancing the head using either the coarse and/or fine actuators until these feedback data are constant even as the coarse-travel slide is advanced, such as represented in FIG. 8D. This constancy indicates that the stamp face and the substrate face are fully contacted and parallel, although there may be a high pressure at the interface, as shown in FIG. 8C. The pitch and roll position feedback data for this orientation is recorded. The stamp is then retracted from contact, and the linear actuators 112 are used in a current control mode to pose the head to the contacted orientation, as seen in FIG. 8D. In a preferred embodiment, the linear actuators 112 are voice coils. In some control approaches, it is important to orient the stamp using current (force) control rather than position control, so as to prevent the addition of any undesired stiffness to the head. In other control approaches several additional techniques may be used, using either the coarse or fine actuators 78 or 112.

After the pose is set, the stamp 54 is again lowered toward the substrate 58. This time, the aim is to detect contact. A change in the piston feedback as described below with respect to FIG. 31, indicates that contact has been achieved. After contact, the head is advanced further, to ensure that the pose does not change. If the pose remains constant and in accord with the previously-recorded pose data, the calibration is complete. Otherwise, the routine returns to the first calibration step, of orientation detection. The substrate 58 used in the calibration step need not be a SAM-ready one, since it is used simply to provide a representative thickness and flatness. The stamp 54 is also not inked at this phase of operation. The calibration is further discussed with respect to FIGS. 12A-12C and 13A-13C. Such calibration may also be carried out continuously on-line during a stamping operation with real substrates and an inked stamp.

Figure 9:
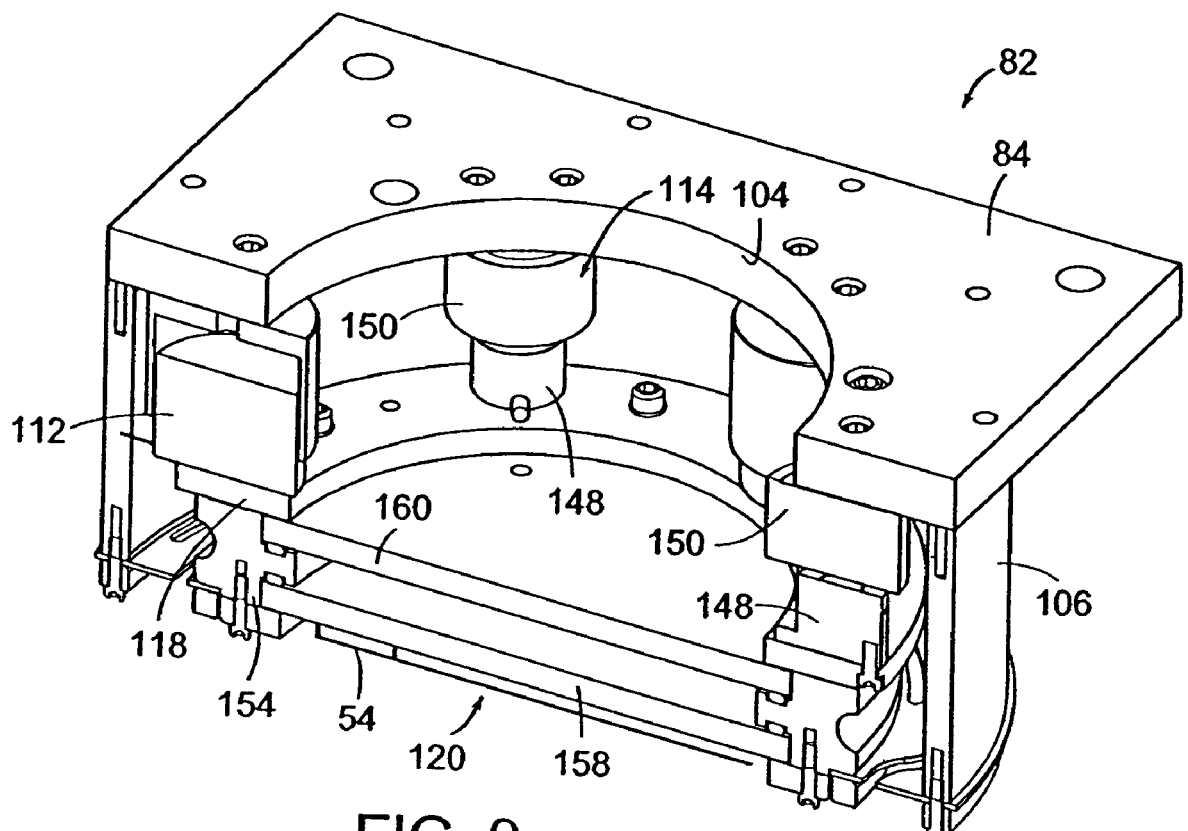
FIG. 9 is a sectional view of the stamp head taken along the line 9-9 of FIG. 6.

Referring to FIG. 9, a cross-sectional view of the stamp head assembly 82 is shown. The stamp head assembly 82 has the base, the shell ring 84, with the circular opening 104 and has the fixed shell 106, and a cylindrical ring. Fine actuation of the stamp 54 occurs relative to the shell ring 84. Fine actuation of the stamp 54 is achieved by any actuation device capable of fine actuation, such as the linear actuators 112.

Figure 10:
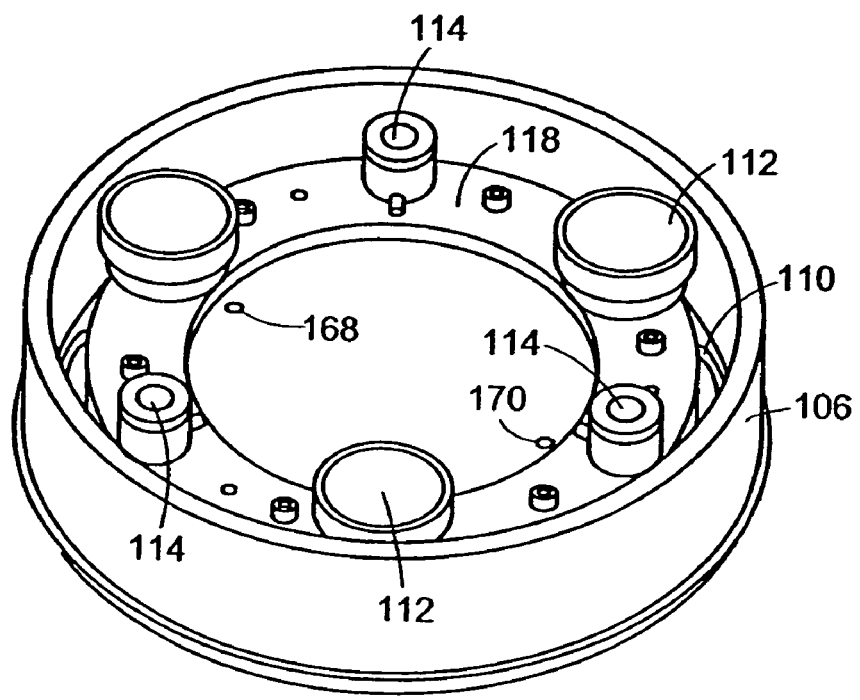
FIG. 10 is a top perspective view of the stamp head assembly with the shell ring removed.

The assembly 82 has an actuator system such as three voice coil drivers 112, as seen in FIG. 10, that are mounted to the shell ring 84, the base, and move the pressure chamber 120 through the top ring 118.

A minimum of 3 actuators are required in the preferred embodiment in order to actuate motion in the piston, pitch, and roll directions as seen in FIG. 3, although more than 3 actuators may be used in some instances as described below. A minimum of 3 position sensors are required in the preferred embodiment in order to measure motion in the piston, pitch, and roll directions, although more than 3 sensors may be used in some instances. For example, it might be desirable to use 4 actuators and 4 sensors spaced uniformly in alternation around the periphery of the stamp head on the top ring 118. Such uniform alternation allows each actuator and sensor to have balanced actuation and sensing calibration. In the case where 3 actuators are used, it is advantageous to move them uniformly in alternative around the tip ring 118. That is, the 3 actuators are at the apices of an equilateral triangle. Similarly, the 3 sensors are at the apices of a congruent equilateral triangle which has been rotated by 60° with respect to the first triangle.

The advantage of such an arrangement is that the applied forces and measured position are balanced with respect to the intended motions. That is, there is balanced sensitivity for any orbitory roll, pitch, or piston motion.

One of the parameters that is of concern is the force that is applied on the stamp. For this reason, an actuator that allows inherently linear force control is advantageous. If such a force-control actuator is coupled with a position sensor, a hybrid scheme for control may be implemented.

In the embodiment shown, the linear actuators 112 are voice coil drivers. These Lorentz' Law actuators are governed by the following principle:

$$\vec{F} = L(\vec{i} \times \vec{B}) \quad (1)$$

where $\vec{F}$ is the force on the coil, $\vec{i}$ is the coil current immersed in a field $\vec{B}$, and L is the length of wire immersed in the field.

Thus, by controlling the coil current, the force generated in the actuator 112 can be controlled as well. Voice coils 112 have the added benefit of being frictionless, which allows for precise force control. They are also clean, so they are well suited to microfabrication applications where part wear can cause contamination. Voice coils 112 are available in a wide range of configurations, with different volume, mass, and force characteristics.

The voice coil drivers 112 are linear actuators that provide the motion and force control for the stamp head 84 and in particular the pressure chamber assembly 120 with the stamp 54. The chief considerations in choosing voice coils 112 are the length of the stroke, the peak and stall forces, the weight, and the shape. The length of stroke is a function of the desired piston and rotation motions that are required to accommodate differences in stamp 54 and substrate orientations, which is in turn dependent on the arrangement of the placement of the coils 112 relative to the axes of rotation of the stamp 54 face. To get the highest resolution of angular motion, the coils 112 were placed on the largest diameter that was feasible within the chosen stamp size, which is selected to be somewhat larger than the intended substrate size, so as to achieve full coverage of the substrate surface. In the embodiment shown, the substrate can be up to 4 inches, although typically other sizes include 8 inch and 12 inch substrates. In the embodiment shown, ±1° is the maximum angular positioning range required. Therefore, a stroke of 2 mm is required at the coils, at their radius of 5.728 inches.

The force requirement is based on the desired stiffness of the stamp head support flexure, since the primary function of the voice coils 112 is to set the stamp's orientation. A secondary function of the coils 112 is to act as a stiffening or de-stiffening component through the use of closed-loop position gain. Since the passive stiffness of the head is defined by the flexure, the maximum required stamping force plays a role in voice coil 112 selection. Once this flexure stiffness is determined, the required coil force can be set as well. The voice coil 112 selection and flexure design are therefore coupled.

The pressure required for ensuring conformal contact across a large area is difficult to estimate theoretically. Experimental data collected during tests discussed below support the contact and pattern transfer process according to the invention and are described in the embodiments.

When stamping is carried out by hand, there is typically very little external pressure required. Often, the weight of the stamp alone is enough to provide for conformal contact. Polydimethylsiloxane (PDMS) has a density of 1.03 g/mL, and hand-stamps are generally between 3 and 6 mm thick.

The reason for this is the chemical interaction that takes place between the stamp surface and that of the substrate. Adhesion forces are the driving factor; the forces increase as the two surfaces are brought closer together. This is why conformal contact occurs: as a contact front is initiated, the surrounding regions are drawn into contact by the increasing adhesion forces.

Part of the reason that hand stamping is so successful is that there is no additional stiffness imposed by a backing material. The compliance of the PDMS and the lack of external restraining forces allow the adhesion forces to dominate its behavior.

A rigid backing material is used in the preferred embodiment for several reasons, among which are ease of fixturing and the addition of in-plane stiffness. However, this results in changes in the mechanics of contact. Specifically, the required pressure will be related to the thickness and elasticity of the stamp. External forces will drive contact until adhesion forces can contribute. For this, contact at individual features or regions must be initiated externally. Once it is initiated, adhesion forces will dominate in completing contact for those regions.

When dealing with as large an area as in the embodiment discussed, the contact initiation force will be significantly higher than it has been when stamping has been carried out by hand. In certain printing operations, there is an upper bound on the stamping pressure, beyond which features will collapse, and printing will occur in undesirable regions. This is a function of fill factor, the ratio of feature area to total stamp area, aspect ratio, and pattern geometry. For a periodic pattern with a fill factor of 10%, and features with 1:1 aspect ratio, the maximum pressure is approximately 40 kPa (about 6 psi). Where there is a 20% fill factor, the maximum force required is approximately 60 N (15 lbs).

In addition, it is desired to reduce or minimize both the weight and size of the voice coil assembly. It is important to minimize weight in order to maximize the bandwidth of the stamp head. Other considerations include the electrical time constant, which plays a role in determining the actuator bandwidth, and the actuator constant, which relates the force output to power consumption.

In one embodiment, the voice coil drivers 112 were obtained from BEI Sensors and Kimco Magnetics Division Systems Company, 804-A Rancheros Drive, San Marcos, Calif. 92069.

The specification for the voice coils are shown in Table 1.

TABLE 1

Voice coil parameters

| | |
|---|---|
| $R_c$ | 4.7 Ω |
| $L_c$ | 1.25 mH |
| $\tau_{elec}$ | 270 μs |
| $\tau_{mech}$ | 1.3 ms |
| current @ $F_{peak}$ | 5.26 A |
| voltage @ $F_{peak}$ | 24.7 V |
| Peak force ($F_p$) | 15.0 lbs |
| Stroke | ±0.125 in. |
| Weight | 8.05 oz. |
| Force sensitivity at mid-stroke | 2.85 ± 10% lbs./A |
| Actuator constant | 1.31 lb./$\sqrt{\text{Watt}}$ |

To drive the voice coils 112, a current control amplifier 130 is paired with each coil 112. The amplifier 130 takes an input command voltage of ±10V, and outputs a proportional current. The gain and crossover frequency of each amplifier 130 needs to be tuned to the load it is driving.

To operate the stamp head assembly 82 in an embodiment, a crossover frequency of any stamp position or impedance control loops of approximately 100 Hz was selected to get sufficient control authority. In order to be able to ignore the amplifier dynamics, crossover of the current amplifier needs to be more than about 10 times the stamp position control loop bandwidth and is around 1.5 kHz in the embodiment shown. Additionally, the ±10 V control signal is mapped linearly to a ±2 A current command: this will allow sufficient force to be generated at each of the coils.

The mechanical time constant for the voice coils is specified at 270 μs. The proportional-integral time constant of the control amplifier was selected near to 270 μs. Therefore, $C_3$ was selected to be 0.001 μF and $R_f$ is set to be 270 kΩ.

The gain for the current control amplifier was set by initially setting the power amplifier gain.

The loop transmission was desired to be set at 1.

$$\frac{R_f}{R_7} \cdot N \cdot \frac{R_s}{R_c + R_s} \cdot \frac{1}{\tau_{elec}\, \omega_c} \triangleq 1 \quad (2)$$

This gives a relation between $R_7$ and N (which is the gain of the power amplifier) in one embodiment.

$$N = \frac{R_{11} + R_{12}}{R_{11}} \quad (3)$$

The power amplifier gain (N) was previously set to 5. From this information, $R_7$ can be determined. Still referring to FIG. 11, the voltage-to-current gain is then set by the ratio of $R_7$ to $R_6$. In the embodiment shown, the gain was selected to be 0.2 A/V.

The current limiting resistors ($R_{13}$ and $R_{14}$) limit the current to the coils at 2 Amps (A): this protects the coils in case of a control error.

Figure 11:
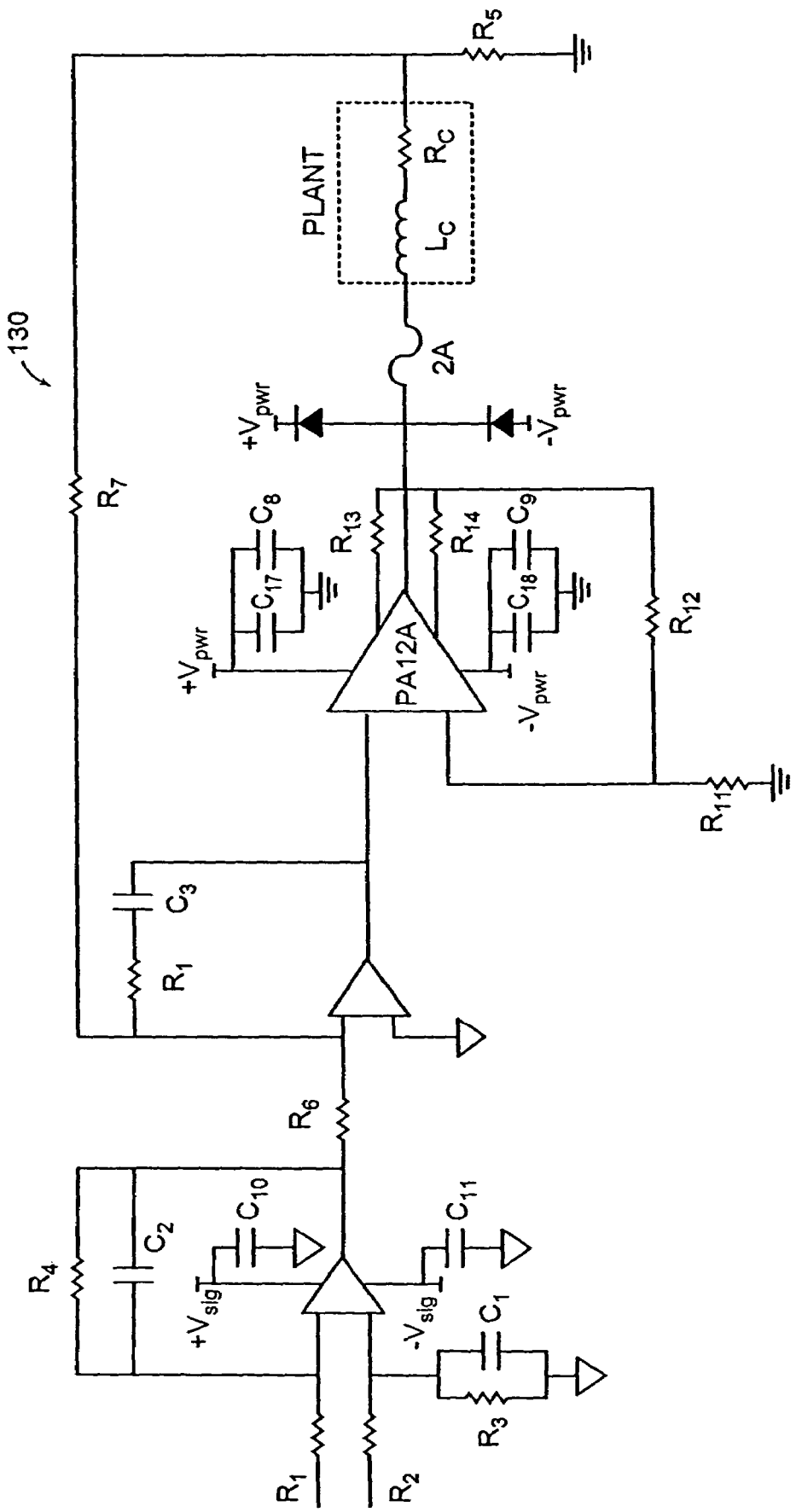
FIG. 11 is a schematic view of a current control amplifier for the actuator, the voice coil driver.

In an embodiment shown in FIG. 11, the values of the resistors and the capacitor are shown in Table 2.

TABLE 2

Current amplifier parameters

| | | | |
|---|---|---|---|
| $R_1$ | 10 kΩ | $C_1$ | 470 pF |
| $R_2$ | 10 kΩ | $C_2$ | 470 pF |
| $R_3$ | 10 kΩ | $C_3$ | 0.001 μF |
| $R_4$ | 10 kΩ | $C_8$ | 47 μF |
| $R_6$ | 47 kΩ | $C_9$ | 47 μF |
| $R_7$ | 9 kΩ | $C_{10}$ | 100 nF |
| $R_{11}$ | 10 kΩ | $C_{11}$ | 100 nF |
| $R_{12}$ | 35.5 kΩ | $C_{17}$ | 10 nF |
| $R_{13}$ | 0.3 Ω | $C_{18}$ | 10 nF |
| $R_{14}$ | 0.3 Ω | | |
| $R_{sense}$ | 1 Ω | $V_{sig}$ | ±15 V |
| $R_f$ | 270 Ω | $V_{pwr}$ | ±17 V |

It is recognized that due to slight differences in component values, there are differences in the gains of each amplifier. In a particular embodiment of the current control amplifier 130 as shown in FIG. 11, the gains measured in each of the amplifier are 0.190 A/V, 0.193 A/V, and 0.192 A/V. With components having a tolerance of ±1%, the percentage deviation in the amplifier gains is less than 1%.

It is recognized that other linear actuators can be selected. Pneumatic and hydraulic actuators allow force control via pressure control, but may have low bandwidth. Piezo actuators offer high resolution in position over short ranges of motion, but do not inherently control force. Micrometer drives can have long travel, but similarly do not allow force control. In addition, rotary actuators can be used to control some or all the axes e.g., rotary voice coil to angular degrees of freedom.

Referring back to FIGS. 9 and 10, the stamp head assembly 82 has a plurality of sensors 114. In the embodiment shown, the assembly 82 has three sensors that are mounted to the fixed shell 106 and measure the displacement of the pressure chamber 120 through the top ring 118 relative to the support plate 84.

It is preferable to sense the orientation of the substrate 58 relative to the stamp 54 prior to and during printing. Three sensors 114 are required to determine the orientation of a plane. The sensors 114 are positioned at or beyond the stamp 54 perimeter, so as to give the best angular resolution.

The sensors 114 are used in a two-step process as illustrated in FIGS. 12A-12C and FIGS. 13A-13C. By sensing the position of the stamp 54 relative to a reference, a calibration step can provide orientation data for the substrate as well. This scheme is attractive because it does not require explicit sensing of the stamp face 54. As long as the substrate 58 flatness is known to a sufficient tolerance, a single calibration for each change of stamp will provide orientation data that allows parallel planarity during approach and contact.

For simplicity of illustration, stamp head 134 is illustrated as a simplified two-dimensional version of stamp head 82 of FIG. 9; accordingly, mount 136 is coupled to a frame 138 by two springs 140 and 142 aligned along a single axis (i.e., the x-axis). One of ordinary skill would understand the principles described for a two-dimensional head 134 can be extended to a three-dimensional system (e.g., head 82). That is, the principles can be extended to allow pitch and roll of stamp mount (i.e. the pressure chamber assembly 120) to be determined.

During the calibration phase, the sensors 114 measure the position of the stamp backing relative to a reference, which is part of the stamp head that is fixed to the coarse-motion stage. In the two-dimensional representation shown in FIGS. 13A-13C, these calibration data are the x and y measurements. The orientation of the stamp is passively matched to that of a test substrate; this orientation is then recorded as the substrate orientation ($x_1$ and $y_1$ in the illustration). In subsequent stamping actions, the stamp is actively posed so that its orientation matches the recorded substrate orientation.

Figure 12A:
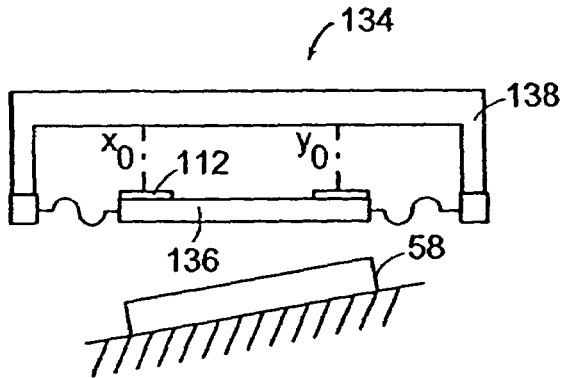
FIG. 12A-12C are schematic views of calibration.
Figure 12B:
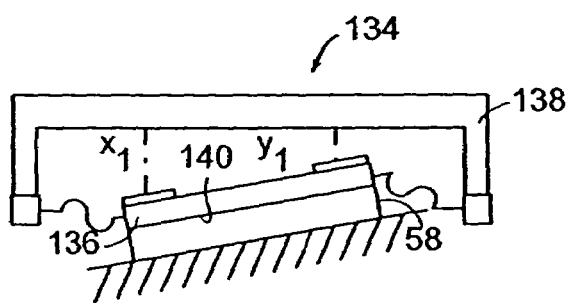

As seen in FIG. 12A, the mount 136 and a test substrate 58 are at nominal starting positions. The mount 136 is separated from the frame 138 by distances $X_o$ and $Y_o$. The mount 136 and the substrate 58 may be brought into proximity (e.g., within 500 microns of an assumed the substrate 58 position using gross positioning (e.g., using a linear stage 76 of FIG. 2). As seen in FIG. 12B, the fine actuators 112 (e.g., voice-coil actuators 112 of FIGS. 9 and 10) are energized, changing distances $X_o$ and $Y_o$, and the mount 136 move toward the substrate 58 until contact between the mount 136 and the substrate 58 is detected (e.g., force feedback from the voice coils indicates contact). The fine actuators 112 are actuated until equal force application is measured by each. A measurement of equal force indicates even stamping pressure across a stamping surface 140.

The fine actuators 112 may decrease or increase their force application, until a nominal force value is reached. This corresponds to the application of selected minimum force on the stamp surface. At the position of nominal force, readings $x_1$ and $y_1$ from position sensors (e.g., capacitive sensors 114 of FIG. 9) are collected.

In a two-dimensional system head 134, the slope of mount 136 can be obtained from $x_1$ and $y_1$. Correspondingly, in a three-dimensional system (e.g., head on the pressure chamber assembly 120 in FIG. 9), pitch and roll of the mount 136 can be obtained from the recorded data (i.e., as described above, using a minimum of three data points, pitch and roll of the mount 136 can be obtained using known means). As described with reference to FIGS. 13A-C, the recorded position data $x_1$ and $y_1$ will be used in subsequent stamping procedures to assume a nominal orientation for planar alignment of the mount 136 with a substrate 58 (i.e., the mount 136 and the substrate 58 will be made to be parallel, so that a piston movement in the direction of the z-axis will result in equal printing pressure.) At FIG. 12C, the head 134 and the substrate 58 are separated. For example, the voice coils are retracted to their 500 micron separation distance.

Calibration using a test substrate, as described above, is one method of obtaining $x_1$ and $y_1$ for subsequent printing steps. In another embodiment of the stamp head 134, pitch and roll of the mount 136 are obtained using three mechanical measurements by extending one or more measuring instruments from the mount 136 to make physical contact with a substrate, and thus obtain position data.

Figure 13A:
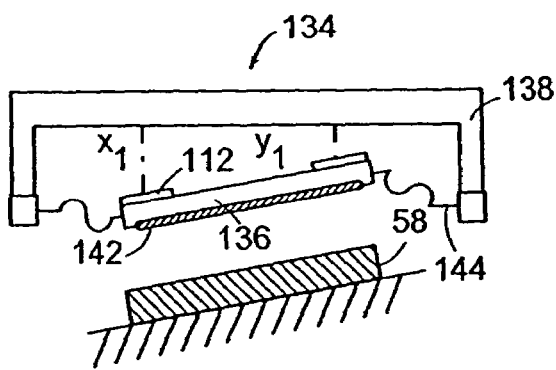
FIG. 13A-13C are schematic views of printing.
Figure 13B:
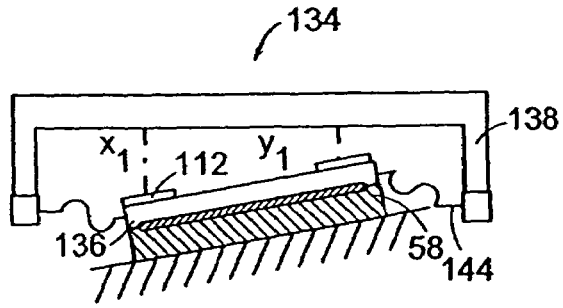
Figure 13C:
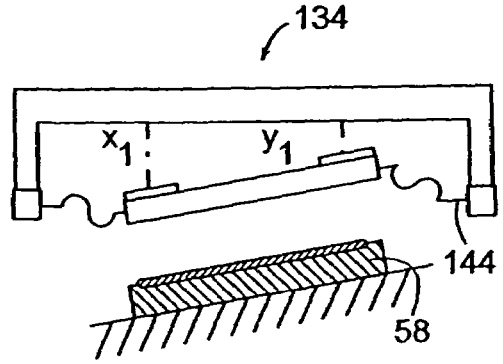

Referring to FIG. 13A, a stamp 142, wetted with ink, is mounted on the mount 136 and the stamp 142 is oriented using the position $x_1$ and $y_1$ obtained in FIG. 12B above (i.e., the mount 136 is oriented to be parallel to the substrate 58). Referring to FIG. 13B, the piston is changed until contact between the mount 136 and the substrate 58 is achieved (as determined by the voice coils 112). Subsequently, a uniform force is applied to the substrate by increasing piston of the mount 136 beyond contact. If the spring constants of springs 14 of a flexure (e.g., springs or beam members 174 in flexure 110 in FIG. 14) are known, a selected amount of force can be applied by translating the mount 136 in the direction-z (i.e., piston) beyond contact. Movement after contact will result in a change of readings $x_1'$ and $y_1'$ as measured by position sensors (e.g., capacitive sensors 114 of FIG. 9). The change of readings $x_1'$ and $y_1'$ can be used to determine the force applied by the springs 144. As seen in FIG. 13C, the head 134 and the substrate 58 are separated.

Optionally, force readings may be taken upon contact of the stamp 142 and the substrate 58, or at the point of furthest translation beyond contact. The force readings may be used to ensure equal force between the stamp 142 and the substrate 58 to be equal at all points. If the force is found to be unequal, force is corrected by activating one or more voice coils 112 to achieve equal force, and the new position values are recorded (e.g., using the capacitive sensors). The new position data $x_1'$ and $y_1'$ is used to achieve planarity at FIG. 13A. In this manner, each stamping impression provides new, updated calibration information to ensure that the mount 136 and substrate 58 are parallel. Another option is to use voice coils in a manner to achieve impedance control as a means of controlling the effective spring constant of springs 144.

In the embodiment shown, the sensor selected is capacitive sensing for several reasons. First, it is a non-contact method of proximity sensing, which ensures that there will be no contamination or deterioration due to wear. Second, there are a range of probe form factors that can integrate easily with a wide range of designs. Lastly, capacitance sensors offer straightforward interfacing with mechanical assemblies. All that is required for the probe is a flat stable mounting surface. The probe must face a flat electrically-conductive target.

Referring to FIG. 9, the sensor 114 has a capacitance probe 148 and a corresponding target 150. The capacitive probes 148 are rigidly coupled to the top ring 118. The targets 150 are flat, conductive plates rigidly coupled to an under surface of the shell ring 84.

In the embodiment shown the sensors 114, the capacitance gages are made by ADE Technologies, 77 Rowe Street, Newton, Mass. 02466. The probes are compact, and interface with an electronics module. A variety of ranges and resolutions are available; the smaller the range, the higher the available resolution. Each gage is calibrated for a specific range, and outputs a voltage that is proportional to the distance between the probe and the target. This target must be grounded to either the probe housing or the electronics chassis.

In particular, the ADE model 3800 gaging electronics with their 2810 series probes were used. The specifications for the probes are listed in Table 3.

TABLE 3

| Capacitance gage parameters | | |
| --- | --- | --- |
| Range (±μ) | 250 | 1000 |
| Standoff (μm) | 500 | 2000 |
| Resolution (nm) | 3 | 40 |
| Output signal range (V) | ±10 | ±10 |

The probes themselves have the favorable quality of being bottom-mounted rather than barrel-mounted. For the stamp held assembly 82 of this embodiment, this is ideal: the probes can be bolted directly to a flat surface, the top ring 118, without requiring any special adapters. The 20 mm diameter probes 118 require a target area that is at least 20% larger. 1.25-inch diameter aluminum targets 150 were mounted to the shell ring 102 opposite the probes 118.

Figure 13D:
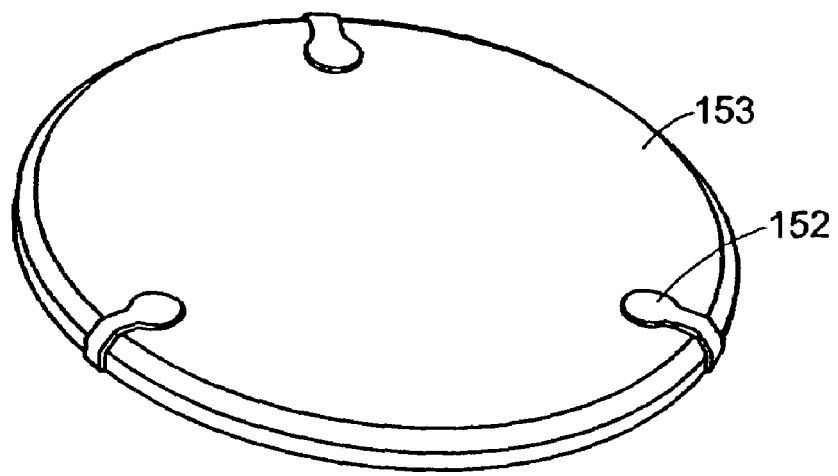
FIG. 13D is a perspective view of a thin-film stamp mounted capacitance gages.

It is recognized that there are alternative embodiments for the sensors 114. For example, a plurality of capacitance sensing probes 152 mated to the stamp face 153 to detect the substrate is shown in FIG. 13D. Thin-film capacitance probes 152 can either be molded into the stamp, or painted on, or bonded to the stamp face 153 after stamp fabrication. Capacitance probes must be oriented as near to parallel to the sensing target as possible to take into account the important effect of stamp compliance on performance.

Since the substrate 58 is the same size as the stamp 54, placing sensors about the perimeter of the stamp and orienting them towards the substrate is an option, but does not provide information about the location of the stamp face. Metrology across the stamp face may also be an option, using techniques like white-light interferometry or ellipsometry to assess flatness.

Another solution is to use more than three sensors. A six-sensor setup can be used, with three sensors to detect the stamp orientation relative to a fixed reference, and the other three to detect the substrate orientation to the same reference.

The use of CCD cameras for sensing the relative positions of substrate and stamp is another possibility. Features on the substrate can be imaged through the stamp, and the proximity gaged as a function of the feature size. Features on the stamp can also be simultaneously imaged, and the ratio of feature sizes can give accurate orientation data.

Figure 13E:
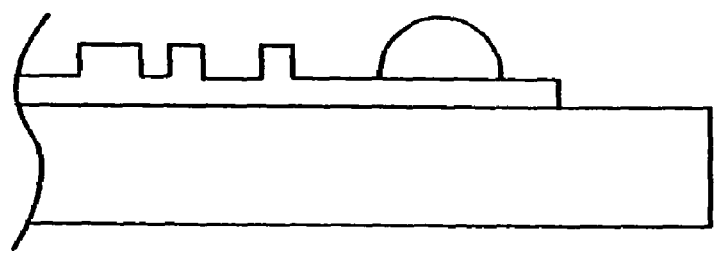
FIG. 13E is a view of Hertzian contact sensing scheme.
Figure 13F:
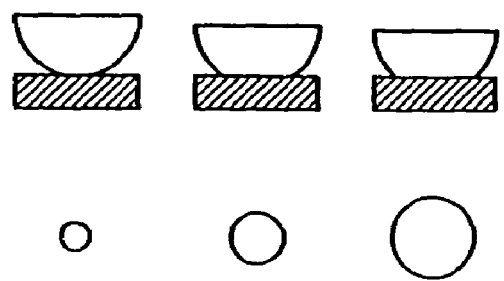
FIG. 13F is a view of several Hertzian contact sensing schemes.

Alternatively, hemispherical features molded in to the stamp face could be used to detect contact, and the spreading rings caused by Hertzian contact can enable force sensing. This concept is shown in FIG. 13E and FIG. 13F. FIG. 13E shows a cross-section of the edge of a rigidly backed stamp. The hemispherical feature must protrude beyond the patterning features, so that orientation may be detected prior to patterning contact. FIG. 13F illustrates the contact pattern that is visible at increasing Hertizain deflections: as the contact pressure increases, the radius of the contact zone increases. This can be a non-linear relation, and a look-up table can be used to correlate pressure to radius.

Another alternative for sensing is laser interferometric techniques for gap sensing. Grazing incidence can be used in conjunction with position-sensing detectors (PSDs) to determine the separation between the reflective surfaces of the stamp and the substrate. This is similar to the autofocus system used in photolightographic steppers. This method can provide an elegant solution; and is also sensitive to the properties of the target surface.

Figure 14:
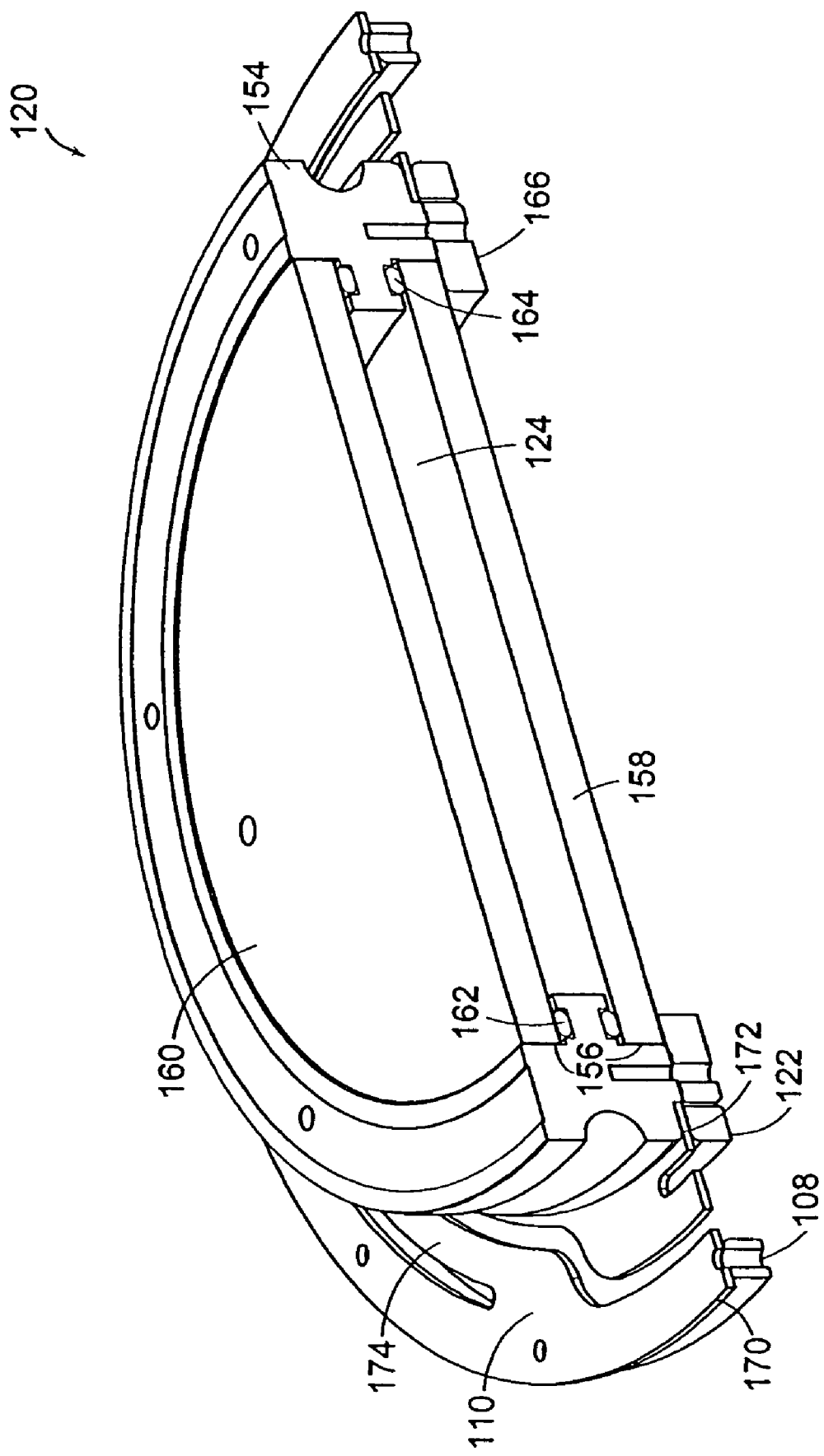
FIG. 14 is a sectional view of the pressure chamber assembly.

Referring to FIG. 14, the pressure chamber assembly 120 of the stamp head assembly 82 serves several functions including fixturing the stamp backing in a repeatable fashion; containing mounting holes for the flexure as well as for the voice coils 112 and capacitance probes 114 and containing the mechanisms for contact patch control. The pressure chamber assembly 120 is shown as part of the stamp head assembly 82.

The pressure chamber assembly 120 has an annular ring 154, also referred to as a cylinder, with a pair of annular grooves 156 to receive a stamp backing 158 and a window 160. The cylinder 154 has a pair of O-ring grooves that each receive an O-ring 162, 164 for sealing the window 160 to the cylinder 154 with the top ring 118, as seen in FIG. 9, and sealing the stamp backing 158 with a retaining ring 166, as seen in FIG. 14, respectively. The cylinder 154, the stamp backing 158 and the window 160 define a chamber 124.

The window 160 has a pair of holes 168 and 170, as seen in FIG. 10. A fitting is mounted in each hole 168 and 170. The fittings are connected to the pressure sources and to a pressure sensor.

In a preferred embodiment, the cylinder is aluminum. The window 160 is a clear polycarbonate window. The fittings are 10-32 barbed fittings.

For actuating the pressure chamber, regulated line air is used. Two solenoid valves are located downstream of the regulator; these allow gas to fill the chamber as well as provide for exhaust. The solenoid valves are controlled with a command signal and are amenable to computer control.

It is recognized that there are alternative embodiments for the pressure chamber head such as a micrometer actuator, a voice coil, or a piezo element located centrally on the backside of the stamp backing. Actuation of these elements can cause the stamp backing to deflect, creating a minimum point. This point can be used to initiate contact, and the actuation force gradually reduced as the head is advanced. Servo control makes it possible to have constant pressure, which is important for high-fidelity pattern reproduction.

A drawback of using an actuator of this type is that its central location on the stamp backing can obscure the operator's or imaging sensor's view of the stamping process in real time.

It is also recognized that the pneumatically actuated device can be a clear bladder, placed on top of the stamp backing and held in place with a frame or another window, which allows viewing and central actuation simultaneously.

One of the difficulties that can occur when stamping on a flat substrate with a rigidly-backed stamp is that air bubbles can be trapped between the stamp and substrate, causing voids and defective patterning.

The use of a propagating contact front as described eliminates the problem. As the contact progresses between the stamp 54 and substrate 58, air is effectively pushed outward and away, so that it does not become trapped as illustrated in FIGS. 15A-15C.

FIG. 15A shows a semi-rigid disc, i.e., the stamp 54 and the stamp backing 158 is brought into proximity to the substrate 58. FIG. 15B shows the stamp backing 158 deflected to form a point contact 164 at the point of maximum deflection. The stamp backing 158 is deflected to a lesser degree in FIG. 15C than that of FIG. 15B, and the stamp backing 158 is translated in the negative z-direction.

In that the stamp 54 and the stamp backing 158 are circular, the appropriate scheme is the use of a radially propagating contact form. By pressurizing the backside of the stamp backing 158, the backing 158 can be caused to deform spherically. This will result in a single point 169 that is the minimum (the point of maximum deflection on the stamp face 54). If this point is brought into contact with the substrate, the contact forces are small. However, adhesion forces come into play to draw the stamp 54 into conformal contact with the substrate. The stamp will therefore contact radially if allowed to do so.

However, the stamp 54 is a rigidly-backed stamp, as described in further detail below. In order to allow the stamp contact front to advance radially, it is preferable to reduce the pressure that is causing the deflection in concert with advancing the position of the stamp head. This is accomplished by very precise control of the force. The position is advanced proportionally to the reduction in deflection, thereby allowing the contact front to propagate.

As part of printing included with the sensing and actuation elements mated to the stamp backing, another important component is a bearing system to guide the motion of the stamp. Three degrees of freedom are constrained while the other three degrees of freedom are permitted. Two degrees of rotation, about two orthogonal axes in the plane of the stamp are preferably free (pitch and roll), as is one linear degree along the axis normal to the stamp face (vertical). These degrees of freedom are shown in FIG. 3. Lateral translation in the plane of the stamp 54 must be constrained, along with rotation about the vertical axis.

The flexure 110 of the stamp head assembly 82 is best seen in FIG. 16A. The flexure 110 has a pair of concentric circles 171 and 172 and a plurality of beam members 174. For small ranges of motion where a high degree of repeatability is required, flexures are an excellent choice. By applying a force to deform a structure without leaving the elastic regime, relaxation of the force will permit the structure to return to its original state. This process can be repeated for many cycles, without any degradation of performance if the flexure is properly designed.

The size of the flexure 110 is driven by two factors. The internal diameter is governed by the size of the stamp backing, which in turn controls the size of the pressure chamber to which the stamp backing is fixtured. In the embodiment shown, the stamp backing is held in place by a ring that is 5.75 inches in diameter, so this is the smallest that the flexure's inner diameter can be. The outer diameter of the flexure is limited by the size of the fixed shell component, which provides the structural housing for the stamp head. The outer diameter of the flexure 110 is therefore set to be 8 inches.

The flexure 110 was formed of stainless steel in a preferred embodiment. Since the area to work with between the pressure chamber 120 and the fixed shell 106 is small, a compact design was used. A simple beam-flexure design, in which the beams are oriented so that their length is concentric to the diameter, achieves this goal. The governing equation for a single beam is $$L = \sqrt[3]{\frac{12EI\delta}{W}} \quad (4)$$

where L is the beam length, E is Young's modulus, W is the load, δ is the deflection, and $$I = \frac{bh^3}{12} \quad (5)$$

where b is the width of the beam and h is the thickness.

Figure 16B:
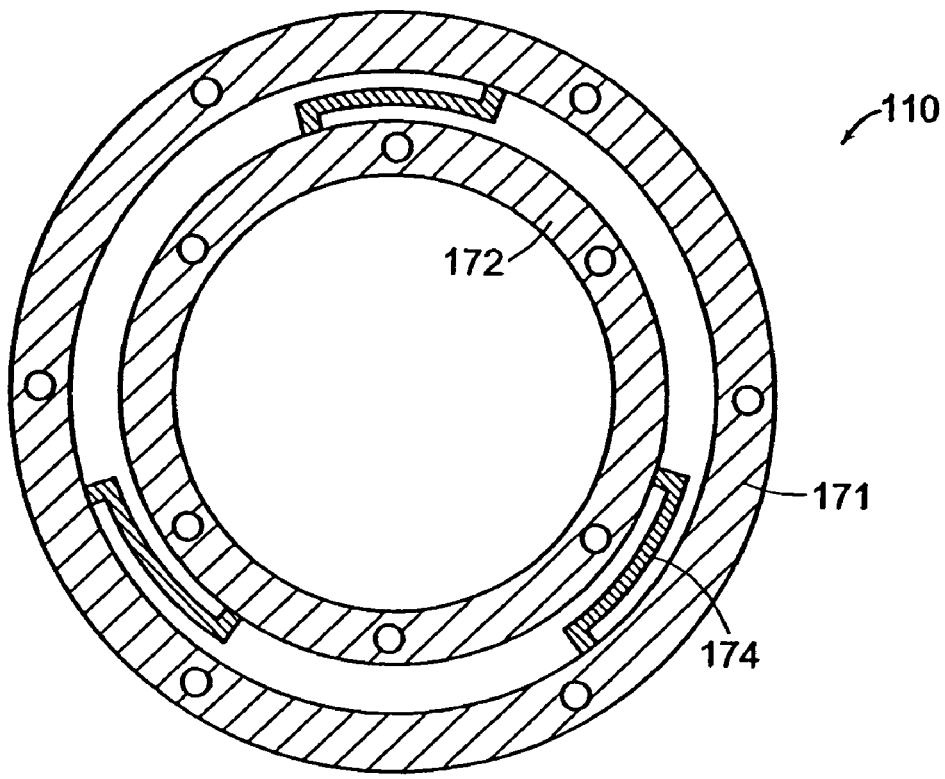
FIG. 16B is a top view of an alternative flexure.
Figure 16C:
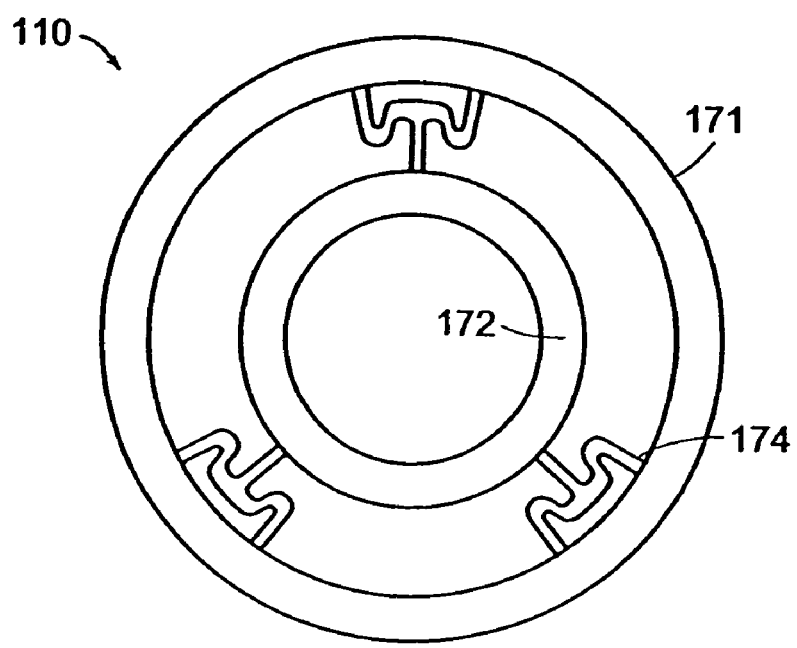
FIG. 16C is a top view of another alternative flexure.

Using these equations as a basis for the design, several different configurations were modeled. Three beams are sufficient for providing three degrees of freedom. FIGS. 16B and 16C show two alternative flexures 110 with three beams. However, using just three beams requires tight manufacturing tolerances to ensure uniformity and symmetry.

The beam length in a six-beam configuration is still short enough to allow enough machining access and is the embodiment shown in FIG. 16A. The error-averaging effect of having additional beams relaxes the machining tolerances.

A key criterion in the design of a flat spring is that the deflection range must be much less than the yield stress of the material. This is important to ensure repeatable performance. Typically a range of 10 to 30% of yield stress is the design target. The stress is greatest at the beam end:

$$\sigma = \frac{WL}{2S} \quad (6)$$

in which S is the section modulus:

$$S = \frac{bh^2}{6} \quad (7)$$

Using this stress value, the percentage of yield stress for the material may be calculated.

In the embodiment shown, six beams 174 are each 43 mm long, 6.35 mm wide, with a material thickness of 1.2 mm. The maximum stress at a 500 micron deflection is about 12% of yield, which is well within the acceptable range.

The use of a circumferentially oriented beam layout results in a small amount of parasitic rotational motion about the out-of-plane axis. The flexure could be designed to eliminate this, but due to the space constraint, wider beams were selected in this embodiment instead, for robustness and ease of manufacture. Through a 500 micron range of travel, a maximum tangential deflection of about 7 microns is present. In a practical application, this error is systematic, and can be corrected. The spring constant of the flexure is about 5 N/mm at each leaf, or 30 N/mm total.

Figure 17:
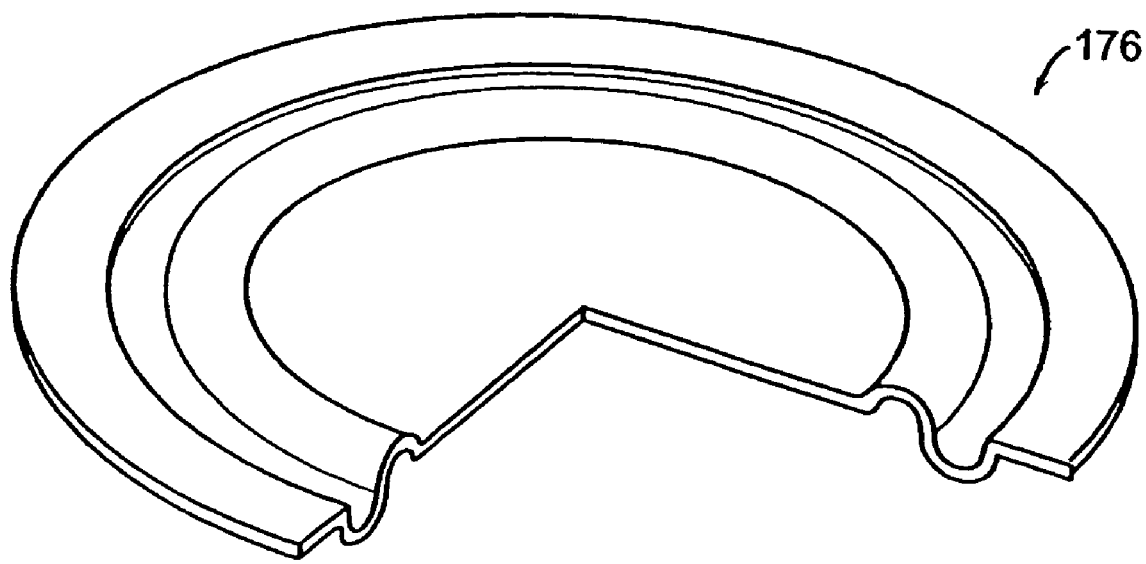
FIG. 17 is a top perspective with a section broken away of a rolled diaphragm flexure as an alternative to the flexure of FIG. 16.

It is recognized that there are several other flexural design concepts with this capability that can be used in these inventions. One is a rolled-diaphragm configuration 126, a sectional view of which is shown in FIG. 17. This is similar to the mechanism found in speaker cones. Three degrees of freedom are permitted, while the other three are highly constrained.

In this design, there are two flat annuli of different diameters that are joined by a curved annulus. Lateral motion is restricted, while the inner annulus is free to rotate in two degrees of freedom as well as translate in one degree with respect to the outer annulus. The rolled diaphragm 126 design has the added benefit of being a continuous structure: its use in the stamp head would serve to isolate the interior of the stamp head from the substrate.

Figure 18:
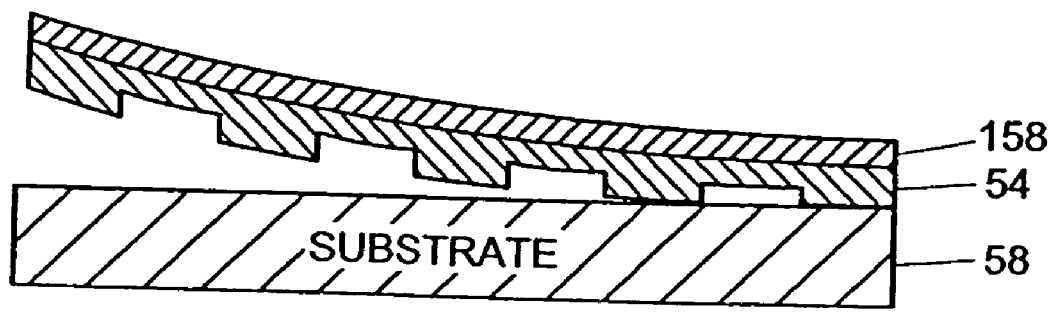
FIG. 18 is a sectional view of a stamp with a flexible stamp back.

Referring to FIG. 18, the stamp 54 is carried by the stamp backing 158. The stamp backing 158 is part of the pressure chamber 120 as discussed hereinbefore.

The stamp backing 158 must meet several stringent requirements. The backing provides the rigid reference upon which all controlled actuation and metrology is dependent. As part of the quality control process as discussed below, it is also advantageous to choose a backing material that allows the viewing of the stamping process as it is taking place.

The main requirement of the stamp backing 158 is to preserve the lateral dimensions of the stamp 54. Since the stamp 54 is elastomeric, it has very low stiffness, both in-plane and normal to the plane of the pattern. While it is necessary to have some compliance normal to the plane of the pattern, it is also important to limit the in-plane distortion.

Figure 19A:
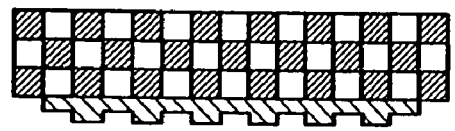
FIGS. 19A-19C illustrate the effects of thermal characteristics on the shape of the stamp.
Figure 19B:
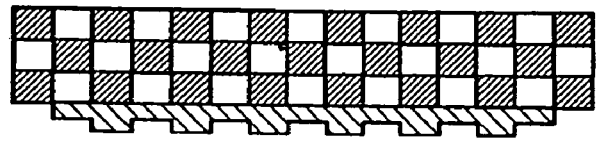
Figure 19C:
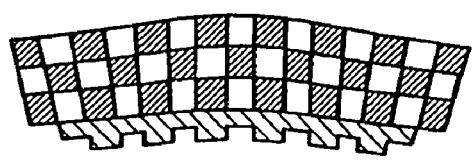

In the embodiment described, the stamp backing 158 is a rigid backing material with a thin stamp 54. The stamp backing 158 is of a backing material that has a low coefficient of thermal expansion (CTE). This ensures that the dimensional stability of the stamp 54 is maintained despite fluctuations in temperature. Similarly, material for the stamp backing is desirably selected to have a high thermal conductivity. By doing so, distortions are reduced that may arise due to thermal gradients within the bulk of the backing material. FIGS. 19A-19C illustrate the effects of thermal characteristics on the shape of the stamp. FIG. 19A shows a low CTE and high thermal conductivity. FIG. 19B shows a high CTE and FIG. 19C shows a low thermal conductivity.

Since the elastomer of the stamp 54 itself can have a high coefficient of thermal expansion, bonding the back of the stamp 54 to a low CTE material imposes a geometric constraint. Because the stamp 54 is thin, its expansion is governed to a large degree by the backing material, which is significantly stiffer. This feature of the stamp backing 158 allows the treating of the expansion of the stamp 54 as a function of the expansion of the backing, and by choosing a low CTE material, this expansion can be accounted for in modeling.

The stamp backing material also has to have enough stiffness and strength to withstand the pressure of stamping. The forces involved are small enough so that most materials meet this mechanical requirement including the borosilicate glass in the preferred embodiment. The same goes for stiffness in the plane of the stamp: since the in-plane forces are small enough to be considered negligible, virtually any rigid material satisfies the mechanical requirements.

The fixturing strategy, for both the stamp molding step, as described below, and the stamping process itself, makes it possible to relax the requirement of parallelism for the two faces of the stamp backing 158, since the front surface of the backing material 158 is used as the reference. Furthermore, the nature of microcontact printing according to the invention also permits us to relax the flatness and surface finish requirement as well. This is because it is the stamp 54 face that will bear the patterned features, and only this surface will contact the substrate 58. The stamp backing 158 surface will serve only as a support structure. The only need to maintain a reasonable flatness tolerance is to ensure that the thickness of the stamp is uniform, for both features and recesses. An optical-quality surface finish is sufficient to satisfy the need to view the stamping and molding processes for quality control as discussed below.

The ability to integrally bond the stamp 54 to the backing 158 is another useful characteristic. It is advantageous to choose a stamp backing 158 that can be chemically bonded to the stamp, preferably during the molding process as described below. This attribute simplifies assembly and handling, as it eliminates an additional bonding step, as well as the possible distortion that may occur. There are a range of materials that are suitable for chemically bonding to the elastomeric stamp polymer 54.

In a preferred embodiment, the stamp backing 158 is borosilicate glass such as sold under the trade name Pyrex®. The relevant properties are listed in Table 4.

TABLE 4

| Borosilicate parameters | |
| --- | --- |
| Coefficient of Thermal Expansion | 4 ppm/° C. |
| Thermal Conductivity | 1.1 W/° C. |
| Modulus of Elasticity | 60 GPa |
| Fracture Toughness | 0.77 MPa = $m^{1/2}$ |
| Diameter | 5.00 in. |
| Thickness | 0.25 in. |

Borosilicate glass is an economical choice. The nature of the master generation and stamp generation processes make it possible to reuse substrates as well, if desired. Its thermal parameters make its temperature-based stability slightly better than that of glass (though not nearly as good as Zerodur as described below), and it is therefore a good compromise in light of its cost-to-performance ratio.

It is recognized that the stamp backing 158 can be formed from other materials than the borosilicate glass. A preferred material with respect to thermal properties is one like Zerodur™ marketed by Schott Corporation, 3 Odell Plaza, Yonkers, N.Y. 10701. This is a specially formulated low-CTE glass, which is often used in making low expansion parts like lenses and mirrors. This material has the most favorable thermal properties found in a transparent material. Its coefficient of thermal expansion is just 0.05 ppm/° C., and its thermal conductivity is 1.64 w/m-K.

Another material that has favorable thermal attributes is fused silica. This is another specialty material that is often used for optical components that require low thermal expansion. Its coefficient of thermal expansion is about 0.5 ppm/° C., but its cost is significantly less than that of Zerodur. However, the per-part cost is still high.

The stamp backing 158 is circular for several reasons. First, a round backing is appropriate for use with a round stamp. Second, a circular form factor is the standard in the integrated circuit manufacturing industry, and opting for this standard makes it possible to make use of widely used handling equipment. Additionally, a round stamp backing allows for ease of mounting and minimization of stress concentrations. The circular shape is also a good choice for the molding process, which makes use of pressurized gasses and fluids. This shape minimizes stress concentrations during pressurization. A round shape also ensures compatibility with the stamp master.

The stamp 54 must be fixtured so that it is not subjected to any undesirable forces. Additionally, since stamps 54 need to be changed to print different patterns, the stamp fixturing method must provide for the removal and refixturing of the stamp. Furthermore, it is advantageous to accurately register the position of the stamp relative to the rest of the system. For this reason, a stiff coupling is required between the stamp and its actuating and sensing elements.

A rigid stamp backing 158 is a way to address these requirements. If the stamp is reliably bonded to the backing, the front, edges, and back side of the stamp backing can be used as reference surfaces. Ideally, the front surface of the stamp backing 158 is used as the reference, so as to reduce any flatness and parallelism requirements on the backing 158 itself. Using the front surface as the reference ensures that any uncertainty of the position of the stamp face is due to the stamp alone. This allows in the manufacturing process to focus on optimizing parallelism between the front faces of the stamp and the front of the backing, rather than these in addition to the back or side of the backing.

The preferred method of fixturing an object is with a kinematic coupling. By this means, the six degrees of freedom are constrained at six discrete points. For example, three ball-and-groove couplings spaced in a triangular configuration can be used to define a position in six degrees of freedom, with repeatability. The system herein provides for printing of features of less than 100 microns and preferably less than 20 microns. When coupled with the capability of printing on large surfaces from under 1 $cm^2$, to 25 $cm^2$ to 100 $cm^2$ and over provides for applications in optics such as printing of lenses, gratings, diffractive optical elements or patterns for large area liquid crystal displays.

The practical application of such a kinematic coupling scheme requires consideration of issues such as stresses and deflection. Non-ideal materials will experience deflection at their points of contact, resulting in diminished performance. Typically, hard materials are used for the coupling components: sapphire and steel are common choices. However, in that the stamp backing 158 is glass for a variety of reasons described above and below, and that glass has a low yield stress, and is prone to brittle fracture, pure kinematic coupling would therefore involve stresses that could potentially damage the stamp backing 158. Additionally, a kinematic coupling could allow deflections in unsupported areas.

Figure 20:
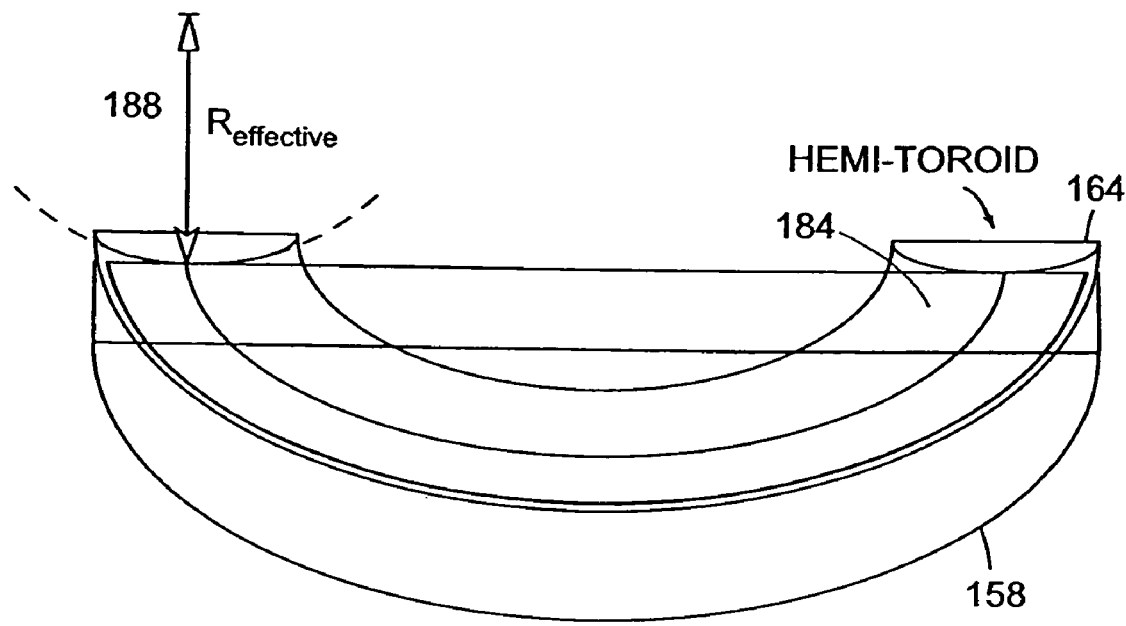
FIG. 20 illustrates a stamp mounting using a hemi-tororidal coupling.

In order to minimize the localized stress while still ensuring repeatable fixturing of stamps, a mounting system using a quasi-kinematic toroidal coupling is used. A schematic representation of this mechanism is shown in FIG. 20. While in theory, this method allows a single circular line of contact, in reality, the contact zone is a ring, where the thickness is a function of the coupling force, the geometry of the toroid, and the materials used for the stamp backing 158 and the toroidal surface.

By referencing the stamp position from the front face of the stamp backing 158, and preloading from the backside, a stiff, repeatable coupling can be achieved. The preloading is provided by an elastomeric O-ring 164 as seen in FIG. 14, which has the dual function of giving a distributed load and creating an air-tight seal, which is required for the pressurization of the chamber 124 of the pressure chamber 120. The O-ring 164 is designed to have the same diameter as the diameter of the hemitoroid's contact line 184; this ensures that the line of force on the stamp backing is normal to the plane of its face. If the diameter is larger or smaller, moments are applied to the stamp backing that will deform it.

The toroidal shape of the bearing surface is also important for the operation of the pressure chamber. With the application of pressure at the backside of the stamp backing 158, this glass disc will bow. If the disc is fixtured at its perimeter on a flat surface, the stress concentrations at the inner corner of the ring will be very high. It is likely that the glass will yield at a low pressure, long before useful deflection is possible. The toroidal shape allows the stamp backing to bow without causing these extreme stresses.

Material selection is important in the design of this kind of coupling, especially when a material such as glass is used. The pressurization of the glass on the backside causes high forces at the interface of the glass and the contact ring. The effective radius 188 of the ring and the stiffness of the ring material are the key parameters that impact the stresses at the interface. In a preferred embodiment, the ring is aluminum with an effective toroidal minor radius $R_{effective}$ of two inches.

In a preferred embodiment, aluminum was selected as the material that was used for most of the stamp head assembly 82, including the large components of the shell ring 102 and the fixed shell 106. Aluminum was selected for several reasons including that it is easy to machine, most machine shops are set up to handle this material, the material is accessible and economical, and can be obtained in a wide range of alloys, shapes, and sizes.

In addition, aluminum is lightweight, which is an important characteristic: the stamp head can be mounted to the linear stage. This minimizes the payload of the linear stage, in order to raise the crossover frequency and therefore improve performance. It is also for lightening the weight on the stage that holes were added to the small angle bracket 74 that connects the stage to the stamp bead assembly 82, as seen in FIG. 2.

In addition, in the preferred embodiment, the aluminum had a finishing step such as anodizing to create a hard surface layer, which minimizes scratching and marring. This is important for microfabrication applications because it is important to minimize particulate generation: even microscopic particles can drastically reduce yield rates of microfabricated structures and patterns.

There is a tradeoff between maximizing stiffness and minimizing weight once a material has been chosen. In several of the stamp head components, weight was reduced in parts by thinning sections. For example, the fixed shell 106, the outer support structure of the stamp head assembly 82, is only 0.25 inches thick. It is, however, sufficiently stiff due to its tubular geometry. A lightening cut is also included on the pressure chamber. This unit has a dual reason for minimal weight: not only is it borne by the linear stage, but it is part of the moving mass driven by the voice coils.

The pressure chamber weight is further minimized through the use of a polycarbonate window rather than a glass one. Also, the current coil components of the voice coil actuators 112, instead of the heavier magnetic field parts, are mounted to the head, again for weight considerations.

In one embodiment, because of space limitations, 4-40 bolts are used for much of the assembly of the stamp head components. To make up for the small bolt sizes, twelve-bolt patterns were used for fixing the fixed shell in place, for attaching the flexure to the shell and to the pressure chamber, and for clamping the stamp backing into place.

The flexure is clamped to the fixed shell and to the pressure chamber with the aid of stiffening rings. Since the flexure is only 1.2 mm thick, bolting directly against the flexure can result in some out-of-plane bending in areas between bolts. A thicker-sectioned ring of aluminum is used to make the clamping force uniform for both the inner and outer bolt patterns of the flexure.

Radii are added at the inner edge of the fixed shell, the outer edge of the pressure chamber, and on the stiffening rings where the flexure will deflect. This minimizes stress concentrations at the flexure's bending zones, which can potentially lead to fretting, fatigue, and eventually part failure.

The control of the microcontact printing unit 40 is one of the enabling elements in achieving high performance and repeatability. The automation of the stamping process along with other elements disclosed expands the application of microcontact printing.

Figure 21:
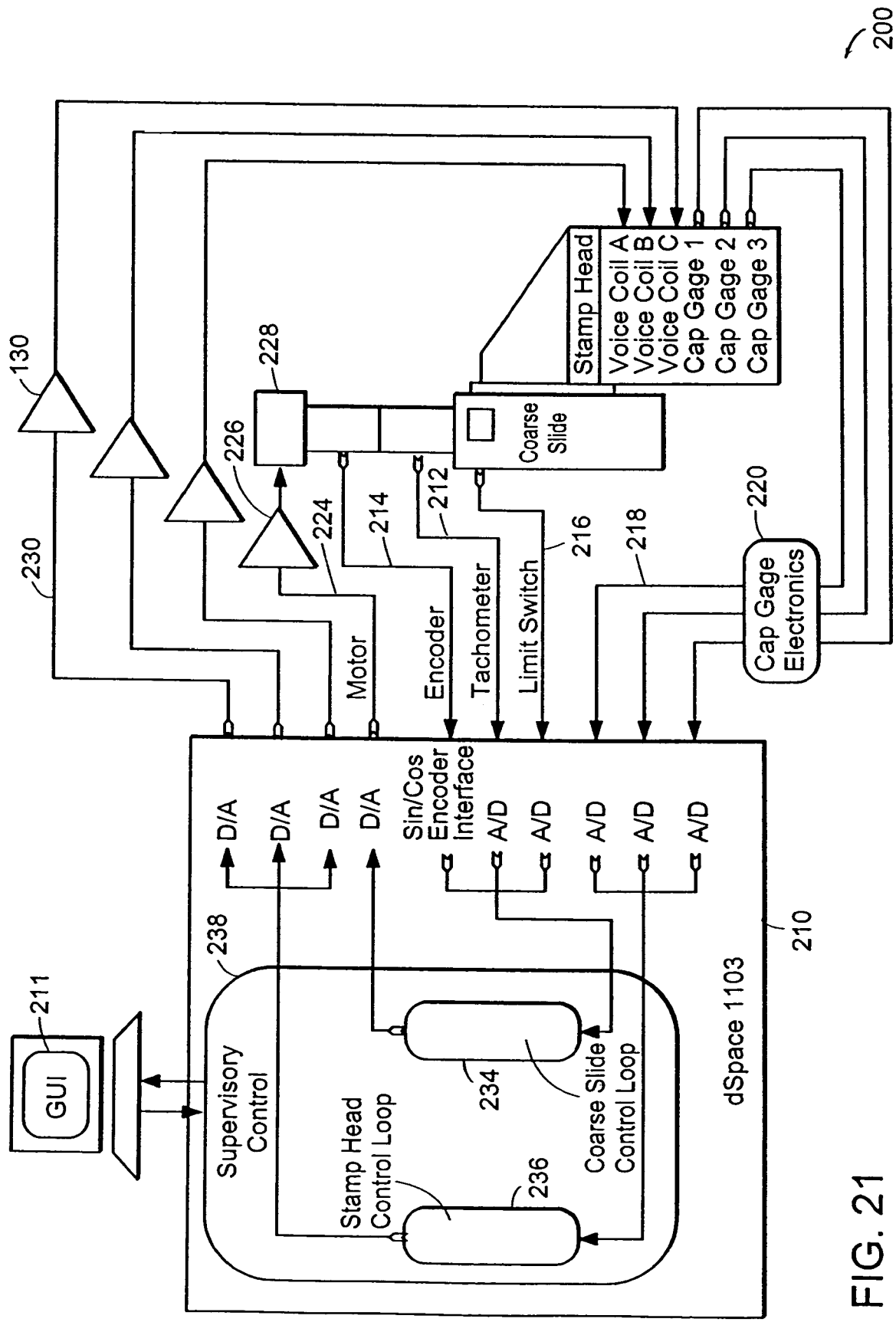
FIG. 21 is a schematic of the control system for the microcontact printing unit.

The microcontact printing unit 40 has a control system 200 as illustrated in FIG. 21. The control system 200, ensures sufficient metrology and sensing capability so that real-time monitoring of the stamping occurs. The system also automates those elements possible to give greater accuracy and finer control than was previously possible. The system 200 allows the ability to modify printing parameters such as contact pressure and print rate as necessary and monitor the effects.

The control system 200 has a plurality of main subsystems, each of which has its own specific control requirements. These subsystems include a coarse slide control loop 234 and a stamp head control loop 236. The system 200 has a controller board 210. The controller board 210 handles the analog-to-digital (A/D) and digital-to-analog (D/A) conversions, and runs the control software. The controller board 210 can have a model loaded onto the board and parameters can be viewed and manipulated in real-time. A graphical-user interface (GUI) 211 plots signal traces and provides numeric and switch inputs to the control system.

A plurality of signals is fed into the controller board 210 including the feedbacks from the coarse motion slide and from the sensors in the stamp head as represented by 212, 214, 216, and 218. From the coarse slide, tachometer and encoder feedbacks 212 and 214 are returned, giving velocity and position information about the slide. The feedback 216 from a limit switch, mounted on the slide, is used to home the stage. The stamp head 82 returns feedback 218 from the three capacitance gage outputs, which gives position data for the stamp. These signals are conditioned by dedicated capacitance gage electronics 220 prior to their connection to the controller board 210.

The output signals from the control software are converted to analog signals by the controller board 210 and are then amplified to drive the system. The motor command signal 224 is amplified by an amplifier 226 and then reaches a motor 228. Each of the voice coil command signals 230 are amplified by a current-control amplifier 130, described above, with respect to FIG. 11, before it is connected to the stamp head 82.

In a preferred embodiment, the amplifier 226 is a Kepco amplifier model bop50-4m, from Kepco, Inc., 131-138 Sanford Ave., Flushing, N.Y. 11352.

The controller board 210 has a pair of control loops 234 and 236. One of the control loops, the coarse side control loop 234, is for the motor control and contains the velocity and position feedback loops, with optimized gains for each. The other control loop, the stamp head control loop 236, includes coordinate transformation matrices, which translate the sensor inputs and command outputs into the same reference frame.

Overseeing the operation of these two inner control loops 234 and 236 is a supervisory control program 238. This loop 238 permits the machine operator to modify process parameters for stamping. Furthermore, it provides for the collection of process data.

Figure 22A:
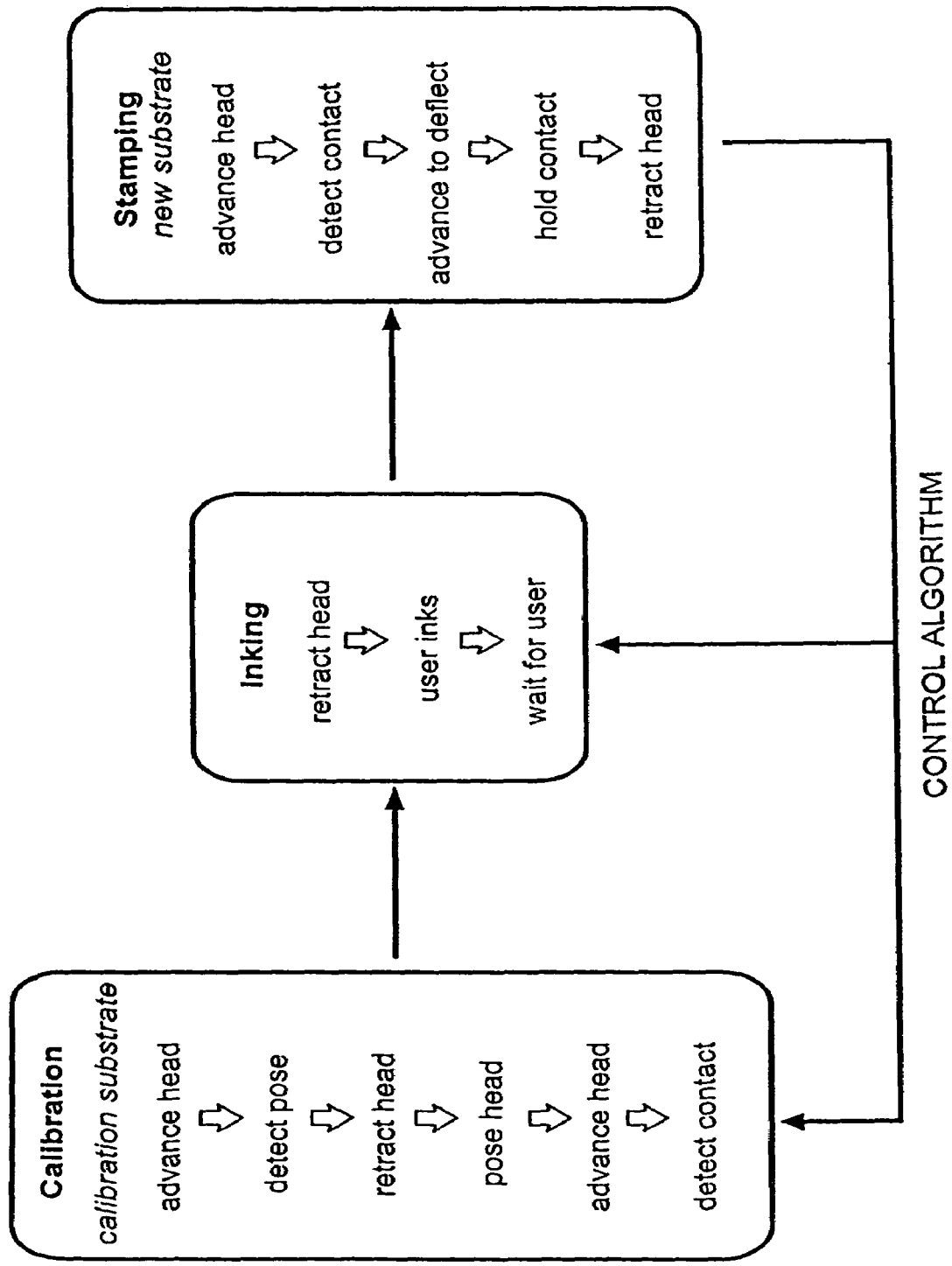
FIG. 22A is a schematic of a control algorithm.

The strategy for controlling the application of pressure in a uniform fashion across the entire substrate 58 can make use of both force and position control modes as discussed in other portions of the specification. FIG. 22A illustrates a schematic of the control software that is used to calibrate the stamp 54 to the substrate 58, and to control the stamping motion.

The machine topology allows flexibility in alignment and pressure control to change the effect on impression quality. A number of modes of operation exist by which either or both of these parameters can be controlled in different ways. For example, by adding a position feedback component, the effective stiffness of the stamp head can be increased or decreased.

Figure 22B:
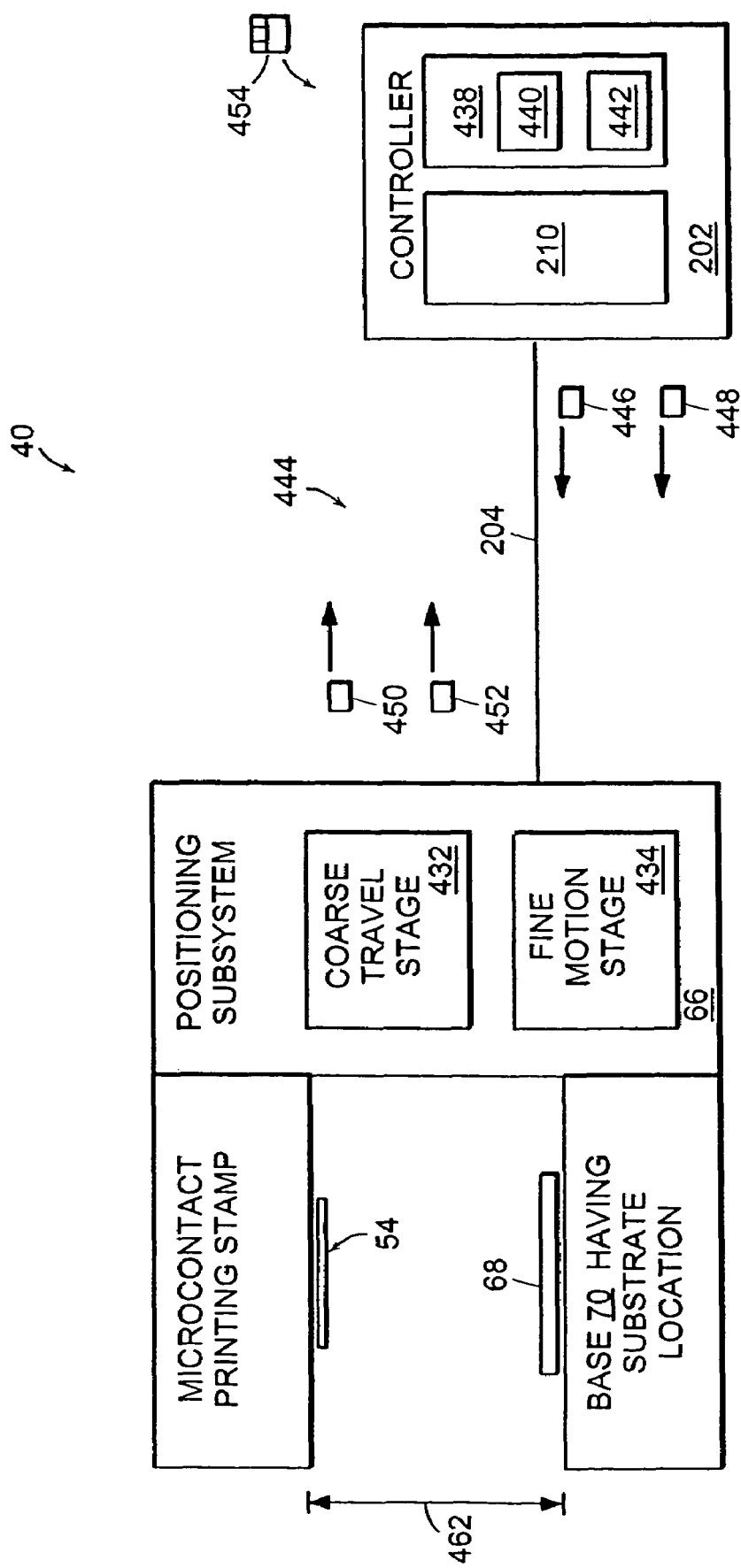
FIG. 22B is a block diagram of the microcontact printing system.

FIG. 22B shows the microcontact printing tool 40 which is suitable for use by the invention. The microcontact printing tool 40 includes the surface plate 70 that holds the vacuum chuck or other retainer such as electrostatic, magnetic or mechanical positioning subsystem in a printing unit 66, the controller 202 and a connection medium 204 that enables the controller 202 and the positioning subsystem 66 to communicate with each other. The surface plate 70 has a plurality of clamps 96 as seen in FIG. 4. The positioning subsystem 66 includes a coarse travel stage 432 and a fine motion stage 434. The controller 202 (e.g., a computer) includes the controller board 210 and memory 438 (e.g., volatile semiconductor memory, nonvolatile magnetic memory, combinations thereof, etc.). The memory 438 stores actuation data 440 (e.g., microcontact printing stamp positions and force parameters) as well as other data 442 (e.g., resonance compensation data, default contact force and time settings, etc.).

The controller 202 operates as a means for electronically controlling the positioning subsystem 66 with reliability and consistency. To this end, the controller 202 is configured to exchange signals 444 with the positioning subsystem 66. The signals 444 include, by way of example only, a set of calibration signals 446, a set of actuation signals 448, a set of force feedback signals 450 and a set of position feedback signals 452. These signals 444 travel through the connection medium 204 interconnected between the positioning subsystem 66 and the controller 202. The use of the signals 444 enables the controller 202 to electronically control particular operating parameters of the positioning subsystem 66 with accuracy and precision. In one arrangement, the controller 202 simply provides the set of actuation signals 448 to the positioning subsystem 66 without feedback in order to perform a microcontact printing operation. In another arrangement, the controller 202 provides the set of actuation signals 448 while simultaneously receiving the set of force feedback signals 450 and the set of position feedback signals 452 thus enabling the controller 202 to make adjustments (e.g., slight changes to a voltage or a current) to the actuation signals 448 based on the feedback signals 450 and 452 for real-time control over the microcontact printing operation.

In one arrangement, the control circuit 436 is a processor (e.g., a microprocessor, a microcontroller, a set of field programmable gate array devices, a set of application specific integrated circuits, combinations thereof, etc.) which runs (e.g., executes, interprets, translates, etc.) instructions from a software application. In this arrangement, the software application is preferably stored in the memory 438 after being installed from a computer program product 454 (e.g., a set of CD-ROMs, a set of diskettes, a set of tapes, a network download, etc.).

During operation, the control circuit 436 (e.g., a processor running in accordance with a software application) initially performs a calibration operation. To this end, the control circuit 436 sends the set of calibration signals 46 to the positioning subsystem 66 and simultaneously senses the set of force feedback signals 450 and the set of position feedback signals 452. The controller board 210 analyzes information within the set of force feedback signals 450 and the set of position feedback signals 452 and generates the actuation data 440 based on such analysis.

The controller board 210 reads the actuation data 440 and the other data 442 from the memory 438, and generates the set of actuation signals 448 based on the data 440 and 442. The controller board 210 then supplies the set of actuation signals 448 to the positioning subsystem 66 through the connection medium 204. As will be described in further detail below, the positioning subsystem 66 is coupled to at least one of a microcontact printing stamp 54 and the wafer chuck 68 and, in response to the set of actuation signals 448, performs a microcontact printing operation in which ink 58 is applied from the microcontact printing stamp 54 to a substrate 58 (e.g., an opaque slide, a transparent slide, a wafer, etc.) disposed at the substrate location of surface plate 70. That is, the positioning subsystem 66 changes a distance 562 between the microcontact printing stamp 54 and the substrate 58 in order to deliver some of the ink to a surface of the substrate 58 in a controlled and consistent manner. During this operation, the set of actuation signals 448 not only controls the distance 462 between the microcontact printing stamp 54 and the substrate 58, but also controls the orientation (e.g., pitch, roll, etc.), contact forces, contact speed and duration, etc.

Computations which are well-suited for generating the set of actuation signals 48 based on the actuation data 440 are described in a thesis entitled "Automation of Soft Lithographic Microcontact Printing," by Amar Maruti Kendale, Mass. Institute of Technology of Cambridge, Mass. (2002), the teachings of which are hereby incorporated by reference in their entirety. This thesis describes such computations in greater detail, as well as describes a microcontact printing system which is similar to the microcontact printing tool 40 of FIG. 22B.

It should be understood that the above-described computerized configuration for the microcontact printing tool 40 provides a closed-loop system with force and position feedback. Such a configuration provides ease of automation (e.g., repeatable turn-key operation which limits operator influence).

In the preferred embodiment, the coarse slide has an encoder that is of the rotary incremental type, and therefore it is desirable to home the stage in order to control its position in an absolute fashion. The encoder is a sine-cosine incremental encoder and has 200 counts per revolution. To do this, one of the limit switches is used. These are Hall-effect switches that are normally off. When the switch is tripped, a 5V signal is output. The limit switch is near the upper end of travel.

The home is set using the following protocol: first, the stage position is ramped upwards at a slow speed (it must start in a position below the limit switch). When the limit switch signal is tripped, it triggers an index search. At the next index pulse that is reached, the encoder count is set to zero. This is a very repeatable method of homing the stage, since the encoder index pulse is far more accurate than the limit switch. Triggering the home reset with the limit switch alone will result in an inaccurate home set.

Generally, the home position needs to be set only once for every use. However, thermal drift and other errors can be mitigated by periodic recalibration of the home position.

The microcontact printing unit 40 has a load counter balance 80. While the stage could handle the weight (load) of the small support bracket 74 and the stamp head assembly 82, the amplifier could struggle especially when traveling upwards. The current requirement for upward vertical motion was well over 3 A. Despite the amplifier's 4 A specification, a counterbalancing mechanism is used to offload the weight of the stamp head assembly.

The load counter balances are constant-force pneumatic actuators. Such a component is available from Airpot Corporation. Their-specialty is ultra-low friction pneumatic actuators, which use a graphite carbon piston in a precision-toleranced bore. Since the frictional effects are minimal, this actuator does not add any significant dynamics to the system, and can allow constant force application through a long stroke.

In a preferred embodiment, a four inch stroke is required and two actuators with one mounted on either side of the stamp head is used. The actuators are sized based on an estimated force requirement of approximately 40 lbs. The maximum pressure available is 70 psi, so a total bore area of just over 0.5 inches$^2$ is required. In a preferred embodiment, two actuators with 0.9 in$^2$ bores, provide a sizeable safety factor.

A regulator is used to fine-tune the amount of pressure required to counterbalance the weight of the stamp head assembly 82. Pressure was increased until the current demand from the amplifier was equal for both directions of travel. A pressure of about 50 psi is required to achieve this. With the addition of the load counterbalances 80, the current required to drive the stage upwards (and downwards) is around 1.5 A.

The ability to control the stamp head defines the performance of the entire microcontact printing machine 40, so it is important that each individual component operates as specified. The force that will be imparted to the stamp is a function of the flexure stiffness, and the motion provided by the coarse slide.

It is essential, that the stamp face is oriented parallel to the substrate face prior to contact. For this, it is necessary to pose the stamp, and therefore three degrees of freedom are controlled: pitch (forward and rearward titling); roll (sideways tilting); and piston (up and down motion). FIG. 3 shows these degrees of freedom.

By controlling each of the degrees of freedom in this manner, the angular motion is isolated from the linear motion. Therefore, the pitch and roll orientation can be posed, while leaving the piston mode uncontrolled if desired.

The use of the control scheme as described in this embodiment, enables more sophisticated control methods. Position control, velocity control, or impedance control for one, two, or all three loops can be used. Active stiffness control can improve the resolution of control of stamping pressure. Additionally, the use of active stiffness can increase the range of pressures that can be applied.

The sensors and actuators mounted in the stamp head are not coaxial. They are instead orthogonally oriented to one another. In order to control the pitch, roll, and piston modes of motion, the reference frames of the actuators and sensors have to be mapped to a common reference frame or orientation.

This is accomplished with the use of coordinate transformation matrices. The feedback signals from the three capacitance sensors can be used to determine the position of the stamp backing in three-dimensional space. To map the two frames to a common one, the effects of a command signal on the orientation of the backing need to be determined and also the effects of the feedback signal. Since the rotation angles are small, the assumptions is made that the motion is primarily linear at each of the sensors and actuators.

First, the sensor feedback is mapped to the piston-pitch-roll frame. The sensors are oriented 120° apart on a 5.875 inch diameter circle as seen in FIG. 10. The following matrix maps the inputs from the capacitance probes to output in the piston-pitch-roll frame of reference.

$$\begin{bmatrix} 1 & 1 & 1 \\ 1 & 1 & -2 \\ \frac{3}{2} & -\frac{3}{2} & 0 \end{bmatrix} \begin{bmatrix} x_{sensor1} \\ x_{sensor2} \\ x_{sensor3} \end{bmatrix} = \begin{bmatrix} y_{piston} \\ y_{pitch} \\ y_{roll} \end{bmatrix} \quad (8)$$

A similar matrix is used to map the position, pitch, and roll commands to the currents for the actuators:

$$\begin{bmatrix} 1 & 2 & 0 \\ 1 & -1 & -\frac{3}{2} \\ 1 & -1 & \frac{3}{2} \end{bmatrix} \begin{bmatrix} u_{piston} \\ u_{pitch} \\ u_{roll} \end{bmatrix} = \begin{bmatrix} i_{coil}\ A \\ i_{coil}\ B \\ i_{coil}\ C \end{bmatrix} \quad (9)$$

As mentioned above, the current control amplifiers in the embodiment that was tested have slight differences in their gains. To compensate for these, correction factor gains were placed in the control path, so that each control signal gets adjusted to ensure the appropriate current reaching each voice coil.

From this initial test of the stamp head, a resonant peak at 40 Hz became apparent. The resonance arises because the system is lightly damped. The compliance of the flexure and the mass of the stamp head contribute to the resonance at this frequency. Plots showing this phenomena are presented in FIGS. 23A-B and FIGS. 25A-B.

This frequency is in the middle of the desired operating range. Left unaddressed, the resonance can cause vibration at this frequency. The stamp contact will therefore not be definite, and multiple impressions could be produced. This is unacceptable, since the pattern transfer takes place at the instant of contact, and vibration will cause pattern blurring and distortion.

In order to solve the problem, the resonance in the controls was damped. This resolves the resonance without diminishing system performance.

The approximate transfer function for the piston mode is $$\frac{9.475 \times 10^4}{s^2 + 15.08s + 6.317 \times 10^4} \tag{10}$$

This transfer function is plotted with the measured transfer function in FIGS. 26A-B.

To eliminate the resonance, one solution is adding a lead compensator in the feedback path, effectively adding velocity feedback. The feedback gain can be adjusted to add as much damping as required. The lead compensator design (the gain and the crossover frequency) are tuned. For this piston mode, the compensator is modeled as $$\frac{3.5s}{s + 200\pi} \tag{11}$$

Figure 23A:
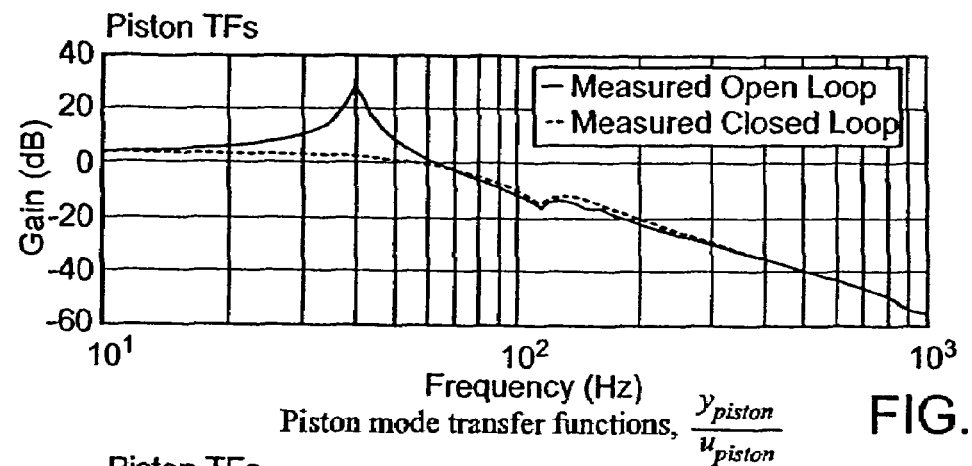
FIG. 23A is a graph of the gain of the piston mode transfer function.
Figure 23B:
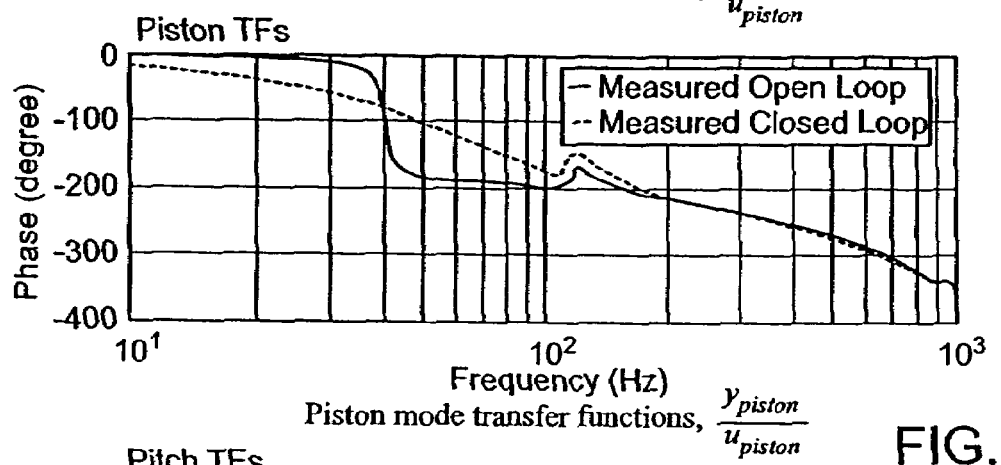
FIG. 23B is a graph of the phase of the piston mode transfer function.
Figure 24A:
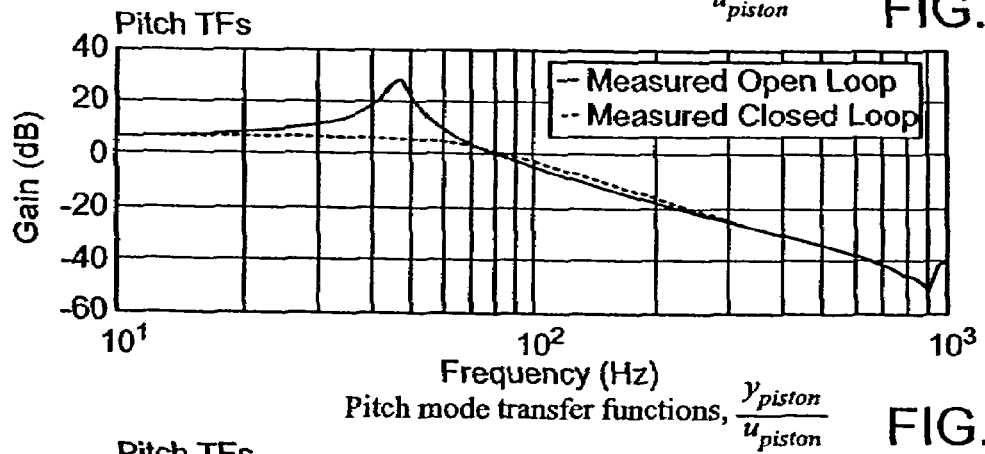
FIG. 24A is a graph of the gain of the piston mode transfer function.
Figure 24B:
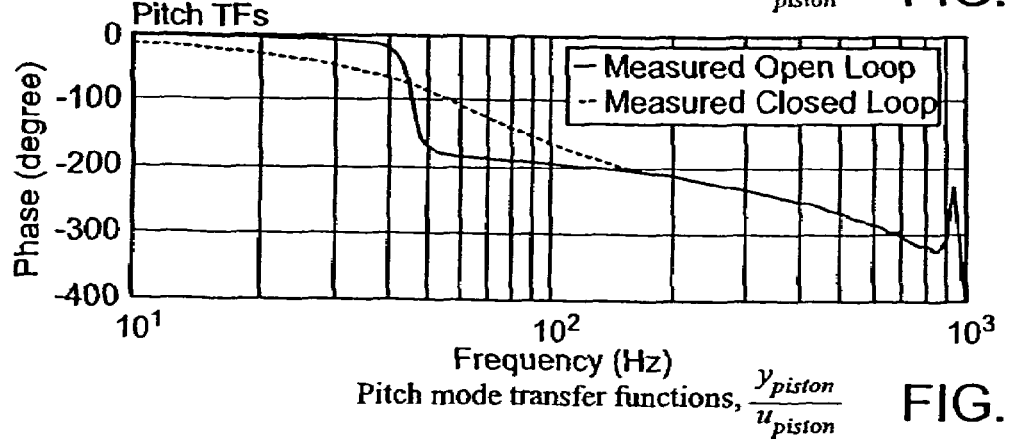
FIG. 24B is a graph of the phase of the piston mode transfer function.
Figure 27:
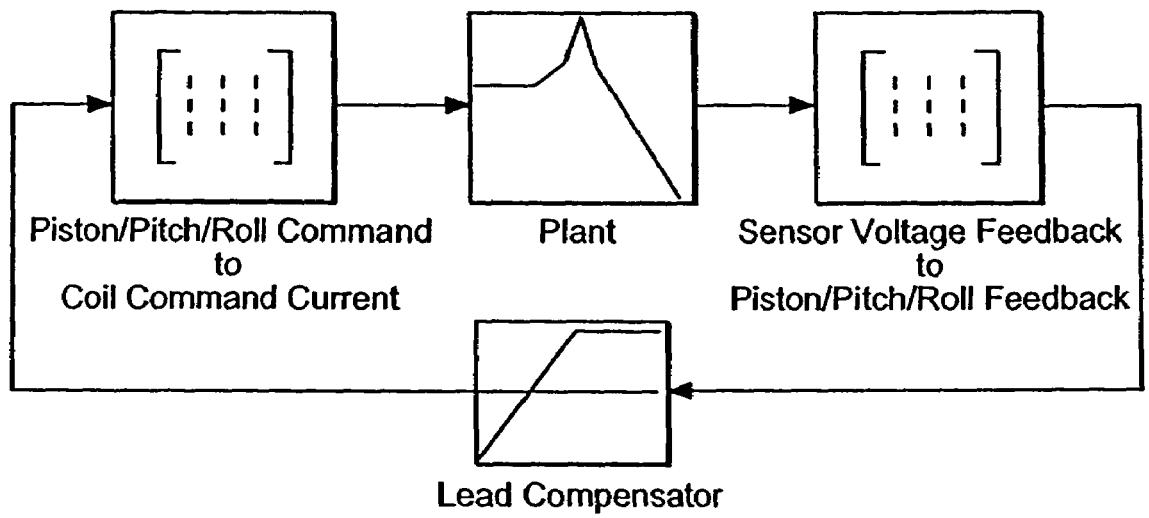
FIG. 27 is a schematic of lead compensated control loop diagram for the piston, roll, pitch modes of motion.
Figure 28A:
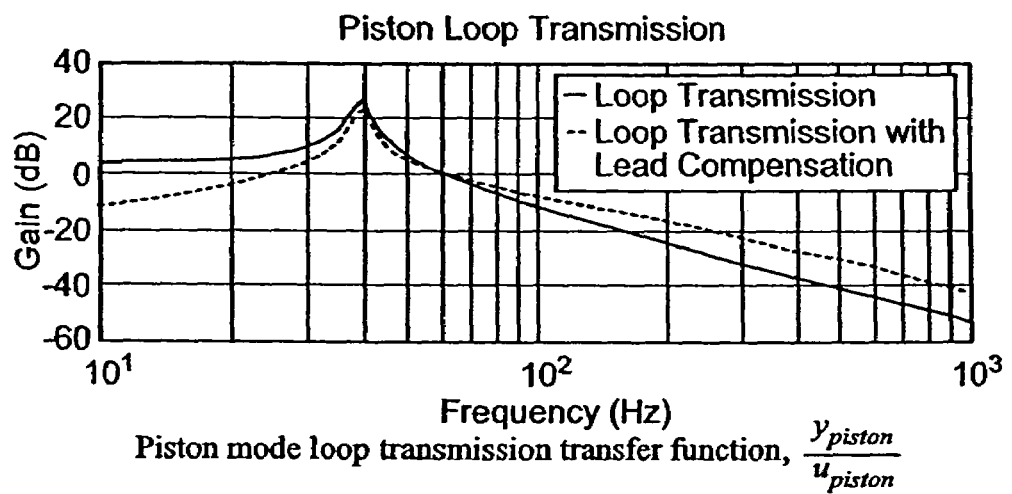
FIG. 28A is a graph of the gain of the piston mode loop transmission transfer function.
Figure 28B:
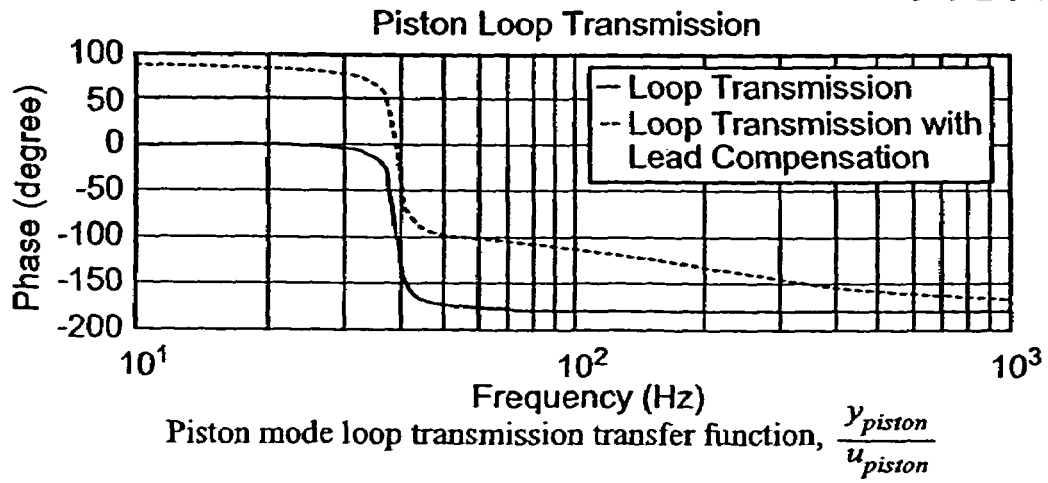
FIG. 28B is a graph of the phase of the piston mode loop transmission transfer function.

A diagram of the control loop is shown in FIG. 27. The transfer function for the compensated system is shown in FIGS. 23A-B and the loop transmission is shown in FIGS. 28A-B.

The lead compensators for the pitch and roll modes of motion were also tuned. The results of the controls with compensators are shown in FIGS. 24A-B, 29A-B, 25A-B, and 30A-B.

The addition of the lead compensation eliminates all signs of resonance in the closed-loop operation, giving a stamp head crossover frequency of about 75 Hz. This is ample for control needs, for the passive piston, active pose stamping as well as for other closed-loop control strategies.

An alternative to the lead compensation in the feedback system is to provide some mechanical damping, either by adding dash-pots, or sandwiching a viscoelastic damping material between two steel flexures (and replacing the single flexure). While these means can undoubtedly damp the resonance, they would demand additional design and fabrication effort. However, such approaches have the advantage of being broad-band dampers independent of controller limitation.

With the use of a quasi-kinematic mounting system (the position and orientation of the stamp plane is defined at three discrete points), accurate control of the attitude of the stamp relative to the substrate is possible. The voice coils in conjunction with a flexural guidance system allows for the control of the force to high level accuracy. The effective spring constant of the stamp head can be actively adjusted by way of the control signals. The capacitance position sensing permits the implementation of a hybrid control strategy, using both force and position feedback data to control the stamping motion.

Figure 12C:
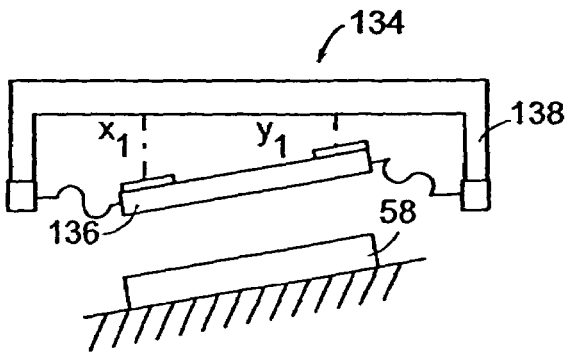
Figure 31:
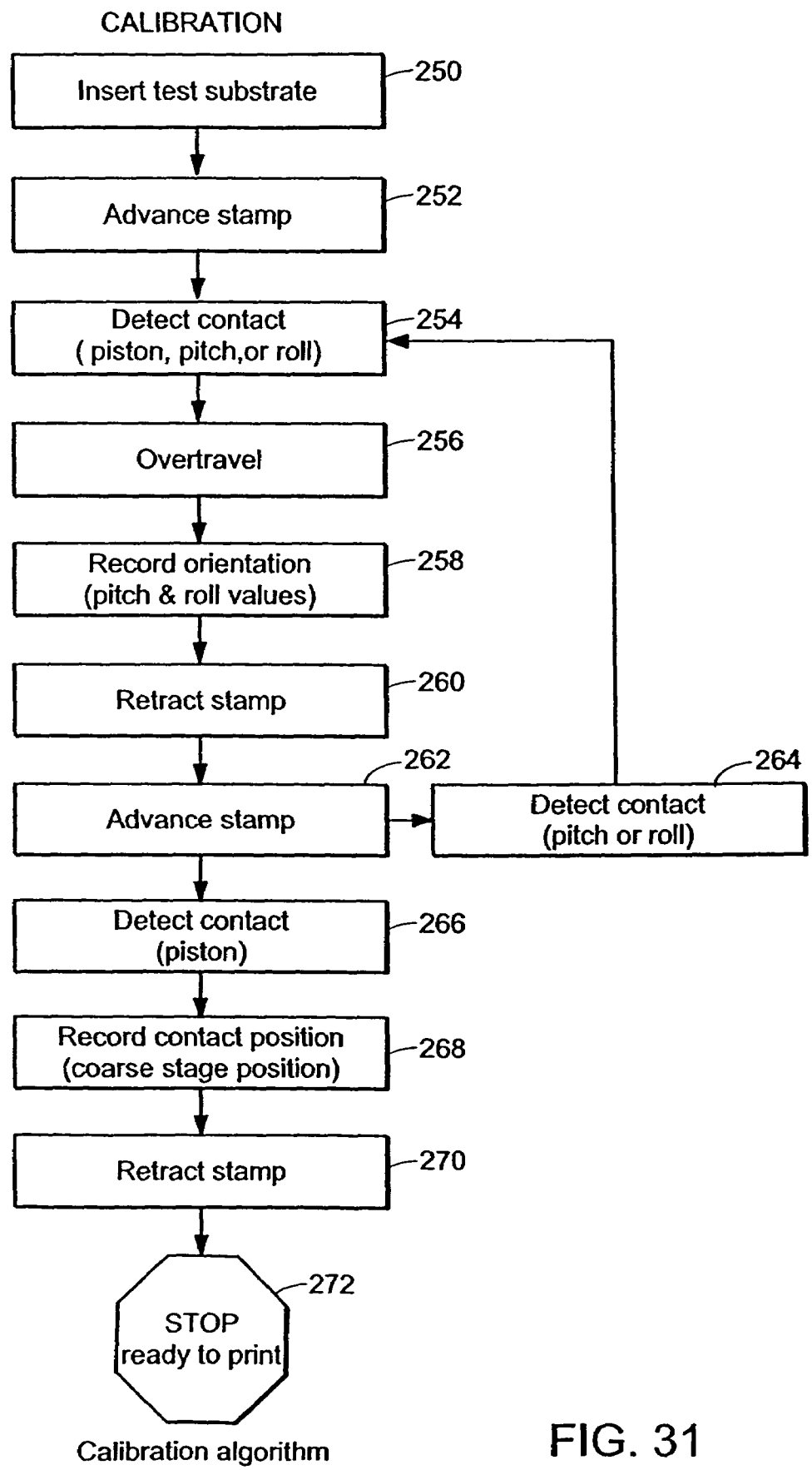
FIG. 31 is a schematic of the calibration algorithm (process)

Referring to FIG. 31, the test substrate 58 is inserted in the wafer chuck 68 per step 250. The coarse travel stage 76 is used to drive the stamp head 82 toward the substrate 58, which is held on the vacuum wafer chuck 68 per step 252. Once contact is detected by a change in piston, pitch, or roll values as shown in FIG. 12B and represented by the block 254, a preset "overtravel" is traversed per step 256. With this step, the stamp 54 passively orients itself to the substrate 58 and the pitch and roll values are recorded to record the orientation as represented by the block 258. At the extent of the overtravel, the orientation data is recorded, and the stamp 54 is retracted from the substrate 58 as represented by the block 260 and as seen in FIG. 12C. This process is illustrated in FIGS. 12A-12C.

Now that the relative orientations of the stamp 54 and substrate 58 are known, the exact contact position is determined. First, the stamp 54 is posed to match the recorded orientation as illustrated in FIG. 13A. It then advances toward the substrate, and the contact position, the position of the coarse motion stage, is recorded when a piston motion is detected, per step 266 in FIG. 31. If a pitch or roll motion is detected first, this indicates that the posed orientation of the stamp is not correct, and the first calibration step as shown in FIGS. 12B and 12C is repeated per step 264 and repeating steps 254-262, as illustrated in FIG. 31.

The substrates are flat to a known tolerance, the microcontact printing is operated under the assumption that the orientation of each subsequent chuck substrate will be identical to that of the calibration substrate. This is because the substrates are thin (on the order of 500 microns) and are chemically and mechanically polished to ensure a high degree of parallelism between the faces. The substrate 58 when placed on the wafer chuck 68 and vacuum is applied, the wafer effectively takes on the flatness of the chuck face.

After the calibration step is complete, the stamp is inked with the SAM in solution. Inking can be done by hand, in which case the stamp retracts to allow access to its face, or automatically with an inkpad. When an inkpad is used, the contact pressure and duration of contact can be controlled: this feature can be used to ensure uniform and repeatable inking of only the stamp's patterning (raised) features.

The stamping additional process is very simple in this mode. The application of force is wholly passive: no force is applied through activation of the voice coils. Therefore, deflection of the flexure is the sole source of external pressure.

The spring constant of the flexure is measured using the voice coil 112 for applying force and the capacitance sensors 114 for measuring the deflection. Current is applied to the coils by issuing a piston-mode command. This corresponds to a piston-mode position feedback: the ratio of the command force to the response deflection is the effective spring constance for the flexure. As the stamping motion will be in the piston-mode, there is no need to measure the constants in the other modes.

Since the spring constant of the flexure is known, there is an accurate gauge of the force that is seen by the stamp when it is contacted with a substrate. Any deflection in the flexure is proportional to the pressure being applied to the stamp. The elasticity of the stamp also plays a role in the deflection feedback, but since strain and stress are proportionally related, this deflection can be lumped with the flexure deflection.

For automated stamping, all that is required from the operator is the input of stamping pressure and contact duration parameters, and the placement of substrates. In this process, the stamp is initially positioned with the voice coils in the orientation that was recorded during the calibration step. The stamp advances toward the substrate, and contact is detected when there is a change in the piston-mode feedback. This value is set as a zero for the coarse positioning stage, and the coarse stage continues to advance until the total preset deflection is achieved. This position is held for the predetermined time duration, and the head is then retracted. At this point, the substrate is removed; it can be replaced with another, and the stamping action can be performed again.

Figure 32:
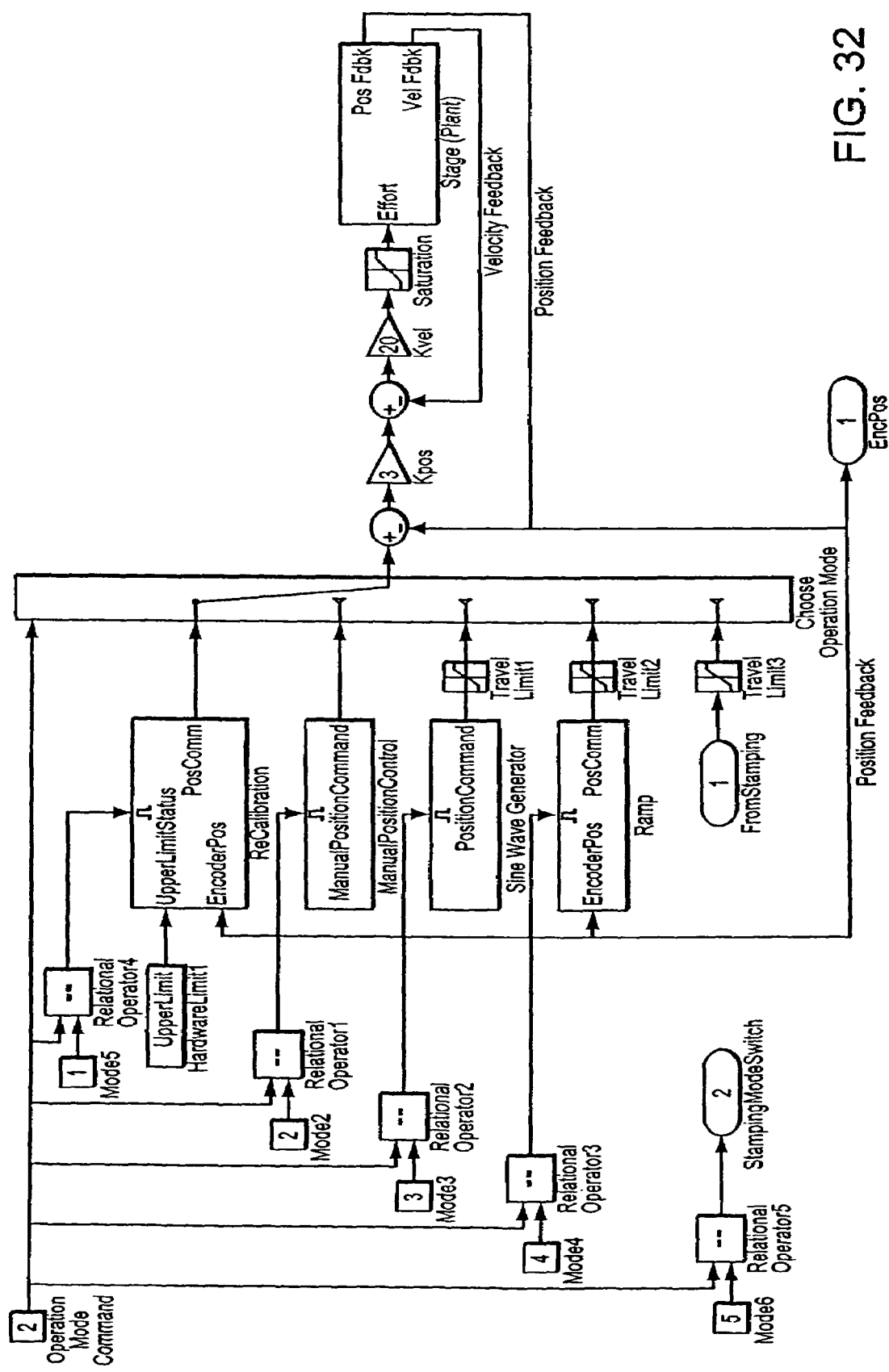
FIG. 32 is a schematic of the motor control.

Referring to FIG. 32, a schematic of the motor control is shown. As indicated before, the stage provides a position and velocity feedback using the encoder, the tachometer and the limit switch.

A calibration routine is important for homing the stage. This is because the encoder is relative rather than absolute, and it re-zeroes each time the control software is reloaded onto the digital signal processor (DSP). The calibration function slowly ramps the stage position upwards until the limit switch is tripped. At this point, an index search block is triggered, which resets the home the next time the encoder's index pulse is generated. This function provides for a highly repeatable calibration, which can be executed as often as desired to limit the effects of thermal creep or noise on accuracy.

Figure 33:
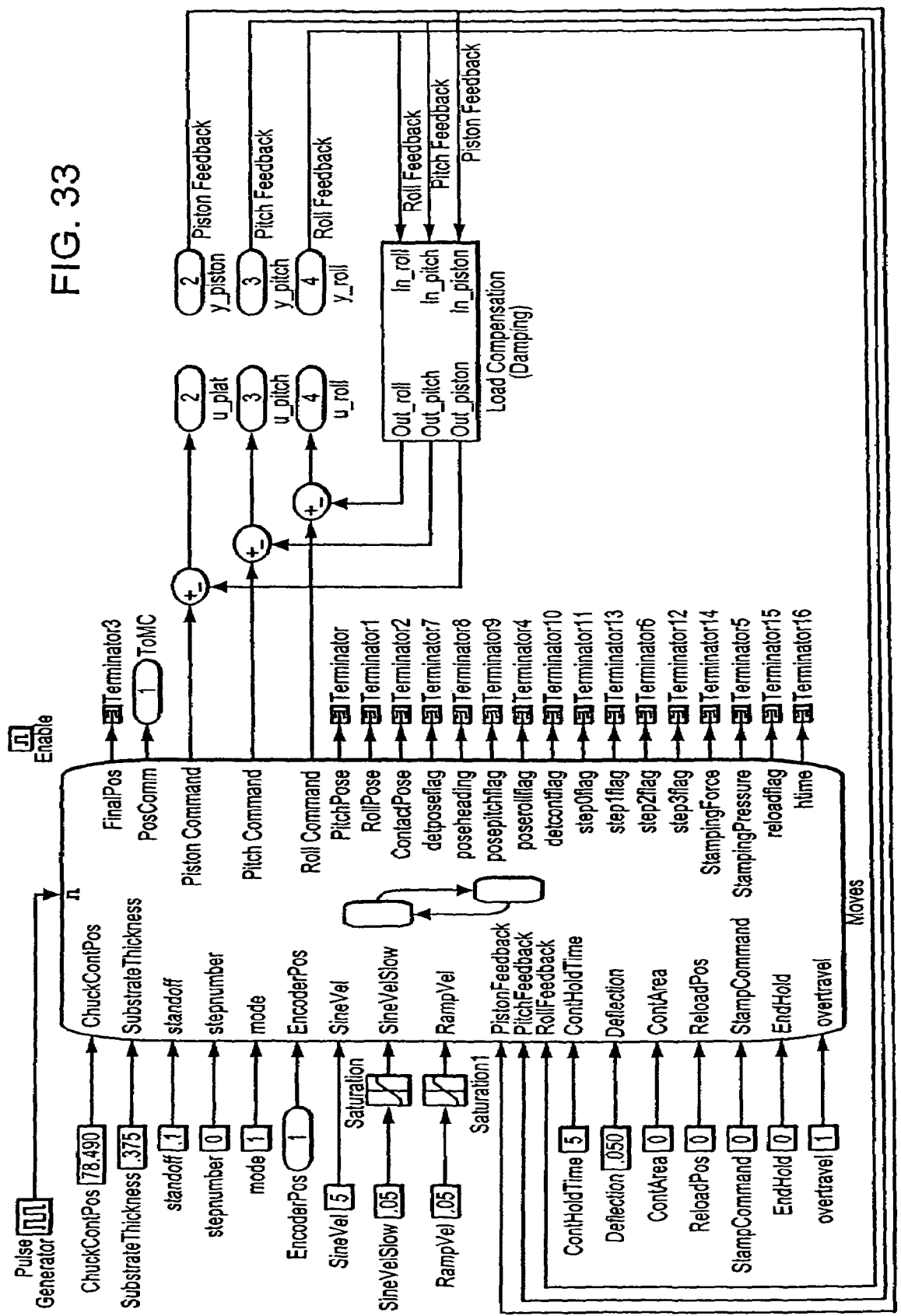
FIG. 33 is a schematic of the stamping control model.

Referring to FIG. 33, a schematic of the stamping control is shown. In order to automate the stamping, a higher-level molding method simplifies the implementation, through the use of conditional logic.

Transitions between the states can be triggered by user input or by other dependent events. They are driven by conditional statements. For example, in the calibration mode for stamping, states include the recording of measured data and active posing. Transition between the recording state and the posing state will not occur until some event (such as a steady-state condition) signals the change. The essential elements of the model are a calibration phase, an inking step, and a stamping phase.

The calibration step begins with the head in a fully retracted position, near the upper limit of its travel. This gives the user access to the chuck, in order to place a test substrate. The user must at this point input values for the nominal substrate thickness and the desired initial standoff, which should provide clearance for even the thickest of substrates. At the operator's command, the stage advances toward the substrate with a half-sine wave position profile. A sine wave has the benefit of eliminating severe accelerations during the travel (a trapezoidal velocity profile, which is another common choice, requires drastic changes in acceleration).

The head advances to the standoff position, and then resumes its travel at a much reduced velocity. The travel is now at constant velocity, as the head is polling for contact detection. Once contact is detected, the head continues to advance for the preset calibration distance. At this end of the travel, the orientation data, i.e., the pitch and roll positions, are recorded, and the head is retracted to the standoff position. Here, the head automatically poses itself to the record orientation, by increasing or decreasing the orientation command as required.

Once this is complete, the head advances at a constant low velocity, to detect piston-mode contact. When contact is detected and recorded, the calibration is complete, and the head retracts fully.

Inking is the next step. This is a fully manual step: the user inks the stamp, places a new substrate on the chuck, and is then ready for stamping. The stamping command triggers a sine-wave position profile once again, advancing to the same standoff position used in the calibration. Then, a low-velocity sine position command is given, to advance the stamp head to its final contact position. As it is advancing at low speed, polling or sensing is occurring to determine when contact occurs, since this new contact position will influence the final position.

In that the amount of flexure detection after contact needs to be controlled carefully to ensure proper printing, the deflection parameters are set in advance by the operator controlling stamping pressure. If a constant thickness is assumed, the stamping contact may end up over or under pressurized. The system checks for the new contact position each time stamping occurs because there is a range of thicknesses that fall within the substrate tolerances.

The head holds its position for final contact for the length of time specified by the "contact duration" parameter. After this time has elapsed, the stamp head is withdrawn, again with the low-velocity half-sine wave position command, until the standoff position, at which point it fully retracts at a higher speed.

Figure 34:
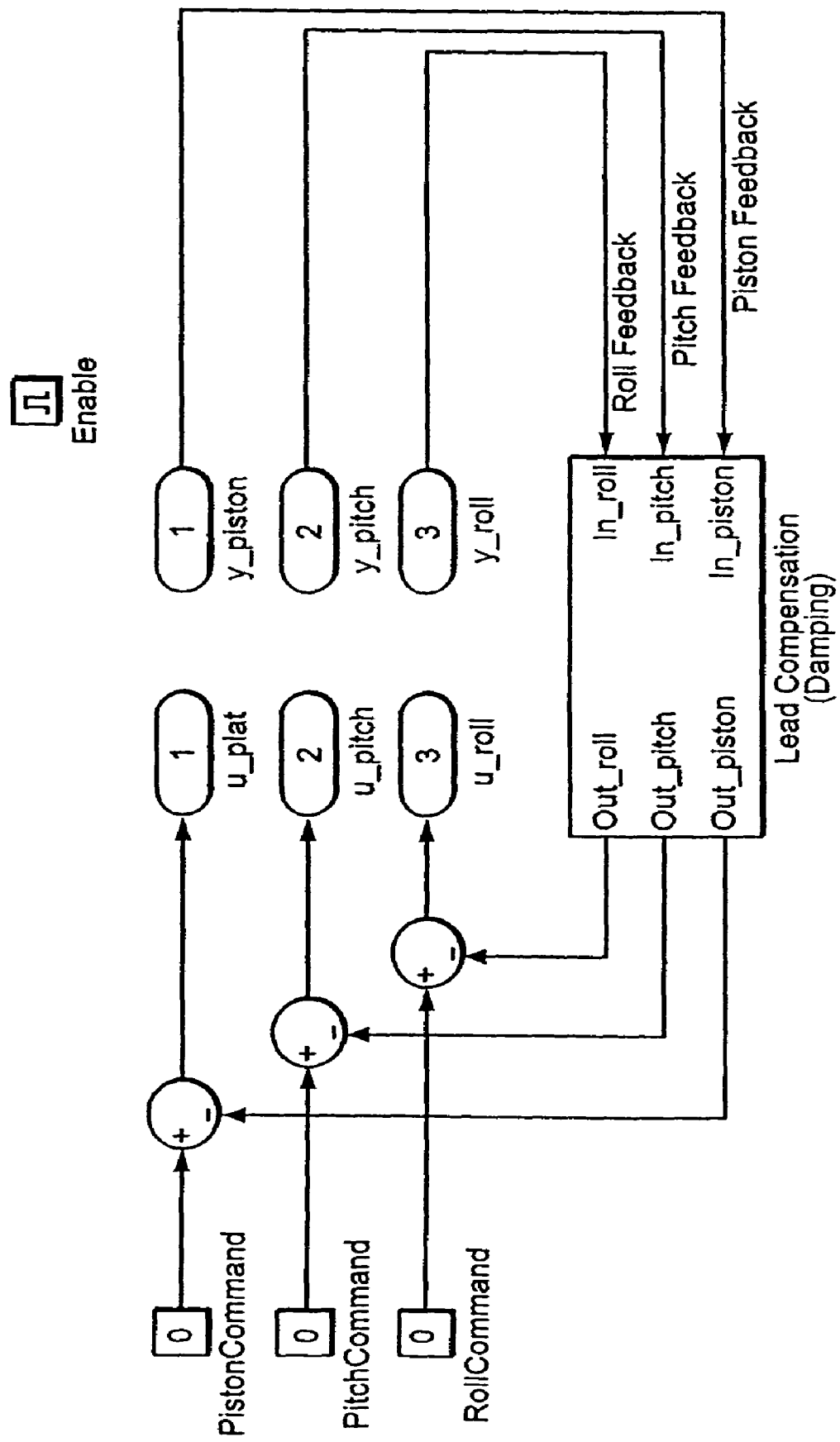
FIG. 34 is a schematic of the stamping control.

The stamping is now complete, and the user may change the substrate to stamp again if desired. A new calibration is required only if the stamp is changed. Referring to FIG. 34, a schematic view of the stamping control model using the coordinate transformation matrices is shown.

Figure 35:
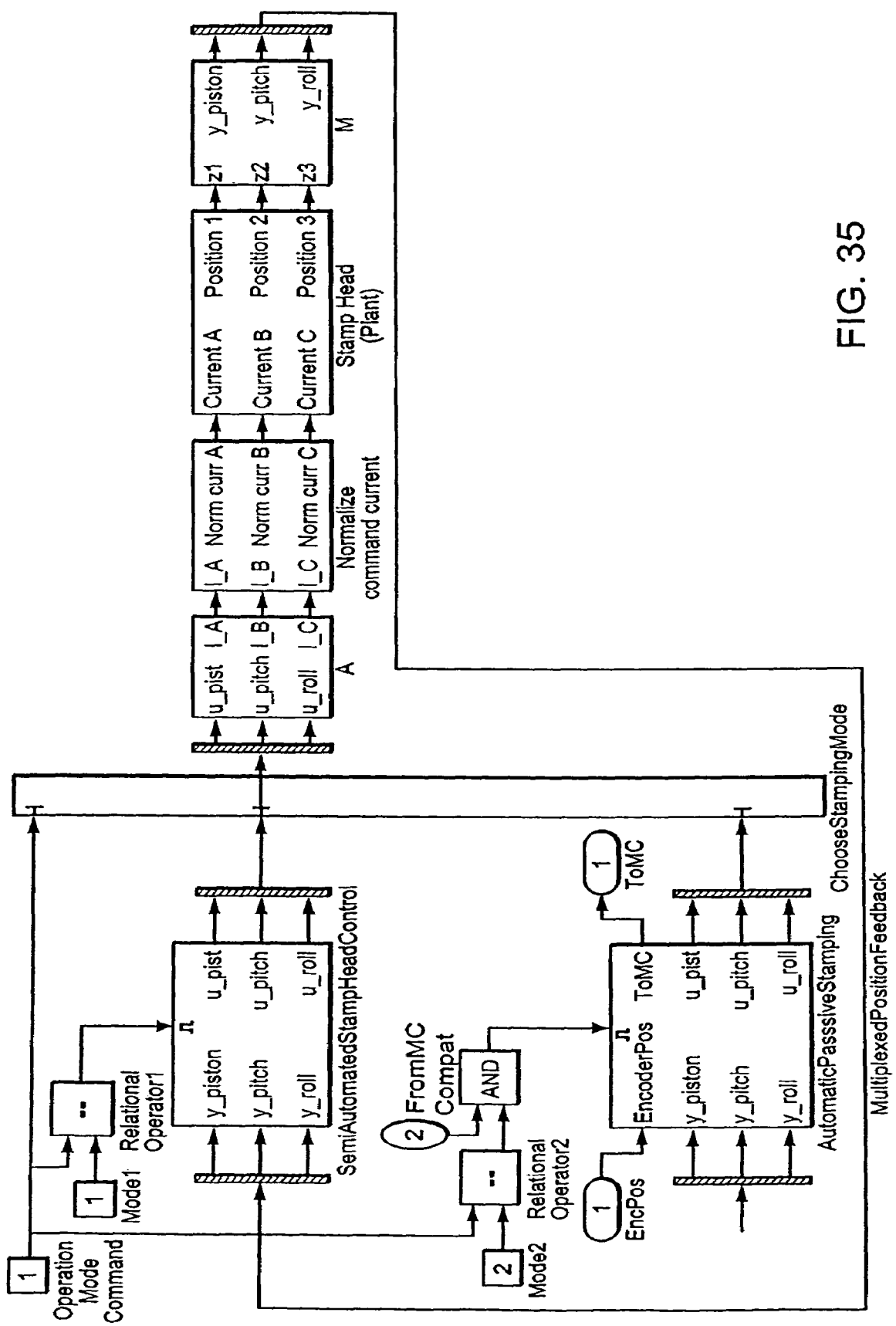
FIG. 35 is a schematic of a control model with lead compensation.

FIG. 35 shows a schematic of an alternative stamping control mode. The initial testing of the stamp head was performed with its basic functionality along with simple reference commands to control the piston, pitch, and roll in closed-loop. This model is shown in FIG. 35, the associated mode of operation is called Semi-Automatic Control.

In an embodiment, the controller board 210 is a dSpace 1103. It contains a 400 MHz IBM 604e Power PC processor, with 128 MB DRAM. This board has the digital and analog input and output requirements needed. The system described has the required analog input channels (analog-to-digital converters) for the linear stage tachometer, the three capacitance gages, the limit switch for the stage, and the pressure sensor for the pressure chamber.

An analog encoder input is needed for the sine-cosine rotary encoder. The dSpace 1103 board is equipped with a TC3005H encoder interface from Hanning ElektroWerke GmbH & Co. This unit has 32-bit resolution.

For outputs, digital-to-analog convert channels are used for controlling the linear stage, each of the voice coils, and the solenoid valves of the pressure chamber. The DSP board also has additional capacity for the addition of alignment stages and other peripherals. All of the inputs and outputs operate at a ±10 V range.

The dSpace board is accompanied by two software elements that make the system extremely versatile. One is the Real-Time Interface (RTI), which provides an interface between Matlab's Real-Time Workshop and the dSpace board. This includes special Simulink blocksets that allow access to the input and output signals, as well as triggers for board-based functions (such as polling the encoder for the index pulse). The control system has a plurality of graphical user interface (GUI) panels for monitoring and manipulating the system behavior in real-time.

Figure 36:
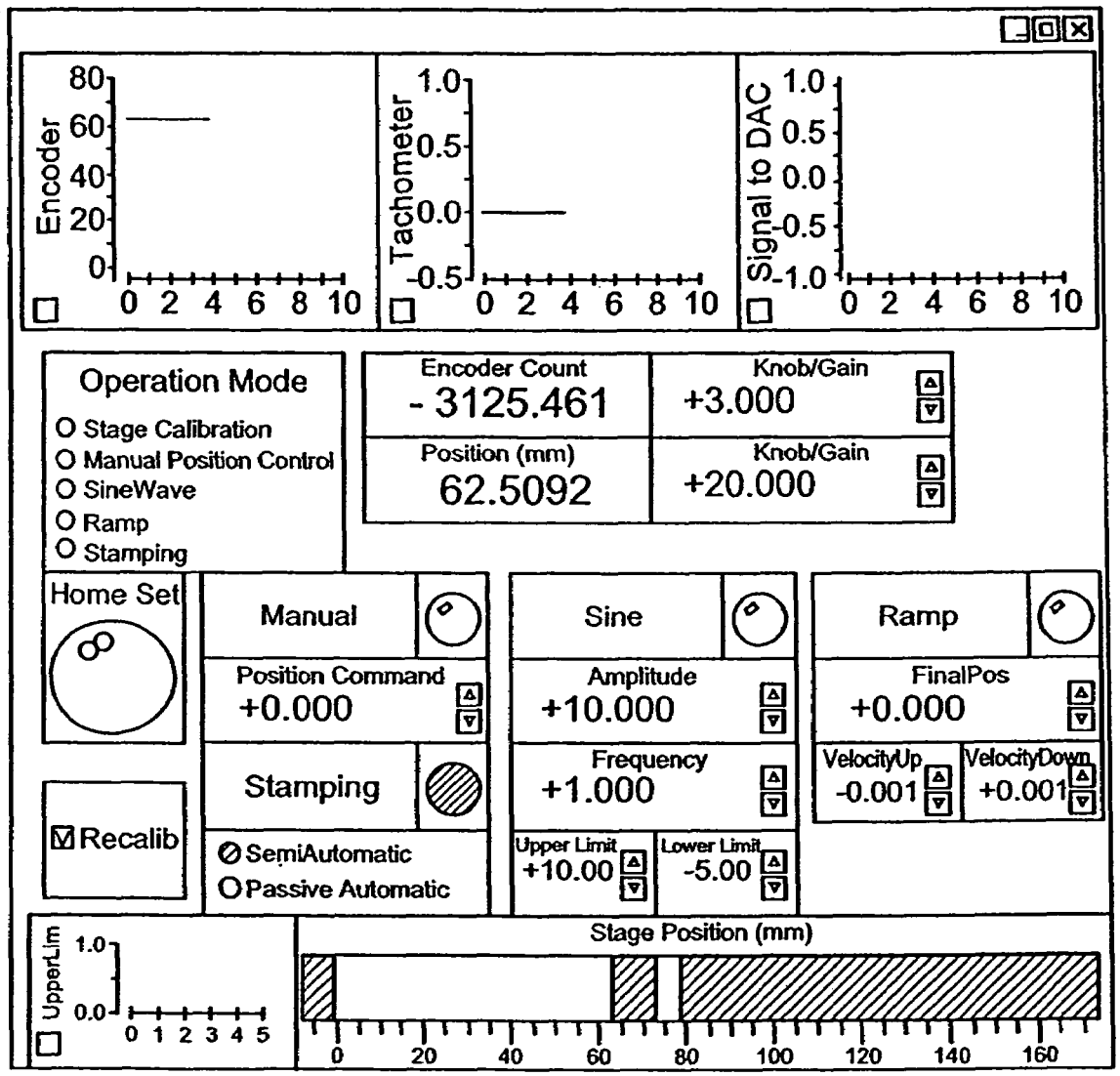
FIG. 36 shows a stage control interface.

FIG. 36 shows a GUI displaying the current position of the stage (in both encoder counts and mm); traces for the position and velocity as functions of time; and limit switch status. Additionally, it contains switches and numeric inputs for controlling the mode of motion (step, sine, ramp, or stamp), as well as mode-specific parameters (such as ramping speed).

Figure 37:
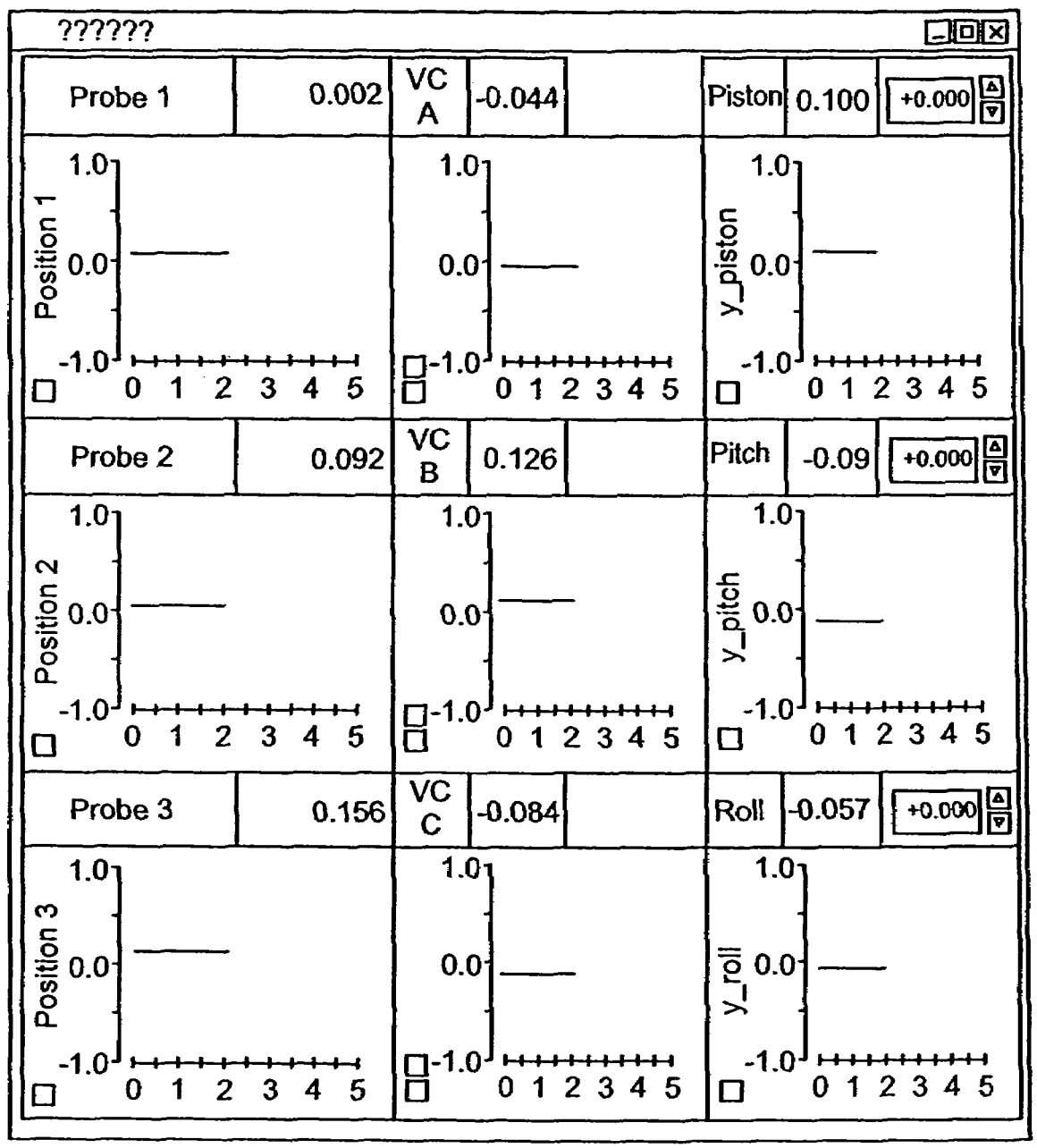
FIG. 37 shows a sensor trace display interface.

FIG. 37 shows a GUI display for viewing and controlling the motion of the stamp head. It contains nine separate traces: one for each of the three capacitance gage outputs, one for each of the three voice coil current commands, and one for each of the three motion modes (piston, pitch, and roll). This last set of traces also incorporates command signal inputs, which are used in the Semi-Automatic Control mode: the piston, pitch, and roll commands are input here, and the resulting change in attitude and position can be simultaneously monitored.

FIG. 38 shows a GUI display for the control and observation of the fully automated stamping process. This panel displays all of the stamping parameters, such as flexure deflection (which determines stamping force), contact duration, motion velocities, and others. Real-time access to position information for both the stamp head and the linear stage are also present in this panel, as is status information for the stamping progress (that is, the current mode of operation, the success of the calibration, etc.).

At first glance, this scheme appears similar to the position control mode. However, there is an important distinction. Here, the stiffness of the entire system is controlled, so that the effective forces on the stamp can be controlled to a high degree of accuracy. Through this implementation, the stiffness of the head, including the stamp itself, can be governed by a predetermined model. In essence, a model of the desired system is created, and the stamping process is then forced to mimic the model. Again, the stiffness of each of the degrees of freedom can be independently controlled, so that the angular axes of motion can be set to be much stiffer than the linear axis. A wide range of forces can be applied, as the actual flexure spring constant no longer drives the contact force.

In the current embodiment of the printing tool, the pitch and roll poses are actively set, but we do not increase the stiffness of these angular degrees of freedom. Closing the position loop on pitch and roll permits us to increase the stiffness of the stamp head and substrate is in the direction normal to the substrate face. Alternatively, the amount of stiffness in the angular modes can be set to any desired level, and can vary as a function of the piston-mode position.

In a preferred embodiment, the controller board 210 is a dSpace 1103 controller board from dSPACE, 28700 Cabot Drive, Suite 1100, Novi, Mich. 48377.

Further details regarding the system are described in a thesis entitled "Automation of Soft Lithographic Microcontact Printing," by Amar Maruti Kendal, Mass. Institute of Technology, the teachings of which is incorporated herein by reference in entirety.

The implementation of contact patch control requires the ability to control the deflection of the stamp backing, and also be able to couple this deflection with the position control system. In the embodiment described, the optional functionality of controlling the contact patch is also included. That is the ability to initiate contact at a single point, and then expand this contact region in a controllable manner to ensure even pressure and conformal contact across the substrate area.

Calculation of the pressure required to achieve a sufficient deflection without overly stressing the stamp backing material uses the following equations:

$$\delta = 0.221 \frac{P}{\pi E t^3} \quad (12)$$

$$\sigma = 0.39 \frac{L}{t^2} \quad (13)$$

where δ is the circular stamp backing's maximum deflection, P is the pressure, σ is the maximum stress, L is the load, and t is the thickness.

To keep the stress at a reasonable level (less than 10% of yield), we limit the pressure to 50 kPa, or 7 psi. This will result in a deflection of 25 microns at the center of the disc, which ought to be enough to initiate a quasi-point contact.

One method of controlling has been described above. It is recognized that there are other ways of controlling the movement of the printing unit including the stage and the stamp head assembly including the linear actuators 112. Some of these are described hereinafter.

The controller is designed so that its feedback action adds damping to a resonant mode, and thereby reduces the vibrations present in that mode, and thereby reduces the likelihood of intermittent contact and blurring in a stamping operation. For example, the position of the stamp head can be made to depend to some extent upon velocity, and thereby damp a resonant mode within the control bandwidth.

The controller is designed so that its feedback action effects a desired relationship between force and velocity at the controlled body. For example, it might be desirable for the controlled body to have the characteristics of a spring over some frequency range, wherein the spring rate is different than that which would be achieved with no control, and to have the characteristics of a damper over some other frequency range wherein the damping constant is different than that which would be achieved with no control.

Stamping requires at a minimum the control of motion in one degree of freedom (the stamping direction). However, a rigid body has 6 degrees of freedom, and in some cases, all of these might be controlled actively in a stamping operation. These degrees of freedom are X,Y,Z, and rotations about these three axes. If Z is the stamping direction, one can at least control the Z-motions and forces. In a preferred embodiment, Z and rotations about the X and Y axes are controlled. These rotations control the alignment required to bring the plane of the stamp into parallel alignment with the plane of the substrate, so that stamping occurs essentially simultaneously across the face as the stamp is brought into contact. In some applications it may be further desirable to control motions in more degrees of freedom, for example to provide pattern alignment in X,Y, i.e., in the plane, and in rotation about the Z axis (i.e., about the normal to the plane). Such alignment might be used for instance, to align a pattern to be stamped to marks on the surface of the substrate. In this case, for 6 degree of freedom alignment, the actuation and control ideas presented herein can be used in all six degrees of freedom.

On a per-operation basis, one can measure the contact initiation position error, and feed this into the pose used at the start of the next stamping operation. Thus on successive operations, the stamping pose can be kept close to parallel with the substrate surface at first contact in order to most efficiently regulate the propagation of the contact between the stamp and the substrate. Information learned on earlier cycles is thus applied to the present stamping cycle. Then the motions measured on the present stamping cycle are fed into the iterative learning algorithm to adjust for the next further cycle. Such iteration can be carried on indefinitely, or stopped for some time when a desirable condition is reached. Learning can then be resumed whenever stamping conditions fall outside of some predetermined or dynamically adjusted windows of parameters. By this means, the quality of the stamped pattern is optimized to a high level.

The process can be controlled by observing some optical properties of the stamping process. For example, an optical sensor, or camera, or camera and microscope can be used to observe a change in the appearance of the stamping surface before, after, or as it comes into contact with the substrate surface. This can be used to facilitate alignment of the stamp patterns to previously applied patterns on the substrate surface in order to achieve registration between successively stamped layers or other desired features. Such alignment can be facilitated by using dedicated alignment marks on the substrate or stamp, in a fashion such as is used in well-known techniques in photolithography. Alternately, techniques can be used for alignment such as observing the deformation of contacting structures.

Another use of optical-sensing-based control might be to monitor and control the contact of the stamp pattern to the substrate, so as to control some property of the stamping process such as contact pressure, contact uniformity, deformation distance, propagation of the contact front, etc. For example, small patterns can be observed deforming as they come into contact with a substrate via a change in light transmission, optical density, color, reflectivity, or other characteristics. These measures can thereby be used to control the proper transfer of the stamping material over the desired area and with desirable contact pressure, time, etc.

In implementing the above control methods, the stamping force may be regulated by a number of means. Among these are:

1) Constant Voice Coil Current Mode

Constant-current in the voice coils is used to input offset forces to effect a pose with the stamp surface parallel to substrate surface. Coarse stage advances, while monitoring position sensors. When the sensors indicate a desired deflection and thereby a desired force via the spring rate of the flexures, the coarse stage stops. Then stages are held in place for a given amount of time while the ink transfers. Then the coarse stage retracts the stamp from the substrate. The pose is adapted for the next stamping operation by observing how the position sensor outputs change as the stamp contacts the substrate. The position at the sensor location which contacts first is retracted slightly and the position at the sensor location which contacts last is extended slightly in an adaptive fashion so as to attempt to maintain simultaneous contact at all the sensor locations when the stamp is brought into contact with the substrate.

2) Constant Position Mode

Fine stage servos at a fixed position, where the fixed position gives the correct orientation to achieve parallelism. The coarse stage advances until each voice coil current reaches a desired level, thereby indicating the stamping force.

3) Compliance Control Mode

In both of the above, the coarse stage moves to bring the stamp into contact with the substrate or visa-versa. There are also useful modes in which the motion and force of the fine stage are coordinated so as to achieve a desired relationship between the position, velocity, and force of the stamp head. For example, the stamp head can be controlled to have a desired position and desired compliance characteristics with respect to motion of the stamp head from the desired position.

To use this mode in stamping, the stamp head is first brought into near-contact with the substrate by some means. Then the desired position setpoint is advanced so as to initiate contact. As contact occurs, the actual stamp position will deviate from the desired position setpoint due to contact between the stamp and the substrate surfaces. The resulting stamping force pressure distribution on the stamp surface will result from the compliance control relationship. In this fashion, the stamping force can be controlled as a function of time.

As another example of compliance control, the center of compliance can be controlled in three dimensions so as to achieve desirable stamping operations. For example, as in robotic applications, it may be desirable to have a remote center of compliance so as to affect the coupling of motions as the stamping operation proceeds.

4) Absolute Position Control where the Coil Forces are not Used for Feedback.

While the substrate 58 is shown in the embodiment discussed above being manually placed on the wafer chuck 68, it is recognized that an automated process such as a carousel can be used in positioning and removing the substrate 58 from the wafer chuck 68.

As discussed above, the stamp 54 is integrally bonded to a stamp backing 158 as illustrated in FIG. 18. The apparatus and method for generating large-area stamps 54 that are integrally bonded to rigid backplanes on stamp backing 158 is described below. The molding process enables the creation of thin stamps (with thickness on the order of 100 µm), whose dimensional stability is governed by a thick backing.

The quality of impressions and patterns that can be achieved through microcontact printing is a function of the quality of the stamp which carries the topology of interest. It is therefore advantageous to develop a deterministic method of creating stamps. A robust, repeatable way to generate stamps will provide standardization in the forms, dimensions, and handling methods. For this reason, stamp generation is a key element in the design of a stamping machine.

The commonly used procedures for making stamps do not provide determinism. That is, there is little control over process parameters, which results in non-uniformity in stamp characteristics. These parameters of interest include stamp thickness, surface flatness and roughness of both sides of the stamp, as well as the shape and roughness of the lateral faces. It is typical to find that stamps are made in sizes that are easily handleable by humans, with thickness dimensions on the order of 5 to 10 mm, and surface areas ranging from 6 $cm^2$ to 125 $cm^2$. While these dimensions are easy for human hands to work with, they are not ideal for generating micropatterns repeatably: the low stiffness and nonlinear compression characteristics of the stamp material make it difficult to control stamping pressure.

Another key factor in microcontact printing is the physical handling of the stamps. As elastomers, the stamps are susceptible to stretching and tearing. It is therefore necessary to determine a method by which the stamps will not be distorted laterally during the stamping process. Furthermore, the stamping process requires the application of pressure in order to transfer the pattern. This ensures that the raised portions of the stamp all contact the substrate.

Environmental conditions can also play a role in altering the dimensions of the microfeatures to be patterned. The elastomeric materials commonly used in micro-contact printing have high coefficients of thermal expansion, on the order of 300 ppm/° C. In order to have process control, a solution must be developed that includes thermal compensation, environmental control, another way to make the stamp less thermally sensitive.

Figure 39:
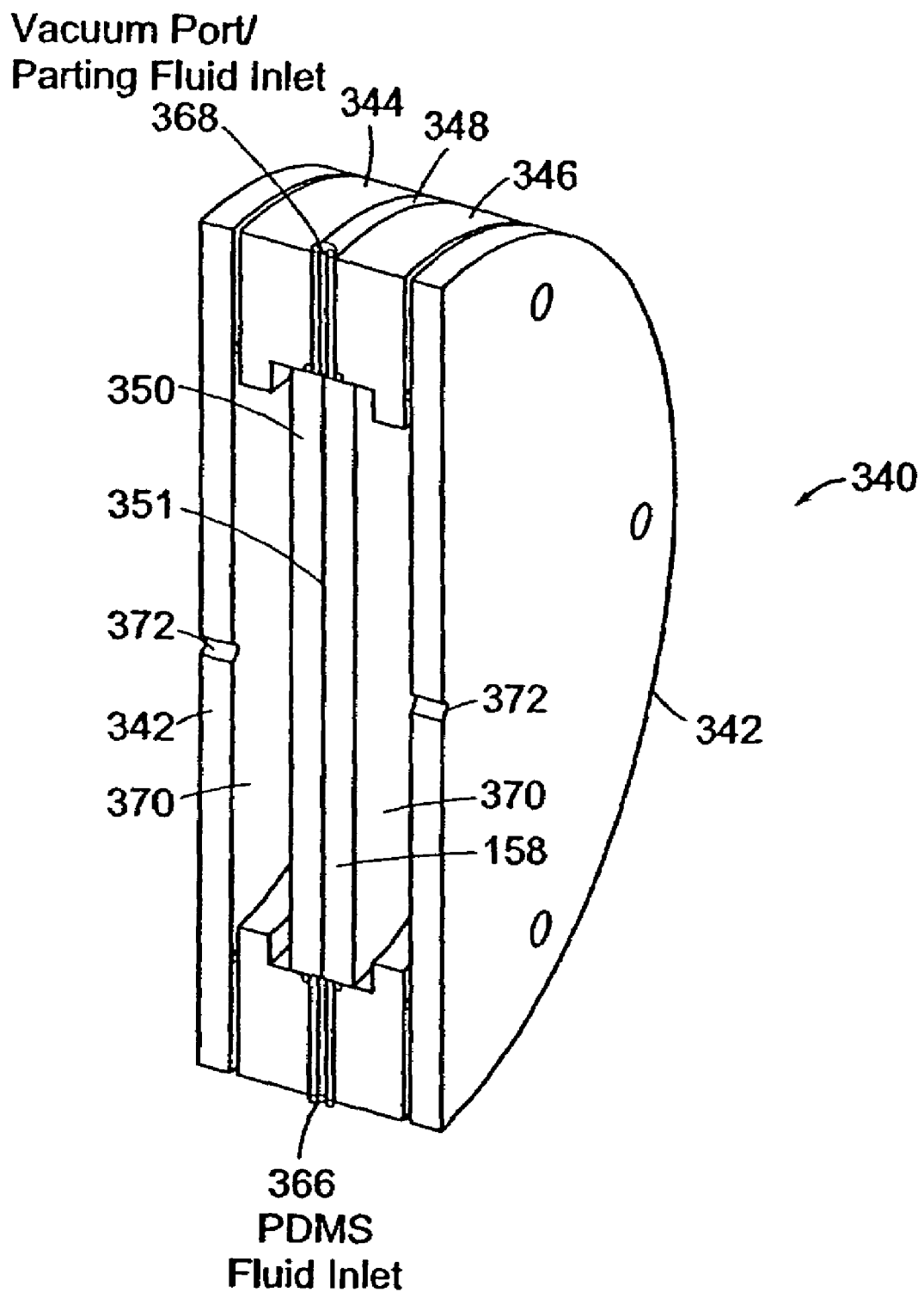
FIG. 39 is a sectional view of a mold chamber.

FIG. 39 shows a cross-sectional view of the mold chamber 340 for forming the stamp 54 with the stamp backing 158. The mold chamber 340 is vertically oriented. The mold chamber 340 has a pair of discs 342, a pair of outer rings 344 and 346, an inner ring 348, and a master backing 350 and receives the stamp backing 158. In between the master backing 350 and the stamp backing 158 is a mold cavity 351. In a preferred embodiment, the discs 342 are polycarbonate.

Figure 40:
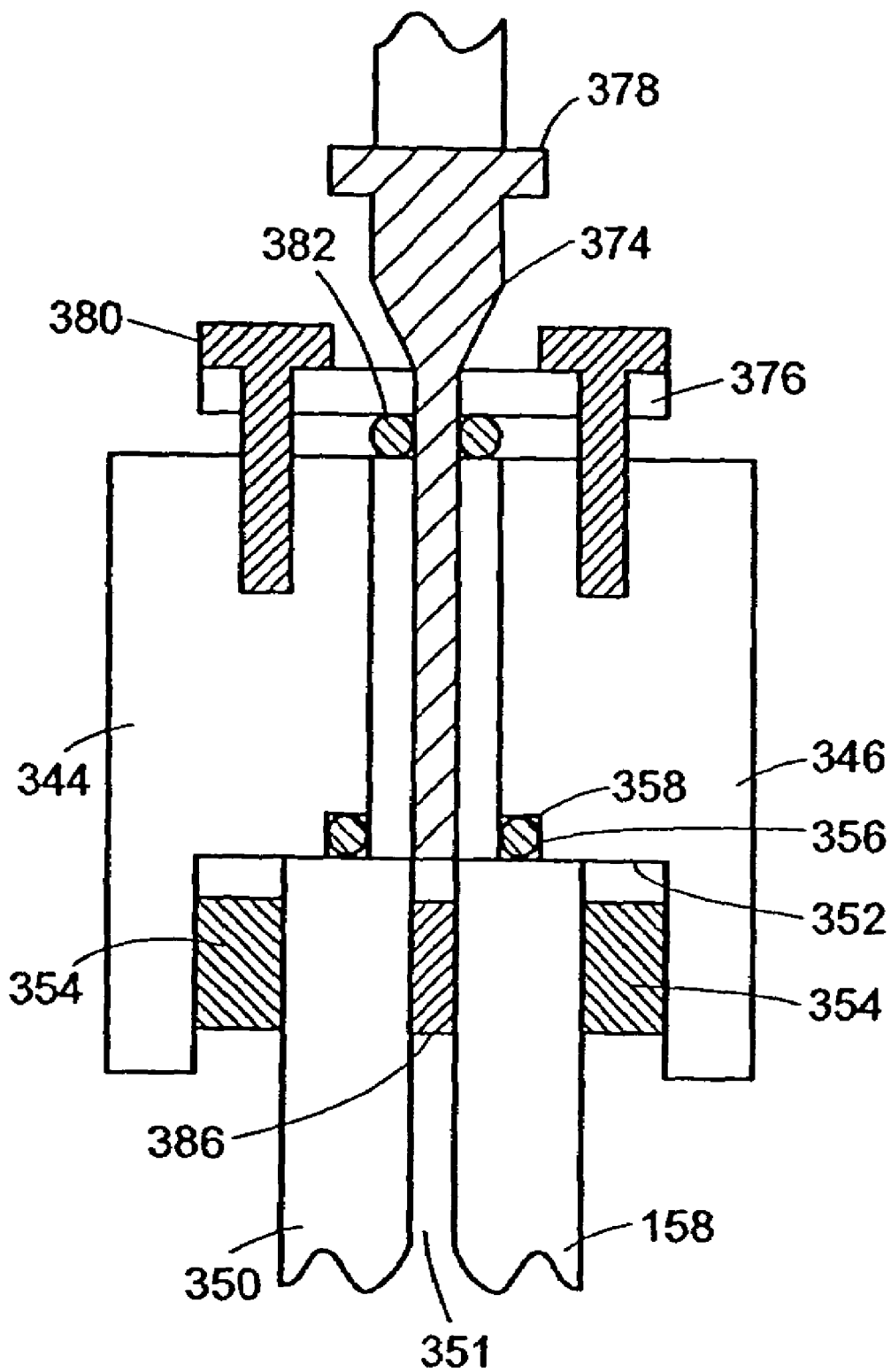
FIG. 40 is an enlarged view of an upper portion of the mold chamber.

Still referring to FIG. 39, each outer ring 324 contains a step 352 for seating an elastomeric preloading elements or rubber block 354, and also a groove 356 for an edge-sealing O-rings 358 as best seen in FIG. 40. One of these outer rings 344 has threaded holes for the outer bolt pattern, and the outer ring 346 has clearance holes. The inner ring 348 has clearance holes as well, and also has a pair of radial inlet and outlet holes 366 and 368, as seen in FIG. 39. This inner ring 348 is kept thin, so that the edge seal O-rings 358 are as close together as possible; this will minimize the amount of the polydimethysiloxane (PDMS) that cures at the edges of the stamp 54.

Applying vacuum in the mold cavity 351 causes a pressure differential across the glass discs i.e., the master backing 350 and the stamp backing 158. This results in deflection of the discs inward, which will then cause underfilling of the mold and nonuniform stamp thickness. The addition of a pair of outer guarding chambers 370 eliminates this problem. By creating vacuum chambers, the outer guard chamber 370 outside of the molding cavity, the pressure differential across the master backing 350 and stamp backing 158 is eliminated. This is accomplished by fixing the two polycarbonate discs 342 to the outer faces of the outer rings 344 and 346, which are sealed using O-rings 358. Vacuum is drawn on these chambers 370 each through a guarding pressure inlet 372, whenever it is drawn on the mold cavity 351, thus ensuring zero deflection of the master and stamp backings discs.

In order to create airtight seals at the inlet and outlet holes 366 and 368 for filling as addressed below, a vacuum fitting 374 with a plate 376 and a tubing 378 is secured to the outer rings 344 and 346 by a plurality of clamp bolts 380. A small O-ring 382, in a preferred embodiment 1/16 inch inner diameter and 1/16 inch cross-sectional diameter is clamped around the diameter of the tubing 368. By compressing the small O-ring 382 axially, the O-ring 382 is forced to expand radially inward as well, thereby creating an airtight seal between the tubing 378 and the hole 368. The upper radial inlet and outlet hole, the vacuum port/parting fluid inlet 368 is shown in FIG. 40. The lower radial inlet and outlet table, the PDMS fluid inlet 366 has a similar arrangement.

In a preferred embodiment, the tubing 378 is a short length of PEEK (polyetheretherketone) tubing. PEEK was chosen because it is inert with respect to PDMS, compliant enough so that it may be externally clamped, and inexpensive enough that it is disposable.

Still referring to FIG. 40, to space the stamp backing and master apart from each other, a micron thick precision shim stock 386 is used. It is recognized that sophisticated methods can be implemented for setting this gap, but shim stock 386 is sufficient. Three small pieces of shim 386 are sandwiched between the stamp backing and the master, oriented 120° apart near the perimeter of the discs.

This edge-sealing method as described above has several benefits including it allows PDMS to be introduced radially into the gap between backing and master, thereby eliminating the need to modify the master by drilling holes; it provides automatic centering of the stamp backing and master; and there is no limitation on the minimum gap size.

The O-rings have a 1/16 inch cross-sectional diameter such as made of Vitron™, which it is unreactive with PDMS, and does not inhibit curing as do some other materials. The inlet and outlet design are provided by two radially-oriented holes, 180° opposite each other. One of these is the inlet hole, through which the PDMS enters the mold; the other is the outlet, from which vacuum is drawn to evacuate the chamber. In that it is desired to have the stamp 54 have a 100 microns thickness, the inlet and outlet sizes need to be very small. In a preferred embodiment, the holes are 1/16 inch holes, which allow the use of high-pressure liquid chromatography hardware.

To space the stamp backing and master apart from each other, 100 micron thick precision shim stock is used.

The stamp backing and master are forced together with the use of elastomeric elements. Small blocks of rubber are used to provide a preload; these are located so that the lines of force are through the shim spacers as seen in FIG. 40. The whole assembly is clamped together with a series of bolts encircling the discs.

The mold is vertically oriented, and the PDMS elastomer is drawn into a mold cavity using vacuum. The mold chamber 340 apparatus permits control of the mold filling, and also enables a parting method by which stress applied to the stamp bulk is minimized as described below.

The master backing 350 that is used for generating the micron-scaled features were made using conventional photolithographic processes.

Figure 41:
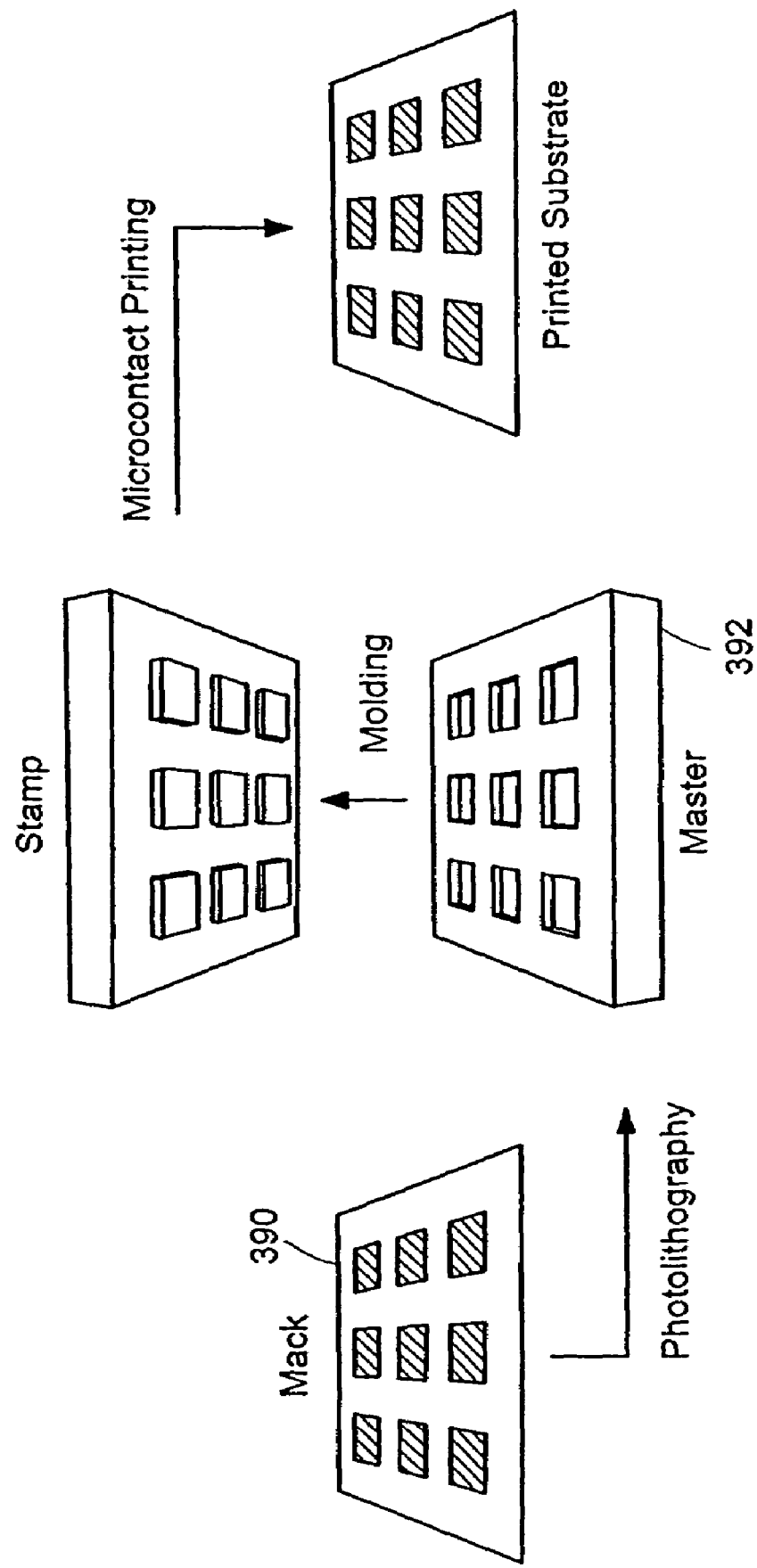
FIG. 41 is a representation creating a printed pattern from a mask through a master.

The master backing 350 contains the pattern that will be replicated and patterned. The stamp 54 will contain the mirror image of the master pattern, and the substrate, once stamped and etched, will bear features having the same orientation as the master. This aspect of the molding and pattern transfers process is useful, for it makes it possible to use masters generated by standard photoligthographic processes without any modifications of the designs. FIG. 41 shows the elements involved in going from a two-dimensional mask pattern to a two-dimension microcontact-printed pattern.

Masters are typically generated using standard photolithographic processes. In brief, the key components are a substrate coated with a layer of photoresist, a mask containing the pattern to be replicated, and a mask aligner with a light source.

Substrates commonly used in photolithography for semiconductor manufacturing are silicon wafers, often ranging in diameter from 75 to 300 millimeters, and in thickness from 100 microns to over a millimeter. We selected an existing substrate size of 125 millimeter for stamp generation. The dimension is larger than the diameter of the stamped substrate 58 which is 100 millimeters.

In that a transparent (glass) substrate is being used for the stamp backing 158 in one embodiment, it is necessary to coat the surface, in order to prevent internal reflection from causing unwanted crosslinking of the resist during the exposure step. A thin (100 Å) layer of gold on the surface of the glass is applied, after a 15 Å layer of adhesion-promoting chromium to eliminate the internal reflection problem.

A design is first generated in software, which satisfies the design rule governing the smallest feature size achievable. If the smallest features are large relative to the state of the art in mask-making (pattern-generation) technology (for example, on the order of 20 microns), a rapid prototyping method detailed in *Angewandte Chemie, International Edition*, English, (1998) by Younan Xia and George M. Whitesides on pages 550-575, the entire contents of the which are incorporated herein by reference in entirety, makes use of a commercially available software package such as Freehand® sold by Macromedia, 600 Townsend St., San Francisco, Calif. 94103 and a high-resolution laser image setter (or dye-sublimation) printer. By printing the desired pattern on a transparency, a mask 390 can be created that may be used in a conventional photolithographic aligner.

High-resolution mask generation can be the most expensive component of the stamp generation process. Fortunately, once a chrome or nickel mask is made, replicas may be made for a very small additional cost.

Once the mask 348 has been prepared, the next step involves preparing a master 392 for exposure. The substrate 350 for the master 392 is chosen to match the stamp backing 158, in order to maintain thermal and mechanical compatibility. This substrate 350 is coated with a layer of photoresist. An even coat is achieved through use of a spin-coater, which spreads the resist across the substrate surface by spinning at a speed on the order of thousands of revolutions per minute. The thickness of the layer can be controlled through the choice of the rest and the rotational speed. In a preferred embodiment, SU-8, a negative resist crosslinking occurs where the resist is exposed was used. It is important to control the thickness of the resist layer, as this will define the height of the features of the stamp. Since in a preferred embodiment the desired stamp features have a maximum 1:1 aspect ratio (the ratio between the height and a lateral dimension), the master 392 must be designed to have a maximum depth-to-lateral dimension ration of 1:1. This aspect ratio is typical for the elastomeric stamps used in microcontact printing, since features that are significantly taller than they are wide tend to buckle easily, thereby distorting the pattern during printing.

After the resist has been spread on the substrate, a pre-bake protocol is used to evaporate some of the solvent in which the resist polymer is delivered. This involves ramping up the substrate temperature to 125° C., holding it at this temperature for 10 minutes, and then allowing the substrate to cool back down to room temperature. It is very important to allow enough time for the ramping of temperature upward and downward, to minimize the thermal stress to which the substrate and the photoresist film is exposed.

Following the pre-bake process, the substrate 350 and mask 390 are placed in the mask aligner. The light source is turned on for the exposure for a specific duration, and then turned off. The substrate is removed, and subjected to a post-bake process. This is similar to the pre-bake, and serves to evaporate the remaining solvent and cross-link the exposed regions. After this, the substrate is developed in a bath of PGMEA (propylene glycol monomethyl ether acetate), which removes the un-crosslinked resist. At this point, it is evident if the pattern has transferred correctly. The master is then dried in a stream of nitrogen gas.

The final treatment of the master required before molding is the silanization process. This step ensures that the elastomeric polymer will not cross-link with the master during the molding. A small volume of (1,1,2,2-tetrahydroperfluordecyl) trichlorosilane, evaporated in a chamber with the master, lowers the surface energy of the master and makes the surface unreactive with the elastomer components. Another option for achieving this non-stick quality is the sputtering of a thin layer Teflon™ on the master as described in "Conformal contact and pattern stability of stamps used for soft lithography" by Alexander Bietsch and Bruno Michel *Journal of Applied Physics,* 88(7):4310-4318, October 2000 which is incorporated herein by reference in entirety.

The stamp backing and master are forced together with the use of elastomeric elements. Small blocks of rubber are used to provide a preload; these are located so that the lines of force are through the shim spacers 386 as seen in FIG. 40. The whole assembly is clamped together with a series of bolts encircling the discs.

The mold process takes about two days from start to finish. Generation of the master takes a half-day, beginning with photolithography and ending with the silanized master pattern in photoresist, on a glass disc.

Figure 42:
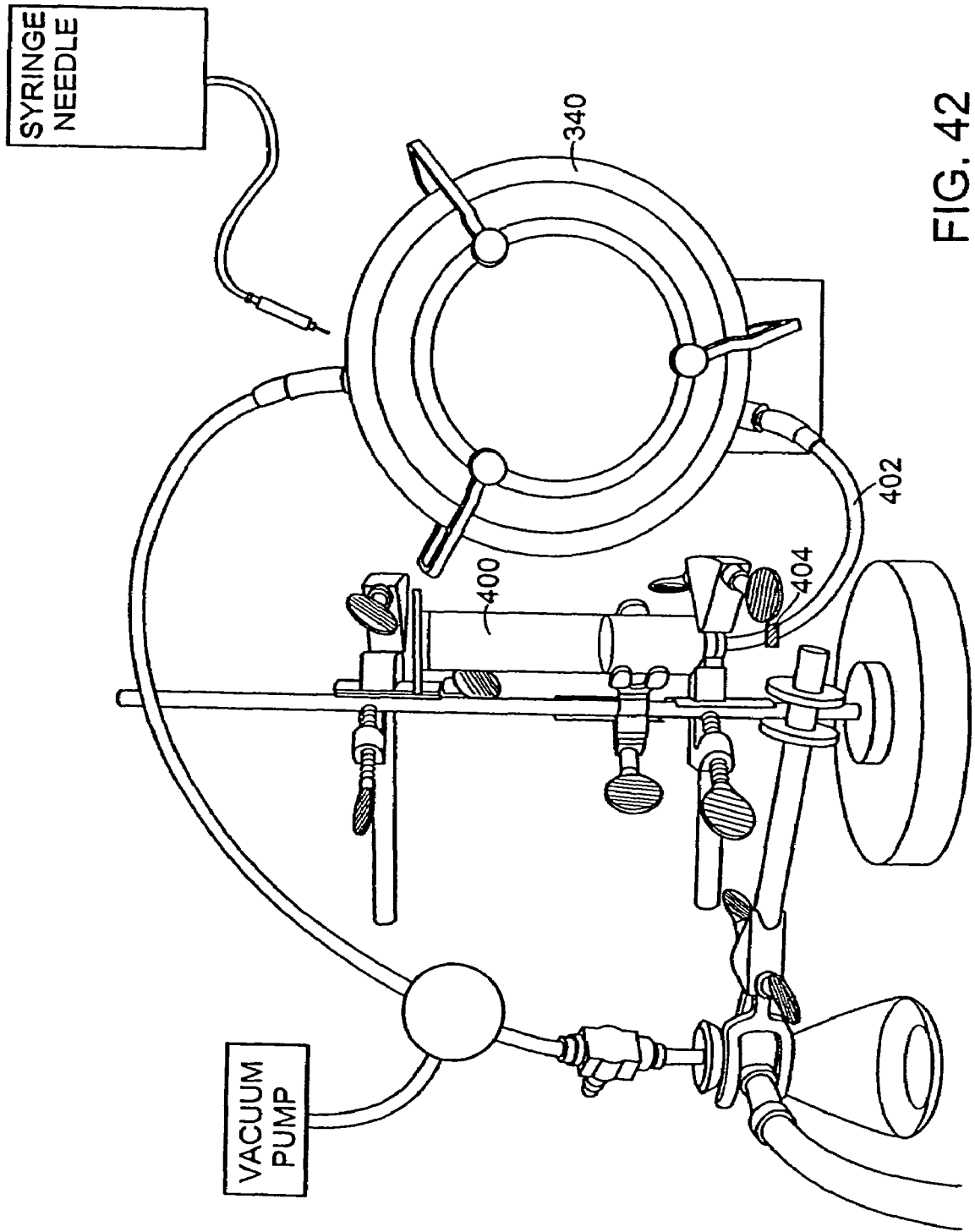
FIG. 42 is a perspective view of the molding apparatus.
Figure 43A:
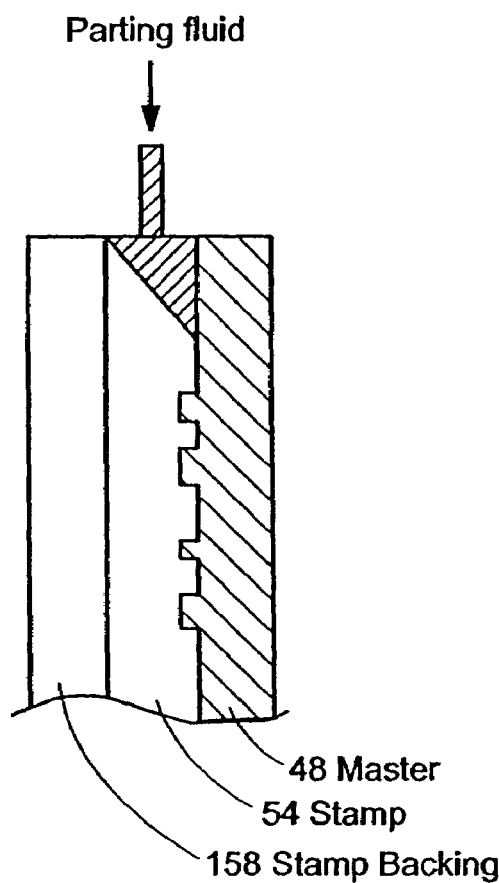
FIGS. 43A-43D are schematic views of stamp-master printing.
Figure 43B:
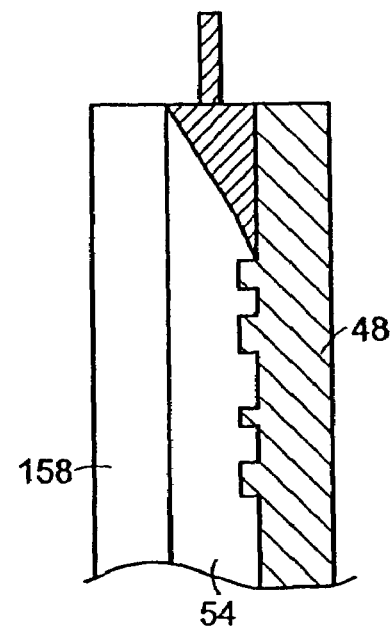
Figure 43C:
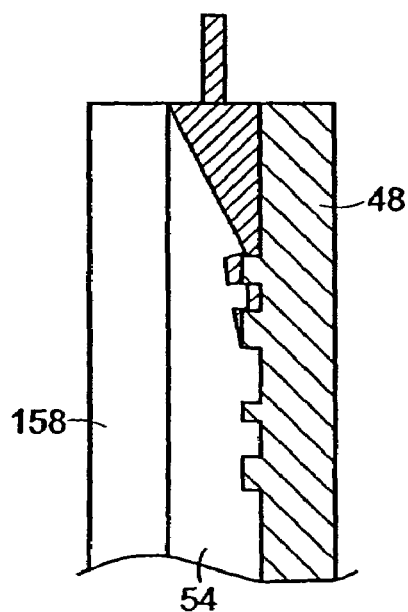
Figure 43D:
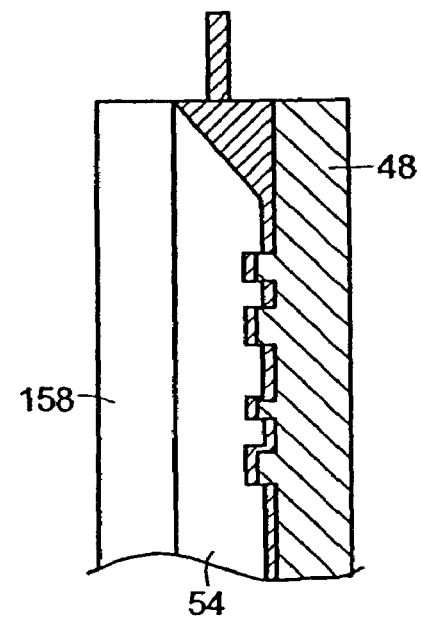
Figure 44B:
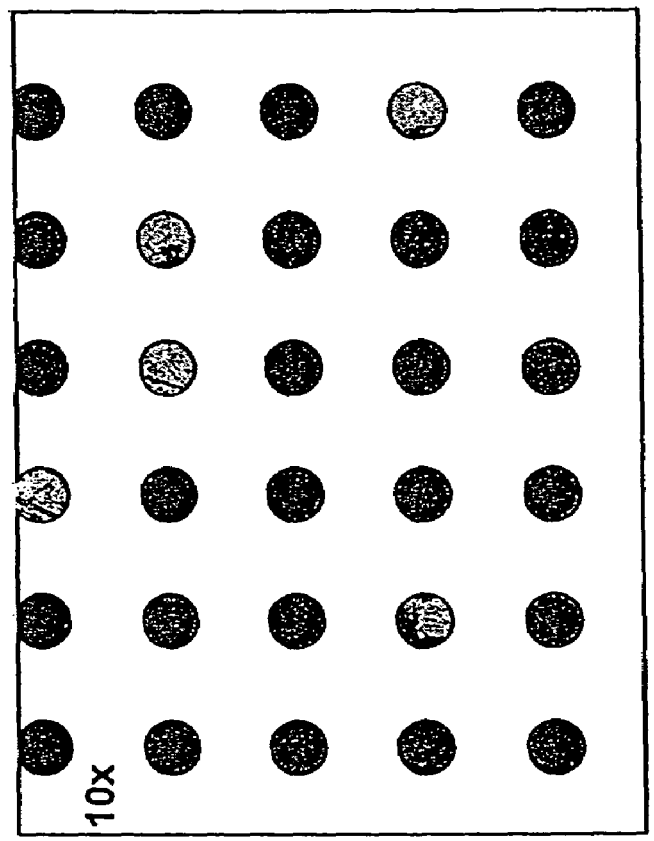
FIGS. 44A-44F photographs showing defects in dots on the PDMS in various magnifications hereinafter referred to as FIG. 44.
Figure 44A:
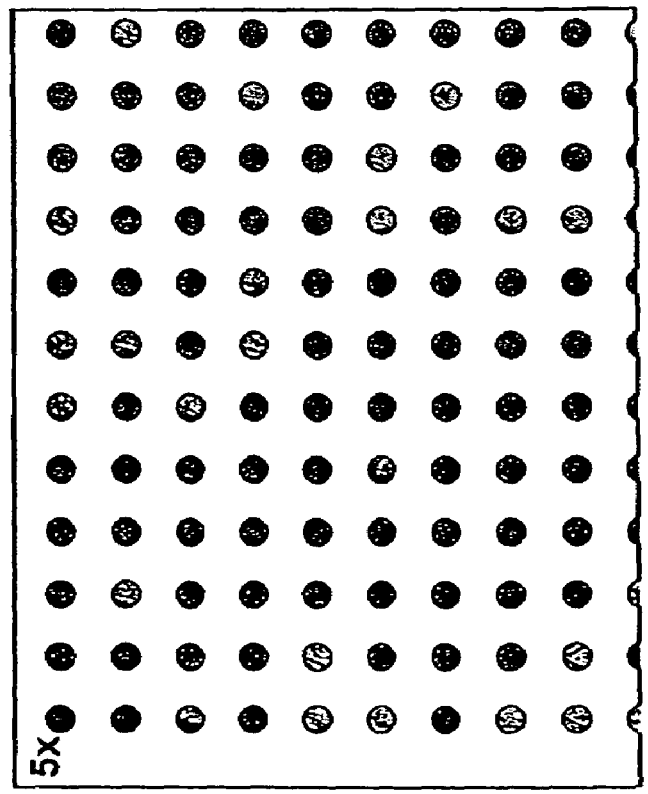
Figure 44D:
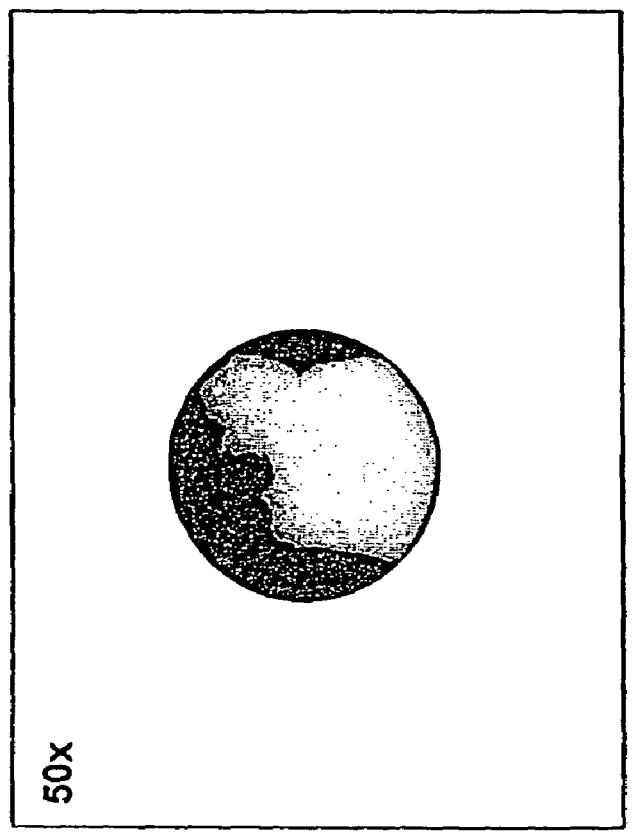
Figure 44C:
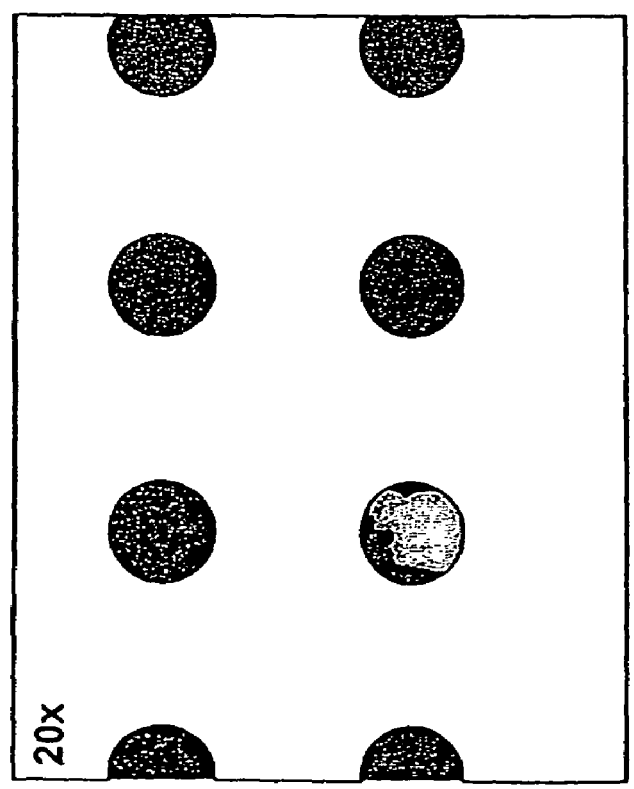
Figure 44F:
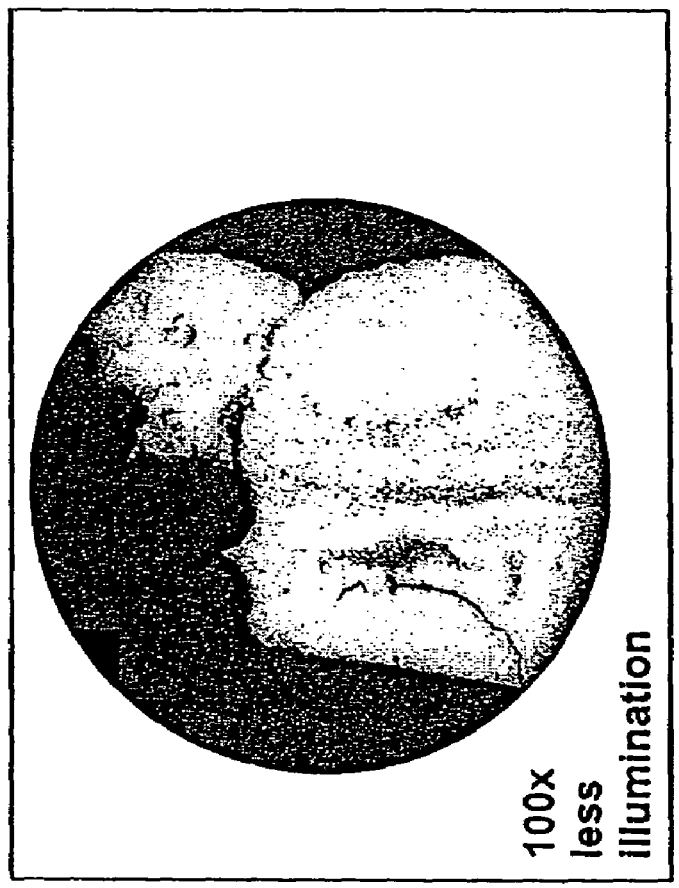
Figure 44E:
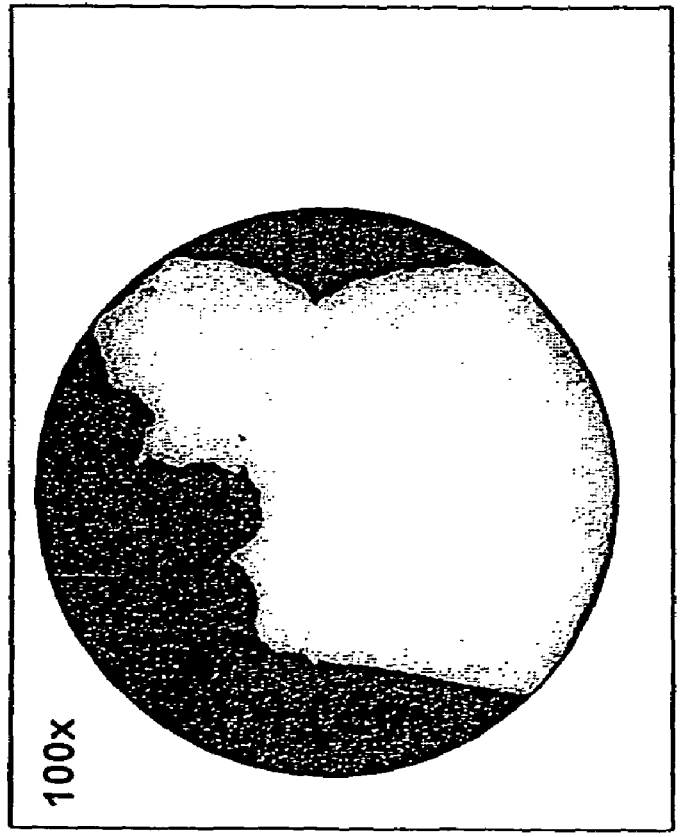

First, polydimethylsiloxane (PDMS) is mixed and degassed. It is poured into a delrin reservoir as seen in FIG. 42. The reservoir 400 has an outlet tube 402 which is clamped closed by a clamp 404. Next, a vacuum pump is turned on, evacuating the mold cavity 351 as well as the outer guarding chambers 370. Once this step is complete, the clamp 404 is opened, permitting PDMS to flow into the cavity 351. This filling is very gradual, since the inlet hole interfaces with the gap between the stamp backing 158 and the master 350: the effective smallest cross-section is therefore approximately (gap width)×(inlet hole diameter). For an 100 μm gap width, this gives an area of just 0.16 mm².

As the PDMS fills the mold, the fluid level is watched carefully, so as to ensure that the mold cavity 351, as seen in FIG. 40, is not overfilled. There must remain enough unfilled volume at the top of the mold cavity 351 to allow a parting fluid to be introduced in the correct manner as described below. Once the correct level is reached, the clamp 404 on the PEEK tube is again closed, this time near the inlet tube 366 of the mold chamber 340. In a preferred embodiment, filling was stopped when the filling front is about 0.5 cm from the top of the cavity 351, giving a parting line that is about 5 cm long. At this point, the stamp 54 is left to cure at room temperature for at least 24 hours. Curing at elevated temperature also causes thermal stresses in the stamp.

To part the stamp 54 from the master without creating high stresses throughout the bulk of the PDMS, a parting force is applied at the interface of the stamp 54 and the master 48, as seen in FIGS. 43A-43D. Using this method, the forces on the bulk are small, and stresses that could distort and otherwise damage the stamp are minimized. FIGS. 43A-43D illustrates the parting front concept.

The parting procedure is as follows. After enough time has elapsed for the stamp 54 to cure completely, the PDMS inlet tube is removed from the bottom of the mold chamber 340. This will allow an exhaust path for the fluid after the parting front has propagated through. Next, the vacuum tube is disconnected from the top part of the mold chamber. The syringe needle is installed at this top inlet, and secured with the sealing clamp. At this point, the syringe fitting may be connected to the syringe needle, and pumping can commence. During the pumping, the intake tube of the auto-filling stage for the syringe pump must be immersed in the parting fluid solution (≈50% isopropanol, 50% water by volume). It is important to carefully monitor the presence of fluid in the mold chamber; a parting front will be visible solely due to the difference in the index of refraction of the fluid relative to the PDMS and the glass. This visibility can be improved by adding a small amount of water-based dye (such as food coloring) to the parting fluid prior to pumping.

Once the parting front has propagated across the interface of the stamp and the master, fluid will exhaust from the bottom port of the mold chamber. This is a clear indicator that the paring is successful. However, care must be taken to watch for the interface as well; cured PDMS may block the exhaust port, and this could cause overpressurization of the chamber. If a significant volume of fluid has been pumped in but has not exhausted from the bottom, it is best to reduce the pressure in the chamber by disconnecting the syringe from the needle, and then repeat the process.

After the parting front propagates across the interface, the mold assembly should be disassembled. The stamp 54, affixed to the stamp backings 158, can be removed and dried in a stream of $N_2$ gas.

In a preferred embodiment, the stamp 54 is stored in a large petri dish; before use, any dust or particulate contamination are lifted with adhesive tape, and the stamp 54 is rinsed in ethanol.

Referring to FIG. 42, to improve the parting behavior as well as provide a mounting fixture for the molding assembly, the mold chamber 340 is held at an angle during curing, so as to orient the slope downwards toward the master. This helps during the parting since the pressurized fluid would flow preferentially toward the stamp-master interface, and thereby reduce the chance of undesirable parting phenomena between the stamp and its backing.

The following examples further illustrate the present invention but, should not be construed as in any way limiting its scope.

Gauging the performance of apparatus and process was done as part of testing. The variety of influential parameters is enormous, ranging form environmental factors such as humidity and cleanliness to actual machine performance metrics like accuracy and smoothness of motion.

The accuracy of pattern replication between the master 48 and printed the pattern is dependent on the success and quality of the stamp 51 generation process. Before attempting to characterize printed patterns, it is critical to visualize the stamp quality. High-resolution images of the entire stamp face are a great asset, especially if specific locations could be recorded and catalogued for future comparison to printed patterns. The use of fiduciary marks aids in this kind of metrology.

While a step-and-scan CCD camera with high-quality objective lenses and image meshing software can be an excellent tool for metrology of both the stamp and the printed patterns, a conventional microscope, for which the largest field of view is 5.5 mm by 4.2 mm was used in this example. The CCD camera providing a resolution of 640 by 480 pixels was used.

In one set of testing, the stamp 54 was created that had defects. Based on images taken across the whole stamp area, the general trend is a greater defect density toward the bottom of the stamp. It is likely that these defects originate during the stamp generation process, either during the mold filling or the parting. During the mold filling, it is possible that air bubbles become entrained in the PDMS. Since the air bubbles are near the bottom of the mold chamber, the vacuum pulled at the top was insufficient to draw the air bubbles out.

Alternatively, the defects may originate during the parting, when a pressurized stream of fluid is forced between the stamp and the master. Based on an image of a defective region as seen in FIG. 44, it seems as though tearing may have occurred, although whether this may be in combination with trapped air bubbles is uncertain. The presence of trapped air bubbles could lead to the formation of thin sections, which could be torn during the parting step.

Figure 45:
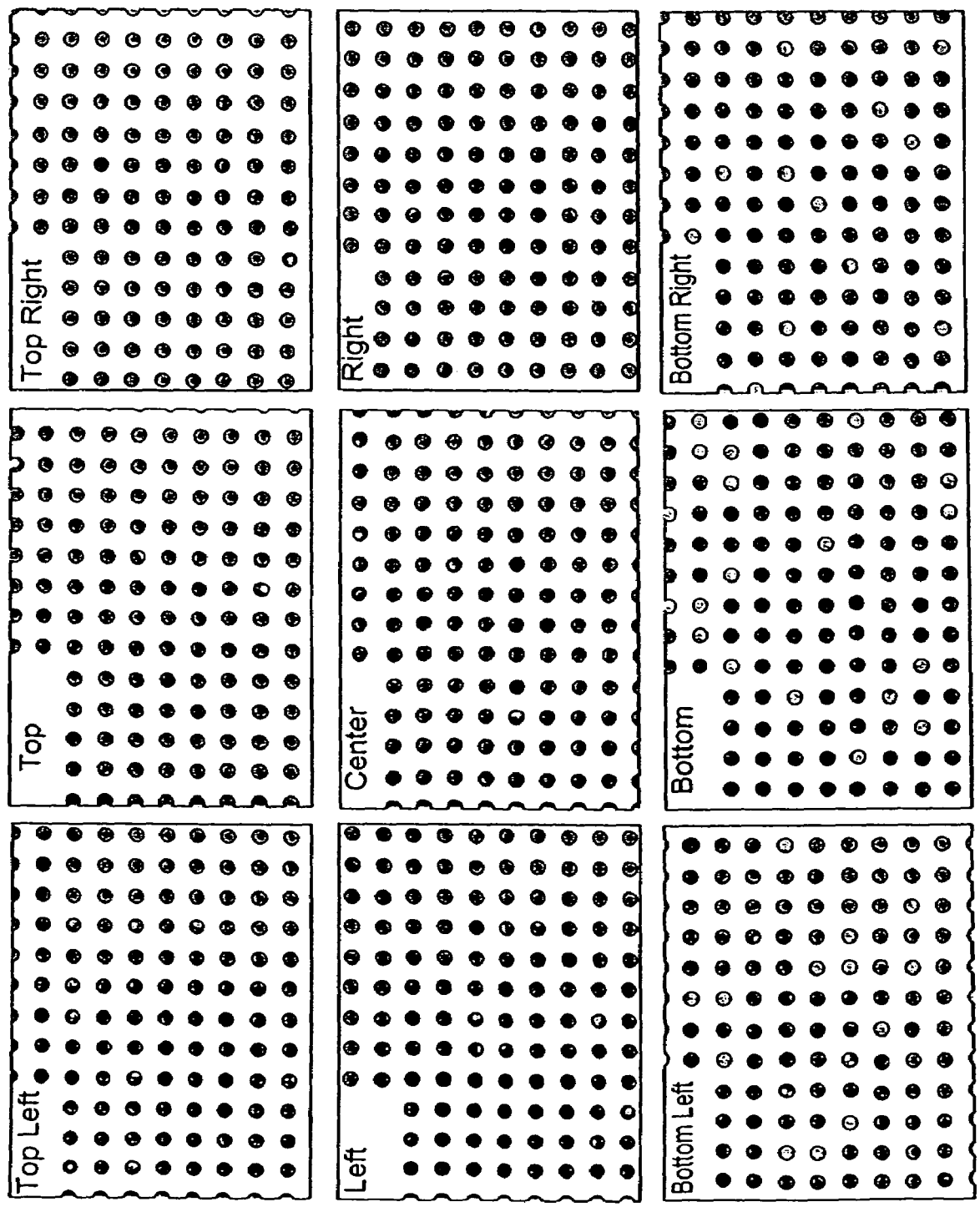
FIG. 45 is a photograph in segments of dot in the PDMS at a magnification of the stamp.
Figure 46:
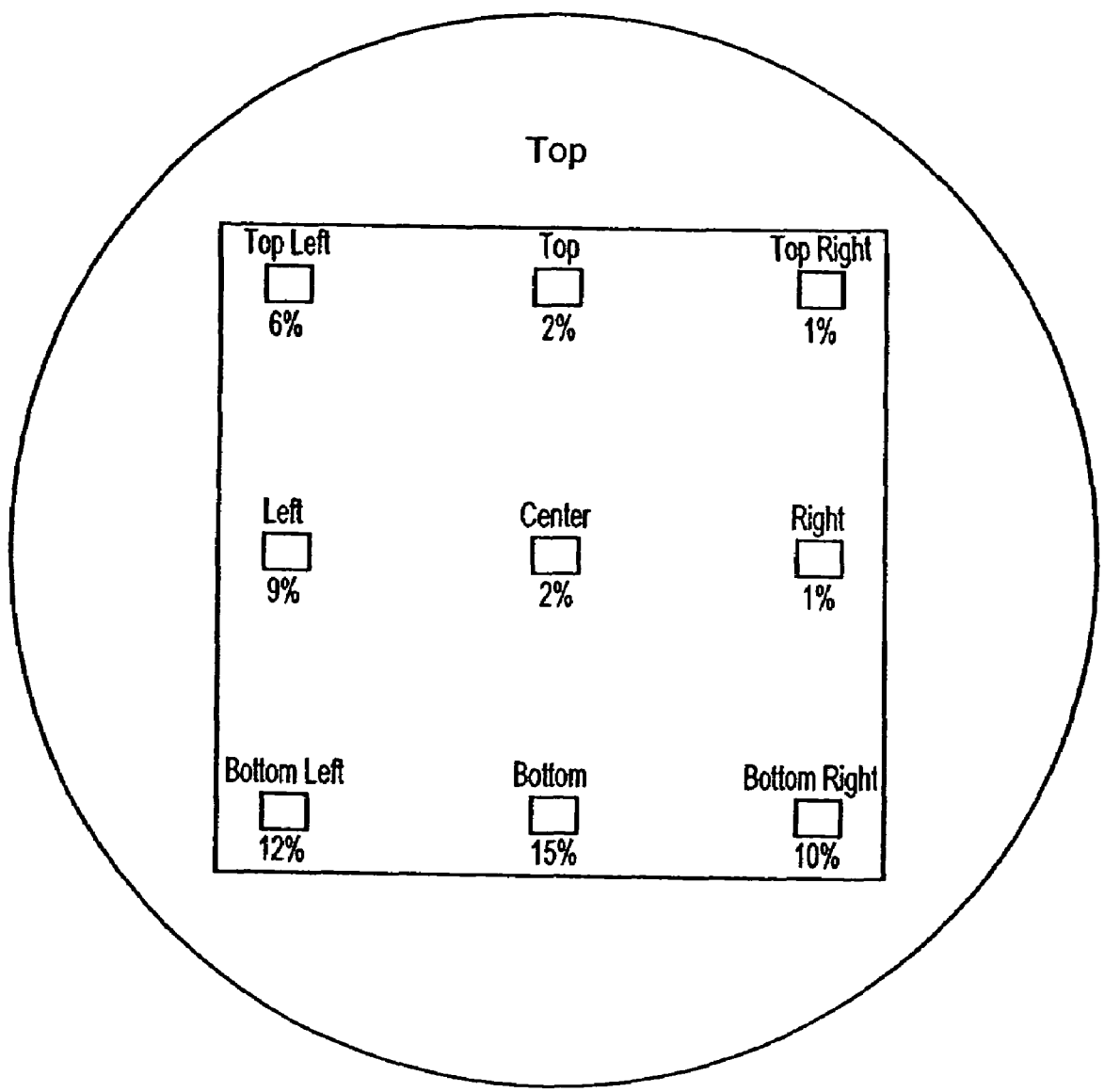
FIG. 46 is a representation of where the photographs of FIG. 45 were taken and the associated defect route.
Figure 47B:
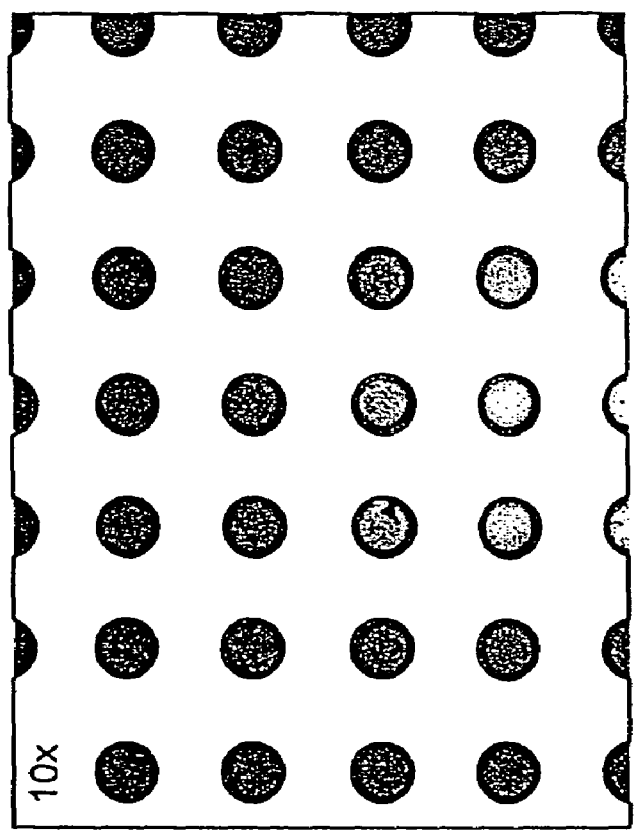
FIGS. 47A-E are photographs showing dots in the PDMS at magnifications from 5× to 100×.
Figure 47A:
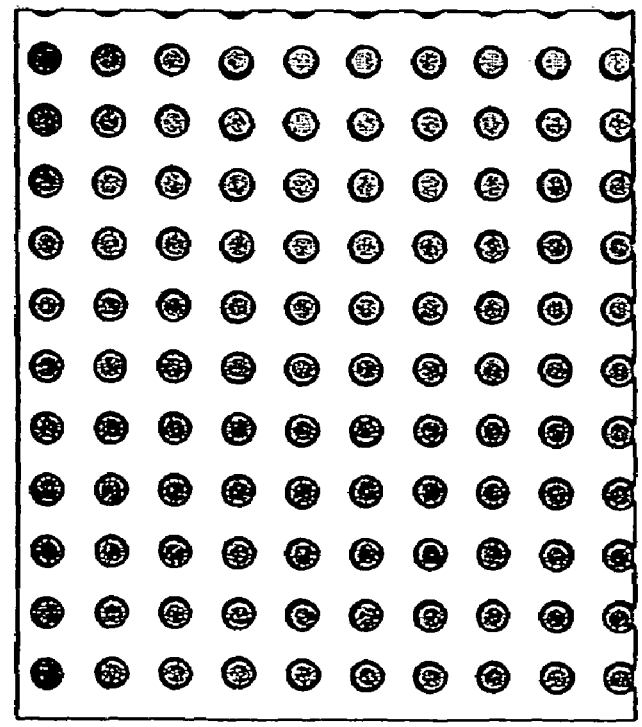
Figure 47D:
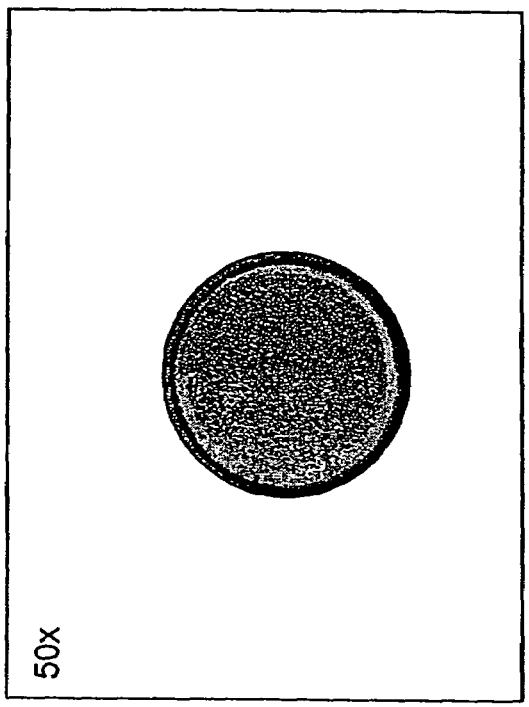
Figure 47E:
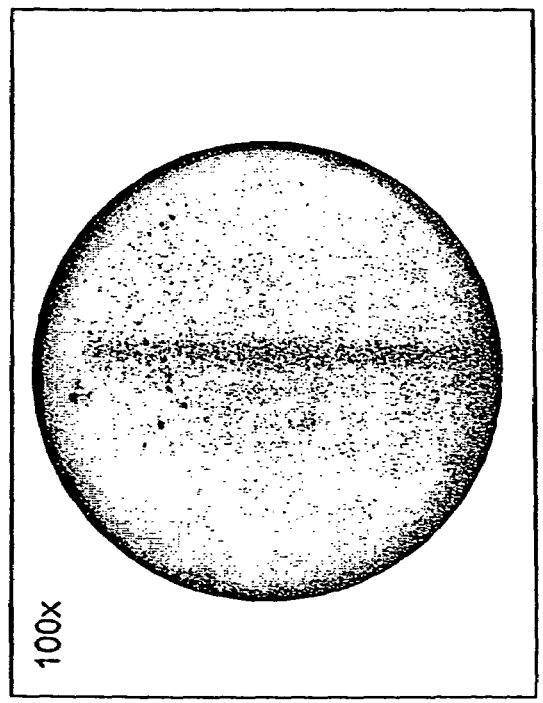
Figure 47C:
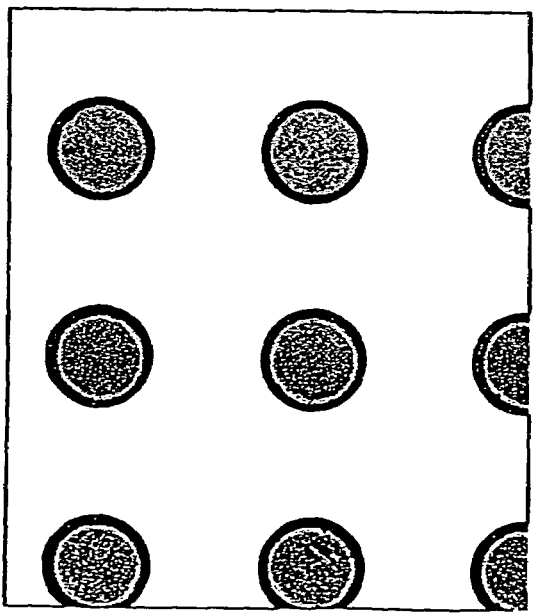

FIG. 45 show images of the stamp bearing dots, and a composite image of several locations on the stamp face, taken across the area of the dotted stamp. FIG. 46 shows where on the stamp the images were taken: "Top" refers to the top part of the stamp during the stamp generation step. FIG. 46 also shows the approximate defect rates associated with each of the positions.

The problem of molding was corrected by several steps such as use of higher quality fittings at the PDMS inlet can help to alleviate the problem of air bubble introduction during the molding step. FIGS. 47A-47E shows images of the stamp bearing dots. The dots are a pattern of 100 micron dots spaced on a 200 micron pitch.

The second master was generated to determine short-range characteristics, such as feature resolution and quality. This master bears a pattern of 100 μm dots, on a 200 μm pitch. A chrome mask is used to achieve finer resolution of features, while the master is created using the same mark aligner. The smaller features makes it necessary to use a thinner layer of photoresist, in order to maintain the required 1:1 aspect ratio.

However, the defective stamp 54 shows the quality of the printing. There are several schemes that are commonly used for characterizing microcontact printed patterns. Minimizing the post-processing is desired. This is desirable in order to assess the quality of the stamping alone, without the influence of other external parameters and processes. Novel techniques such as chemical AFM (CAFM) enable this kind of metrology, but require special equipment (an atomic force microscope with specially treated tips).

Other possible detection and metrology means that were considered include the use of fluorophore-terminated SAMs. Using this special ink, microcontact printed patterns can be visualized using standard fluorescent microscopy techniques.

Conventional (non-SAM) fluorescent inks were used to gage contact uniformity. In addition, standard post-processing printing and etching were used in conjunction with optical microscopy to visualize the printed patterns.

A testing phase involved automating the stamping process, microcontact printing SAM patterns, and characterizing these patterns. The automation software as discussed above gives the user access to key stamping parameters for real-time observation and manipulation.

For the first validation test using the automated system, the fluorescent ink was used again. While this does not give high-resolution patterns, it is an excellent means of quickly evaluating the success of the stamping. A visible ink would be even better, but since the fluorescent microscope access is just as convenient as brightfield microscope access, the fluorescent ink is sufficient.

After the validation tests, the next step was to pattern a SAM on a substrate. For this, it was necessary to prepare the substrates for microcontact printing. 100 mm diameter, 500 micron thick silicon wafer was selected as the base for a substrate. To make the surface compatible with the formation of SAMs, a layer of about 500 Å silver was evaporated on the substrate, using an Edwards thermal evaporator. Prior to this, a 15 Å thick adhesion promotion layer of chromium was evaporated on the substrate.

Silver was chosen for the metallization layer because the etch time required for silver is significantly less than that for gold. Additionally, the time required to etch gold typically has the effect of amplifying defects in the packing of SAMs as described in "Microcontact printing of alkanethiols on silver and its application in microfabrication," by Younan Xia, Enoch Kim, and George M. Whitesides, in *Journal of the Electrochemical Society*, 143 (3): 1070-1079, March 1996, the entire contents are incorporated herein by reference in entirety. Since silver oxidizes rapidly when exposed to air, the stamping tests were performed on the day that the metal was evaporated.

After fixturing a test wafer in the substrate chuck and performing the calibration, stamps were inked with a solution of hexadecanethiol (also known as hexadecyl mercaptan) in ethanol.

Inking technique plays a very significant role in determining the quality of the microcontact printed patterns. Errors in technique can lead to serious defects. One of the reasons for such defective patterns is that concentration of ink is not properly known. Another reason for such defects is not properly drying the ink after applying it.

The appropriate concentration of ink is critical because an excess of ink can crystallize on the stamp surface, thereby inhibiting the formation of SAMs in those regions. For the same reason, proper drying is also key: typically, a stream of gas is used to force off excess solvent. Insufficient ink will also result in defects, which are seen in poor packing and coverage of SAMs on the substrate surface. In testing, a 5 mM ink solution of hexadecanethiol in ethanol was used. The ink was applied on the stamp with a swab, and then evaporated off the ethanol in a stream of nitrogen gas.

In performing stamping experiments, an etchant solution was prepared as described below. This allowed visualization of the results of each stamping impression before performing the next.

The calibration step was performed using the same test wafer each time. As part of the stamping trials, the deflection command was adjusted, that is the magnitude of which is proportional to the stamping pressure. When insufficient deflection was commanded, the pattern transfer would occur non-uniformly, but without any bias toward a particular side or quadrant of the substrate. This indicated that the approach angle (the pose-matching) was successful.

Range of deflection values were tested with both the cross-patterned and dot-patterned stamps. Using either stamp, fully-patterned substrates were produced at deflections of 1.5 mm, which corresponds to a 40 N force. For the cross-pattern, the fill-factor was about 9%, while for the dots it is nearly 20%. The stamping pressures associated with these impressions are therefore on the order of 60 and 35 kPa, respectively. It is recognized that these pressure values are by no means optimum.

After stamping each substrate, the etching procedure was immediately performed, in order to determine whether the stamping and SAM generation was uniform. Depending on which areas of the substrate are patterned, it can determine whether the planar alignment is correct, and also whether the stamping pressure is sufficient. Generally, incorrect alignment results in unpatterned sectors, while insufficient pressure causes faint patterns or unpatterned regions across the whole wafer area.

For the etching of silver, an etchant composed of potassium ferricyanide, potassium ferrocyanide, and sodium thiosulfate, in a solution of water was used. The concentrations of the three chemicals were 0.005M, 0.0005M, and 0.05M, respectively. The effectiveness of the etchant begins to diminish after about one hour, so time was an important consideration during the stamping trials.

Figure 48:
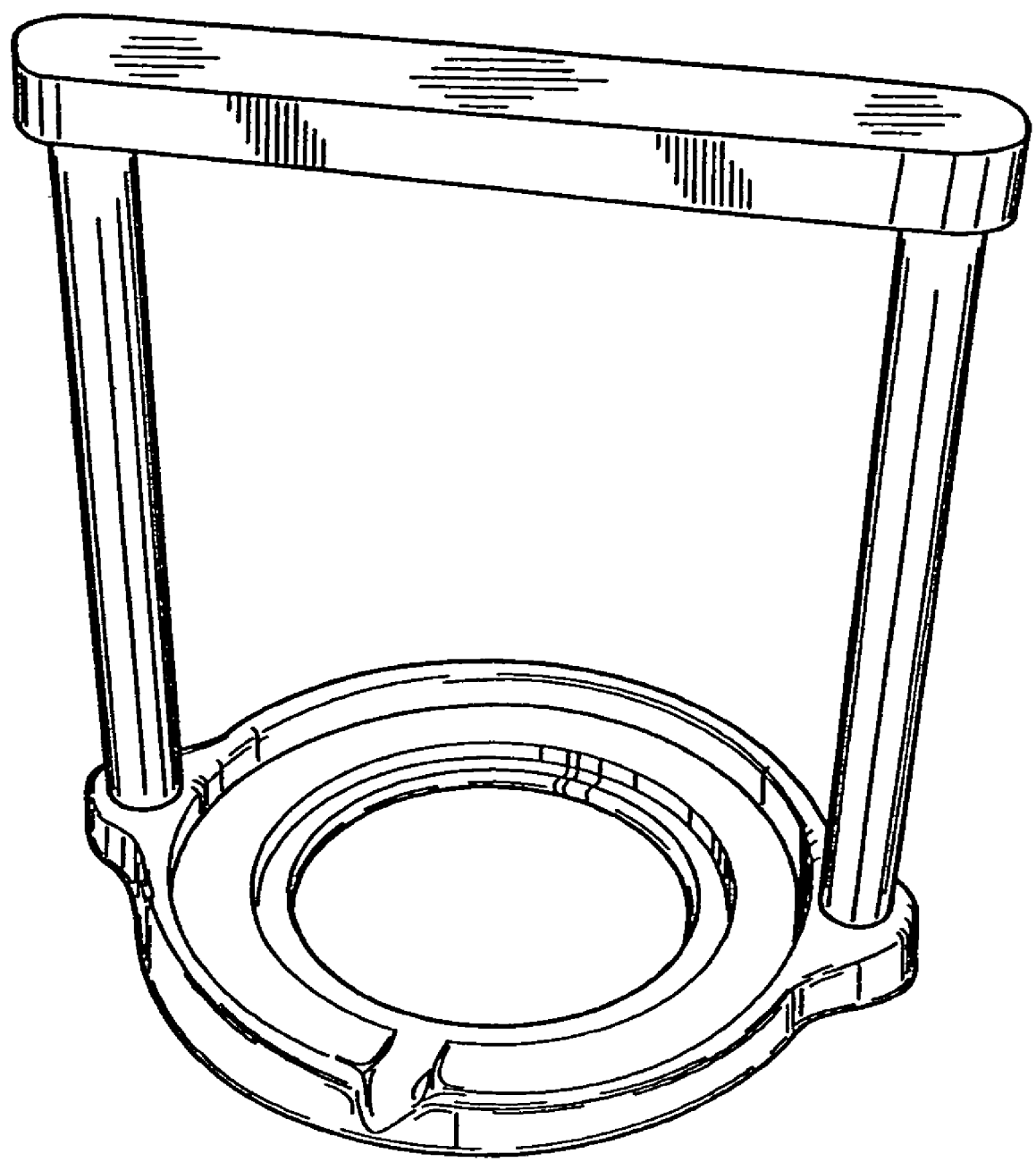
FIG. 48 is a perspective view of a wafer holder for etching.
Figure 49B:
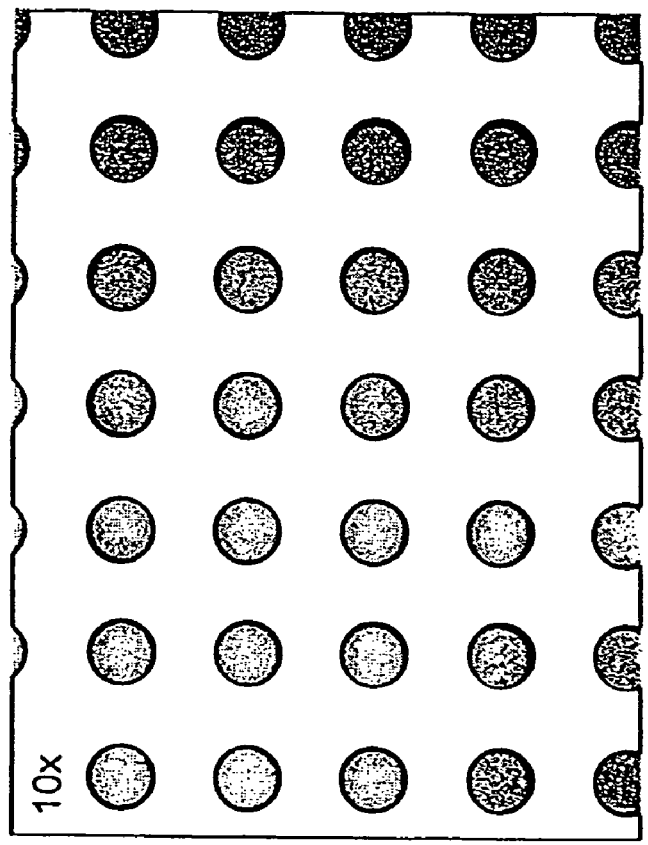
FIGS. 49A-49E are photographs of silver dots on silicon at various magnifications.
Figure 49A:
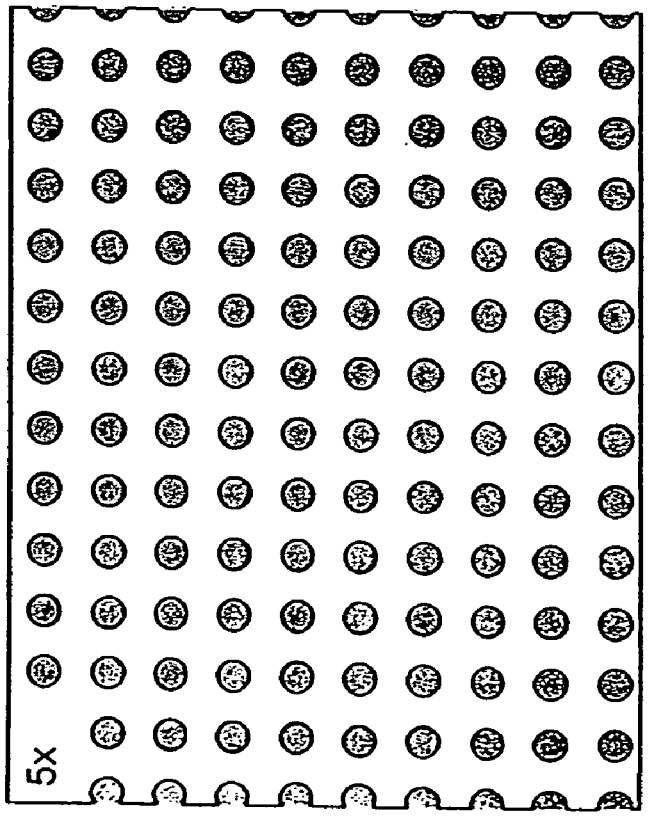
Figure 49C:
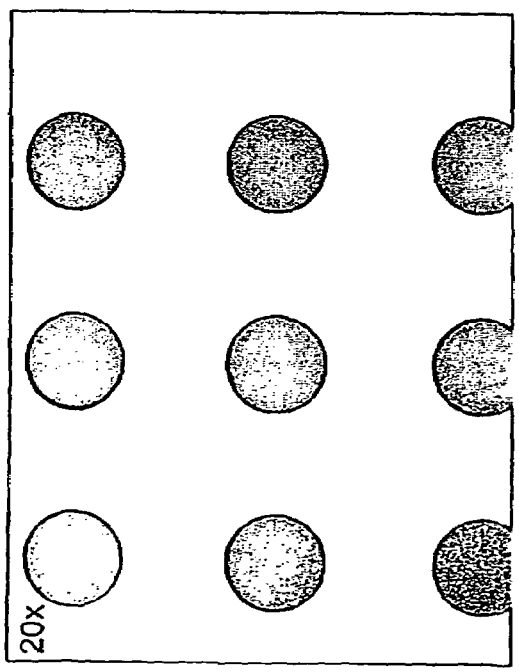
Figure 49D:
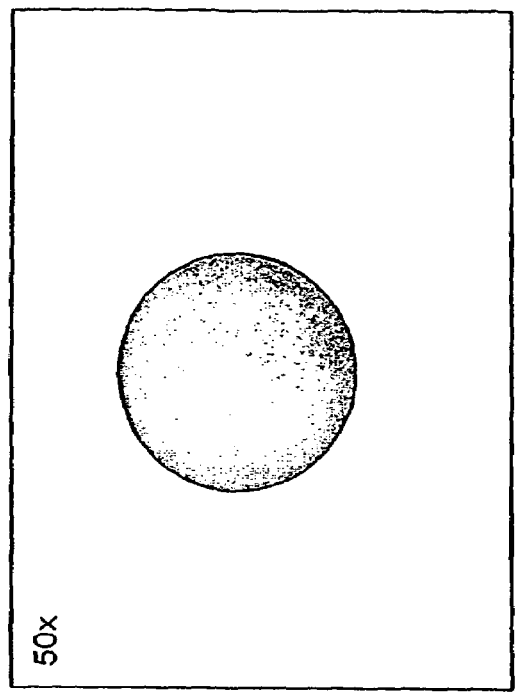
Figure 49E:
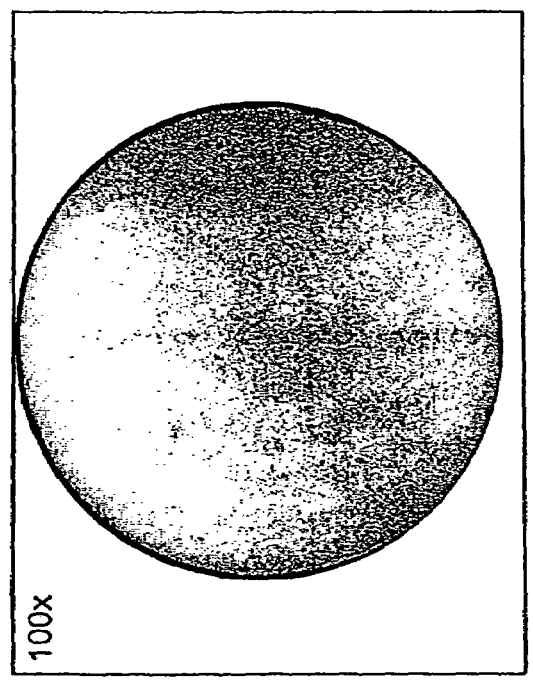
Figure 50B:
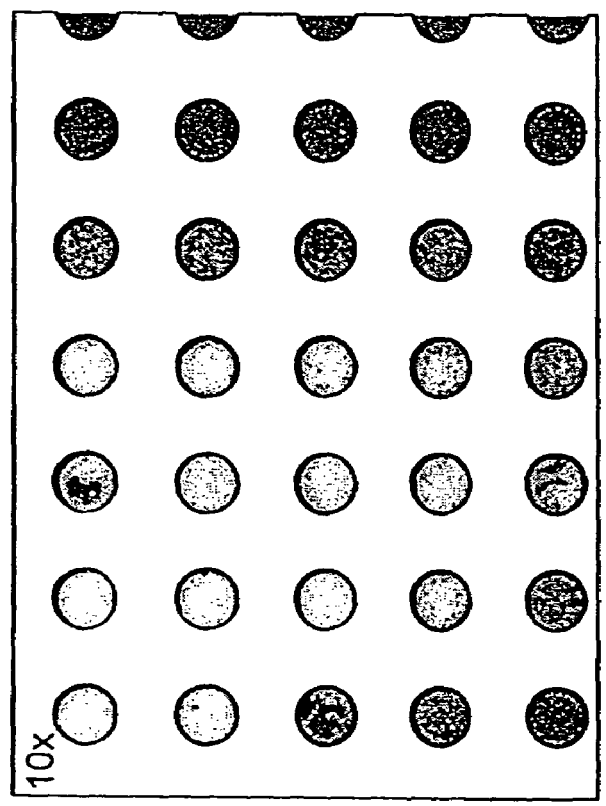
FIGS. 50A-50E are photographs of silver dots on silicon showing defects at various magnifications.
Figure 50A:
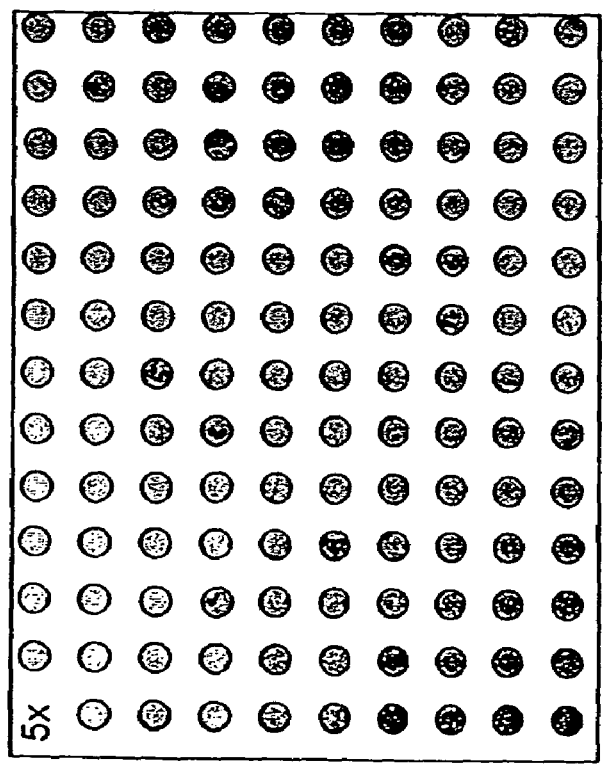
Figure 50D:
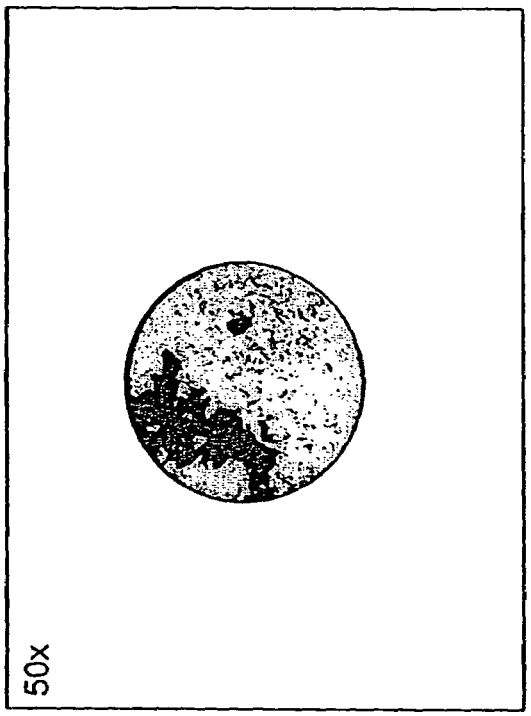
Figure 50E:
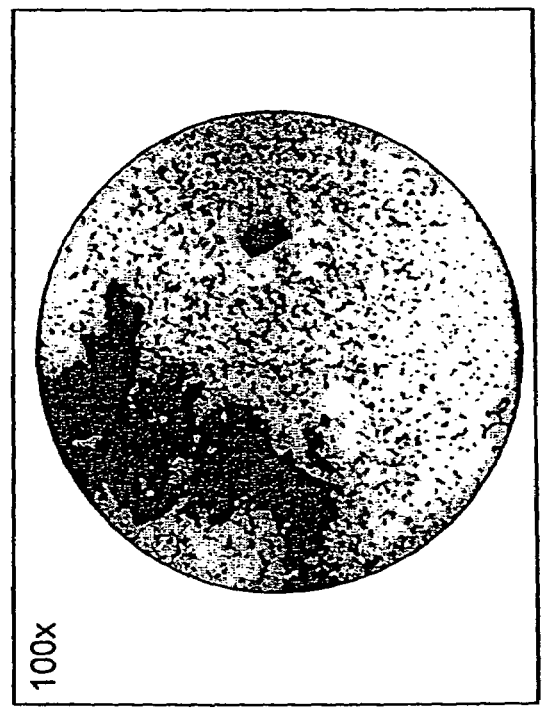
Figure 50C:
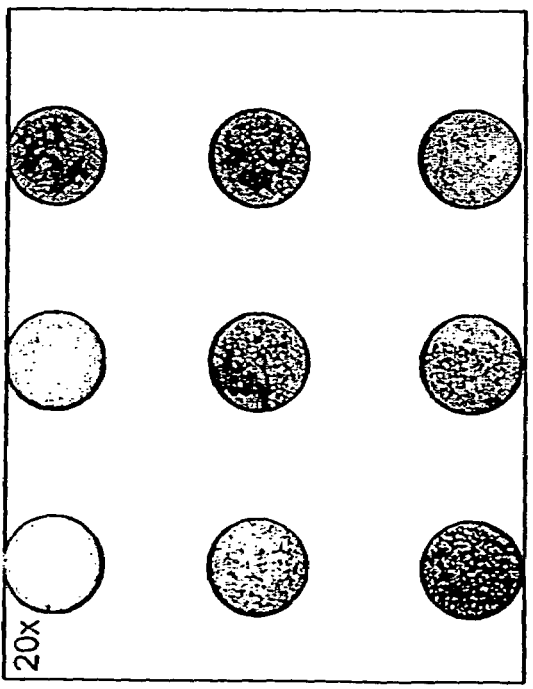

An etching tool, as shown in FIG. 48, holds the wafer horizontally to allow for even etching. The etching tool in a preferred embodiment is made of Teflon. It was discovered that if the wafer was held vertically during the etching, even etching did not result; since the stirring rod was at the bottom of the beaker, fresh etchant circulated more freely near the bottom of the wafer (the part that was most deeply immersed).

Control of the etching is tricky, in that substrate must be monitored, and the completion of the etch is sometimes difficult to gage. All of the silver in the unpatterned and therefore unprotected areas should be removed. Overetching causes defects, since the SAM can act as a resist for only a limited exposure to the etchant solution. This is partly because the side walls of the features, despite their thinness (the silver layer is only 50 nm thick) are also exposed to etchant.

The etch rate for silver in a ferricyanide etchant is on the order of 2 to 4 nanometers per second using the original concentration, as disclosed in "Microcontact printing of alkanethiols on silver and its application in microfabrication," by Younan Xia, Enoch Kim, and George M. Whitesides, in *Journal of the Electrochemical Society*, 143(3): 1070-1070, March 1996, incorporated herein by reference in entirety. The concentrations listed above are halved those listed in the above listed reference and were done so to increase control of the etching. As expected, the etching took about double the time with the halved concentration, or about 30 seconds per substrate.

After each batch of etchant was finished, the batch was transferred into a larger storage container, and diluted with an equal volume of water and then an equal volume of bleach, to neutralize the reactivity as much as possible.

The results of the stamping and etching experiments are shown in FIGS. 49A-51. All of the images were captured using an Olympus BX-60 microscope with a Sony CCD camera.

FIGS. 49A-50E show images of an etched substrate bearing dots at various magnifications. The pattern, as indicated above, is a pattern of 100 micron dots spaced on a 200 micron pitch.

FIGS. 49A-49E depicts a region of perfectly patterned dots at various magnifications. Defects in the stamp lead to corresponding defects in the printed pattern as shown in FIGS. 50A-50E.

Figure 51:
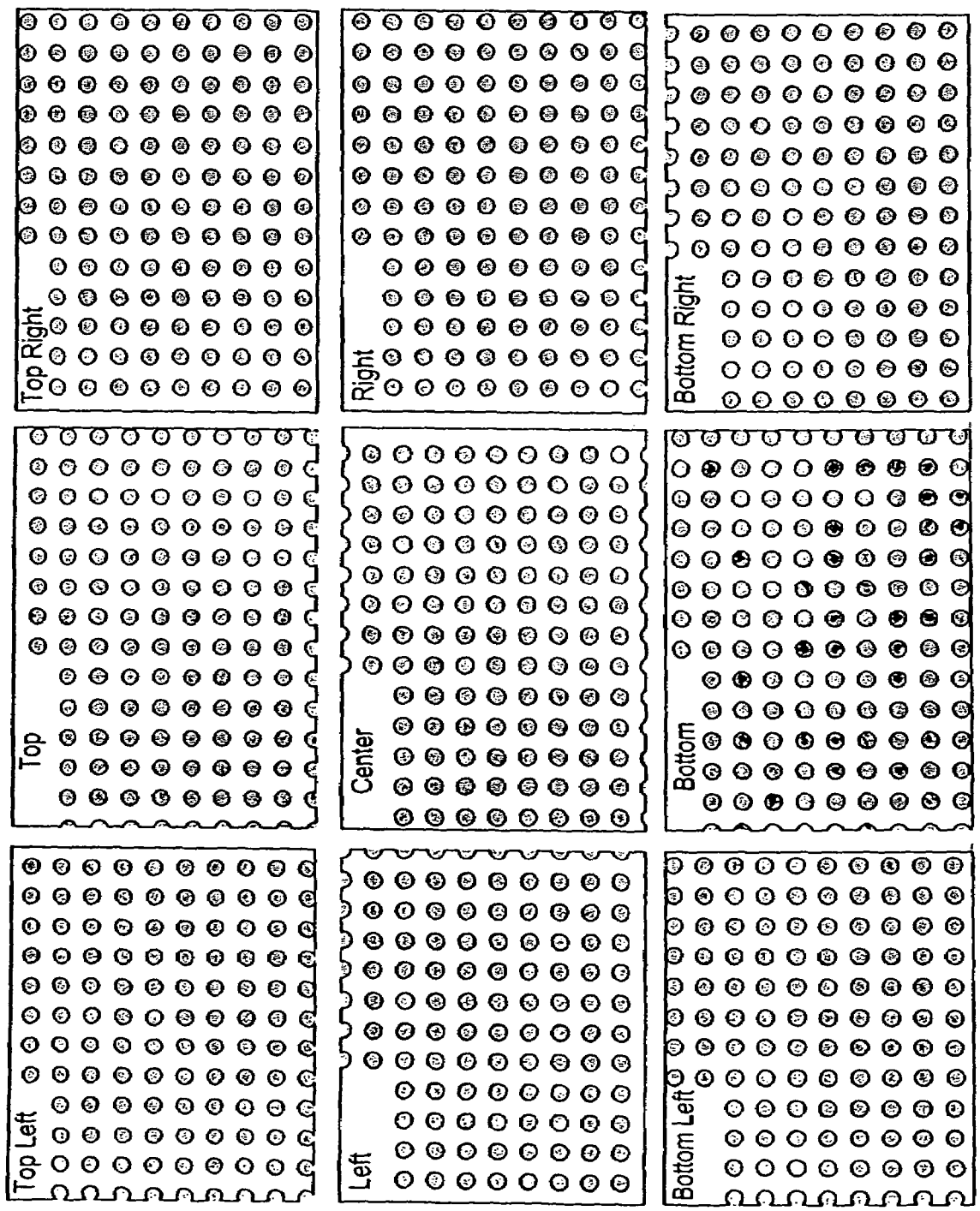
FIG. 51 is a photograph in segments of silver dots on silicon at a magnification of a substrate.

A series of images across the full area of the substrate are shown in FIG. 51, to compare how the defects correspond to the defects in the stamp. There is a strong correlation: defects in the stamp are concentrated primarily at the bottom (where air was entrained during the molding), and these defects are propagated in the stamped impression and appear on the corresponding portion of the patterned substrate.

Image analysis was preferred of the data collected on the substrate bearing the dot pattern. Using a commercially-available software package called ImagePro, the average dot sizes for several regions across the full area of the wafer were calculated. The average eccentricity was also determined.

The measured values for diameter, in both the stamp and the printed pattern, are not indicative of a true diameter, since the calibration of image processing software can influence the scaling. Furthermore, the image processing software requires contrast for detecting features. While this is accurate for the printed silver pattern (since the image is two-dimensional), it is not as useful for the three-dimensional features, such as those on the stamp.

The analysis that is relevant is the comparison of feature characteristics across the area of either the stamp or the substrate. The mean diameters and the aspect ratios of the dots were chosen to be the metric to compare the patterns in different regions of the stamp and patterned substrate.

The dots that were severely defective were filtered out in which less than 75% of the total pattern appears. The approximate defect rates are given in FIG. 46. The mean diameters of each of the spots in a region were measured and recorded. After compiling this data, about 1000 points each for stamp and substrate, the standard deviations in diameter and aspect ration were determined, which gives great insight into the performance of the stamping machine.

For the stamp, the standard deviation in the mean diameter is about 4%. On the printed substrate, the deviation is near 3%. These low deviations indicate that where the patterns do print, they print well, with a high degree of uniformity.

The stamp and substrate have eccentricities of about 1.05 and 1.02 respectively, indicating a major axes that are slightly larger than the minor axes. The deviation in these measurements is 5% for the stamp and 2% for the stamped pattern. Again, this metric indicates excellent uniformity and minimal distortion.

The tighter statistics for the substrate may be accounted for by the higher resolution that imaging a two-dimensional surface allows: it is possible that the optical limitations in microscopy of three-dimensional structures could have caused imprecise image capture.

Figure 52:
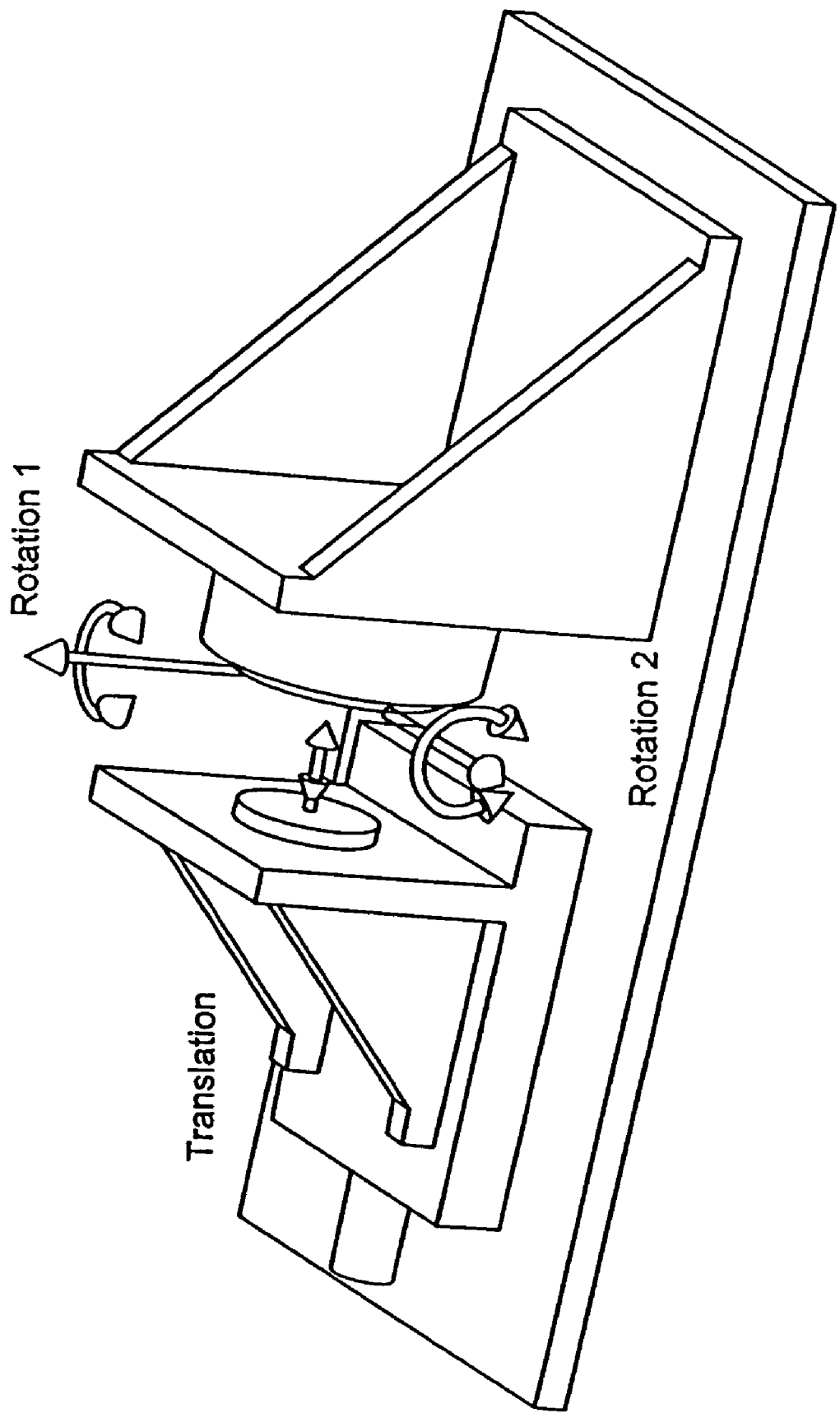
FIG. 52 is a perspective view of an alternative topology.

While the system has been shown as a vertical system where the stamp head assembly is lowered vertical to the substrate, it is recognized that other topologies can be used. FIG. 52 shows a horizontal topology.

In the preferred embodiment, the coarse and fine actuators move the stamp. It is recognized that the coarse and fine actuators can move the substrate instead of stamp head assembly. It is also recognized that the coarse actuator moves one of the substrate or stamp, and the fine actuator(s) is moving the other of the substrate or stamp. There also can be embodiments where some of the fine actuators move the substrate and some others move the stamp or where coarse actuators on both the substrate and the stamp.

In addition, while the embodiment shows both coarse actuator 78 and a fine actuators 112, in certain embodiments where large translation travel is not necessary, only a fine actuator may be necessary. It is also recognized that load cells can be used, wherein the stamping force is directly measured via the load cells.

While in the embodiment shown, a system where the substrate is generally planar, it is recognized that the surface to be printed on could be have a different shape such as concave or convex. The stamp backing can have a similar resting position and be flexed to create a point contact. Likewise, it may be desired to have a shape that is irregular, such as having hills and valleys or saddle. The system can have a plurality of actuators that deflect the stamp backing to conform to the shape of the substrate.

Figure 53:
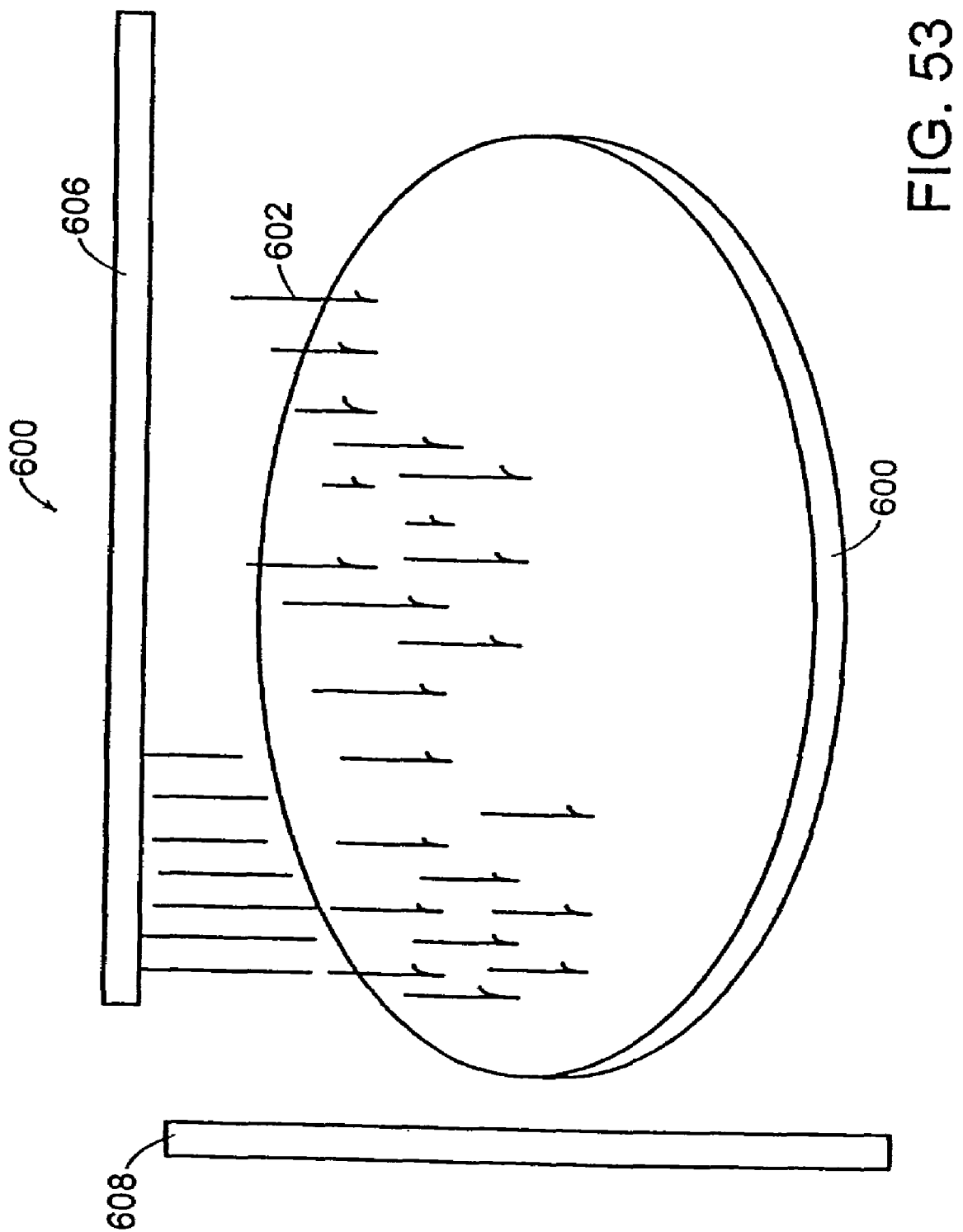
FIG. 53 is a schematic showing a stamp backing having a plurality of actuators.

FIG. 53 schematic shows a stamp backing 600 having a plurality of actuators 602 to change the shape of the stamp. The actuators 602 can be part of an active matrix 604 wherein an address row 606 and a drive column 608 control the actuators 602. The actuators can conform the stamp backing 600 and the stamp into a variety of shapes including wave forms, saddle shape, hill and valley, hyperbolic paraboloid, cylindrical, translation shell, and dome. The stiffness of the stamp backing 600 and the desired shape can influence the placement of the actuators 602. For example, the actuators can be placed in closer proximity to each other near the boundary of the stamp backing 600.

As indicated above, the pressure chamber is inflated to allow the flexure of the stamp to be flexed to a convex state so that the initial contact of the stamp to the substrate is at a single point. Then the pressure in the cell is gradually reduced so as to allow the stamp to come to a condition of near-uniform pressure across the stamp-substrate contact interface. In this condition, there may well be some pressure larger than atmosphere in the stamp-head chamber in order to support the stamping pressure without requiring deformation of the stamp backing. On the other hand, if the stamp is naturally bowing outward, i.e., initially deformed in a convex shape, then is may be necessary to pull a vacuum in the stamp-head chamber in order that the stamp surface is in uniform contact with the substrate surface.

Inflation of substrate coordinated with stamping operations. Propagation of contact patch as stamping is occurring. That is, the pressure in the stamp-head cell will be adjusted in coordination with the stamping motion so as to desirably control the initial contact of the stamp to the substrate, and then to allow the propagation of the stamping operation to proceed smoothly across the whole stamp/substrate interface. The stamping motion can be controlled via any of the methods discussed above. For example, if there are no load cells, the stamping operation can use the constant voice coil, constant position, or other modes presented in the previous section. If load cells are used, then the stamp inflation will be coordinated with the stamp motion control and via the load cell sensed stamping forces.

In addition to control over the independent parameters of contact time and pressure, the two can be controlled in concert. That is, a pressure profile can be chosen as a function of time, since this might result in improved pattern transfer. This may be more important with non-thiol inks, for example, for which the contact time may be on the order of minutes rather than seconds.

The nature of the chemical interaction of the ink with the substrate could make this kind of profile useful. For example, when the required contact time is long, a high pressure can be initially applied in order to conform to the substrate, and then relieve this pressure slightly (to improve the fidelity of the pattern by reducing distortion) as the pattern is transferred over time.

Impedance control is particularly useful for stamping applications. This method permits control over the effective stiffness of the stamp head. Without impedance control, the stiffness of the stamp/stamp head is a function of the material and geometry of the stamp, and the flexural bearing system. Impedance control lets the operator choose the desired stiffness characteristics of the whole stamp head assembly, so that a stiffness to most appropriately suit the ink, substrate and other factors can be chosen.

While above in relation to forming the stamp, a vacuum is used to draw in the fluid, positive pressure is equally applicable to force fluid into the mold. In either situation, an equal pressure is applied to the guarding chambers 370 to minimize deflection of the stamp backing and the master.

It is recognized that the nature of the inks typically used for microcontact printing makes it possible to make an inkpad that resembles the substrate, so that inking during a production run can be done using the same equipment that is being used for substrate handling.

For example, if you are stamping on 100 mm silicon wafers, it is possible to engineer a stamp pad that has the same dimensions as a silicon wafer but which carries ink. This inkpad can be fed to the printing machine as would a typical substrate, and it can be contacted in the same way for inking.

The same idea is applicable to cleaning of the stamp (for example, with a cleaning pad that also resembles a substrate), and drying (for example, with a blotting pad).

It is likewise recognized that automation equipment used in the semiconductor industry may be applicable for substrate handling, or the plate-handling equipment used in the biotech industry.

The claims should not be read as limited to the described order or elements unless stated to that effect. Therefore, all embodiments that come within the scope and spirit of the following claims and equivalents thereto are claimed as the invention.

What is claimed:

1. A mold chamber for printing a stamp comprising:
a master backing for carrying a master;
a stamp backing;
a pair of outer rings;
an inner ring interposed between the outer rings; the backings, the outer rings, and the inner ring defining a chamber; and
the inner ring having a pair of inlet holes for passing fluids into and out of the chamber,
wherein the chamber further comprises a plurality of shims interposed between the backings for spacing the backings from each other, and a pair of rubber blocks, each rubber block for seating the backings relative to the respective outer ring.

2. The chamber of claim 1 further comprising a pair of O-rings; each outer ring having a step and receiving the backings, each outer ring having a groove for receiving an O-ring for engaging and sealing the backing to the outer ring.

3. The chamber of claim 1 further comprising a pair of outer discs, the outer discs each carried on the outer rings and forming a chamber interposed between each disc and each backing; each disc having an inlet for drawing a vacuum in the chamber.

4. A mold chamber for printing a stamp comprising:
a master backing for carrying a master;
a stamp backing; a pair of outer rings;
an inner ring interposed between the outer rings;
the backings, the outer rings, and the inner ring defining a chamber;
and the inner ring having a pair of inlet holes for passing fluids into and out of the chamber, wherein the chamber further comprises a plurality of shims interposed between the backings for spacing the backings, and a pair of rubber blocks, each rubber block for seating the backings relative to the respective outer ring; and wherein the stamp backing is formed of borosilicate glass.

* * * * *

UNITED STATES PATENT AND TRADEMARK OFFICE
CERTIFICATE OF CORRECTION

| | | |
|---|---|---|
| PATENT NO. | : 7,665,983 B2 | Page 1 of 1 |
| APPLICATION NO. | : 11/506009 | |
| DATED | : February 23, 2010 | |
| INVENTOR(S) | : Kendale et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 737 days.

Signed and Sealed this

Twenty-eighth Day of December, 2010

David J. Kappos
*Director of the United States Patent and Trademark Office*